United States Patent
Kim et al.

(10) Patent No.: US 10,812,308 B2
(45) Date of Patent: *Oct. 20, 2020

(54) APPARATUS AND METHOD FOR SENDING AND RECEIVING BROADCAST SIGNALS

(71) Applicant: LG ELECTRONICS INC., Seoul (KR)

(72) Inventors: Jaehyung Kim, Seoul (KR); Woosuk Ko, Seoul (KR); Sungryong Hong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/732,929

(22) Filed: Jan. 2, 2020

(65) Prior Publication Data

US 2020/0169439 A1 May 28, 2020

Related U.S. Application Data

(63) Continuation of application No. 16/399,425, filed on Apr. 30, 2019, now Pat. No. 10,547,482, which is a
(Continued)

(51) Int. Cl.
*H04L 27/26* (2006.01)
*H04L 12/18* (2006.01)
(Continued)

(52) U.S. Cl.
CPC ........ *H04L 27/263* (2013.01); *H03M 13/253* (2013.01); *H03M 13/255* (2013.01);
(Continued)

(58) Field of Classification Search
CPC ... H04L 1/0041; H04L 1/0052; H04L 1/0058; H04L 1/0065; H04L 1/0071;
(Continued)

(56) References Cited

U.S. PATENT DOCUMENTS 8,149,935 B2 * 4/2012 Adachi ................. H04H 60/12
375/260
8,238,455 B2 * 8/2012 Zhang ................. H04W 72/042
375/260
(Continued)

FOREIGN PATENT DOCUMENTS

CN 101897186 A 11/2010
EP 2071795 A1 6/2009
(Continued)

*Primary Examiner* — James M Perez
(74) *Attorney, Agent, or Firm* — Dentons US LLP

(57) ABSTRACT

Disclosed herein is a broadcast signal receiver. The broadcast signal receiver according to an embodiment of the present invention includes a synchronization and demodulation module configured to perform detection and OFDM demodulation on a received broadcast signal, a frame parsing and deinterleaving module configured to parse and deinterleave the signal frame of the broadcast signal, a demapping and decoding module configured to convert the data of at least one Physical Layer Pipe (PLP) of the broadcast signal into a bit domain and to FEC-decode the PLP data, and an output processing module configured to receive the data of the at least one PLP and to output the received data in a data stream form.

20 Claims, 48 Drawing Sheets

Related U.S. Application Data continuation of application No. 16/140,000, filed on Sep. 24, 2018, now Pat. No. 10,382,239, which is a continuation of application No. 15/615,663, filed on Jun. 6, 2017, now Pat. No. 10,158,513, which is a continuation of application No. 15/061,458, filed on Mar. 4, 2016, now Pat. No. 9,705,723.

(60) Provisional application No. 62/201,531, filed on Aug. 5, 2015, provisional application No. 62/199,844, filed on Jul. 31, 2015, provisional application No. 62/198,117, filed on Jul. 28, 2015, provisional application No. 62/197,542, filed on Jul. 27, 2015.

(51) Int. Cl.

| | | |
|---|---|---|
| *H04L 1/00* | (2006.01) | |
| *H04L 5/00* | (2006.01) | |
| *H03M 13/00* | (2006.01) | |
| *H03M 13/29* | (2006.01) | |
| *H03M 13/27* | (2006.01) | |
| *H03M 13/25* | (2006.01) | |
| *H04H 60/11* | (2008.01) | |
| *H04H 20/42* | (2008.01) | |
| *H03M 13/15* | (2006.01) | |
| *H03M 13/11* | (2006.01) | |

(52) U.S. Cl.
CPC ... *H03M 13/2707* (2013.01); *H03M 13/2778* (2013.01); *H03M 13/2906* (2013.01); *H03M 13/6362* (2013.01); *H04H 20/42* (2013.01); *H04H 60/11* (2013.01); *H04L 1/0041* (2013.01); *H04L 1/0052* (2013.01); *H04L 1/0058* (2013.01); *H04L 1/0071* (2013.01); *H04L 1/0075* (2013.01); *H04L 5/005* (2013.01); *H04L 5/0048* (2013.01); *H04L 12/18* (2013.01); *H04L 27/2602* (2013.01); *H04L 27/265* (2013.01); *H04L 27/2613* (2013.01); *H03M 13/00* (2013.01); *H03M 13/1165* (2013.01); *H03M 13/152* (2013.01); *H04L 1/0065* (2013.01); *H04L 5/0023* (2013.01)

(58) Field of Classification Search
CPC ..... H04L 1/0075; H04L 5/005; H04L 5/0023; H04L 5/0048; H04L 27/263; H04L 27/2602; H04L 27/2647; H04L 27/2657; H04L 27/2662; H04L 5/0007; H04L 12/18; H04H 20/42; H04H 60/11
See application file for complete search history.

(56) References Cited

U.S. PATENT DOCUMENTS

| | | | | |
|---|---|---|---|---|
| 8,358,722 B2* | 1/2013 | Yuba | H04L 27/2613 | 370/206 |
| 8,379,752 B2* | 2/2013 | Kleider | H04L 25/0232 | 375/260 |
| 8,509,350 B2* | 8/2013 | Zhang | H04W 52/346 | 375/299 |
| 8,804,861 B2* | 8/2014 | Helard | H04L 27/2618 | 348/208.1 |
| 8,929,481 B2* | 1/2015 | Ko | H04L 27/2627 | 375/295 |
| 9,674,021 B2* | 6/2017 | Mun | H04L 27/2649 | |
| 9,705,723 B2* | 7/2017 | Kim | H03M 13/6362 | |
| 9,723,456 B2* | 8/2017 | Kim | H04L 27/2613 | |
| 9,742,604 B2* | 8/2017 | Kim | H04L 1/0075 | |
| 9,768,995 B2* | 9/2017 | Kim | H04L 1/0042 | |
| 9,923,743 B2* | 3/2018 | Kim | H04L 1/0071 | |
| 9,949,094 B2* | 4/2018 | Kim | H04L 27/2613 | |
| 10,021,535 B2* | 7/2018 | Kim | H04W 4/06 | |
| 10,116,481 B2* | 10/2018 | Kim | H03M 13/253 | |
| 10,129,061 B2* | 11/2018 | Kim | H04L 27/2656 | |
| 10,158,513 B2* | 12/2018 | Kim | H04L 1/0075 | |
| 10,158,515 B2* | 12/2018 | Mun | H04L 5/0058 | |
| 10,278,032 B2* | 4/2019 | Kim | H04L 27/2666 | |
| 10,382,239 B2* | 8/2019 | Kim | H03M 13/2778 | |
| 10,547,482 B2* | 1/2020 | Kim | H04L 1/0075 | |
| 10,644,918 B2* | 5/2020 | Kim | H04L 1/0075 | |
| 2006/0116095 A1* | 6/2006 | Henriksson | H04L 27/2657 | 455/223 |
| 2008/0273581 A1* | 11/2008 | Kodama | H04L 27/2613 | 375/222 |
| 2009/0052561 A1* | 2/2009 | Baxley | H04L 27/2613 | 375/260 |
| 2009/0094356 A1* | 4/2009 | Vare | H04N 21/64322 | 709/223 |
| 2009/0103649 A1* | 4/2009 | Vare | H04L 27/0008 | 375/295 |
| 2009/0175371 A1* | 7/2009 | Zhang | H04W 52/346 | 375/260 |
| 2009/0285318 A1* | 11/2009 | Adachi | H04H 20/33 | 375/260 |
| 2010/0172427 A1* | 7/2010 | Kleider | H04L 25/0232 | 375/260 |
| 2011/0013729 A1* | 1/2011 | Yuba | H04L 27/2666 | 375/329 |
| 2011/0019753 A1* | 1/2011 | Ko | H04L 27/32 | 375/260 |
| 2011/0149929 A1* | 6/2011 | Kleider | H04L 27/2613 | 370/338 |
| 2011/0164671 A1* | 7/2011 | Matsumura | H04L 27/2675 | 375/229 |
| 2011/0170442 A1* | 7/2011 | Lee | H04L 27/2671 | 370/252 |
| 2011/0199986 A1* | 8/2011 | Fong | H04L 5/0073 | 370/329 |
| 2011/0222521 A1* | 9/2011 | Lee | H04B 7/0619 | 370/338 |
| 2011/0267956 A1* | 11/2011 | Yonge, III | H04L 12/413 | 370/241 |
| 2012/0014476 A1* | 1/2012 | Kuchi | H04L 25/0232 | 375/296 |
| 2012/0140836 A1* | 6/2012 | Helard | H04L 27/2618 | 375/260 |
| 2013/0230013 A1* | 9/2013 | Seo | H04L 27/2602 | 370/329 |
| 2013/0266082 A1* | 10/2013 | McGowan | H04L 27/2614 | 375/260 |
| 2014/0050205 A1* | 2/2014 | Ahn | H04L 27/2601 | 370/336 |
| 2015/0003544 A1* | 1/2015 | Ouchi | H03M 13/6541 | 375/260 |
| 2015/0071375 A1* | 3/2015 | Kwon | H04L 27/261 | 375/295 |
| 2015/0092882 A1* | 4/2015 | Lee | H04L 1/0057 | 375/295 |
| 2015/0156242 A1* | 6/2015 | Hwang | H04L 65/607 | 375/260 |
| 2015/0163083 A1* | 6/2015 | Hwang | H04L 1/0075 | 375/260 |
| 2015/0349871 A1* | 12/2015 | Baek | H04L 27/12 | 375/267 |
| 2015/0349872 A1* | 12/2015 | Baek | H04W 4/06 | 375/267 |
| 2015/0358114 A1* | 12/2015 | Baek | H03M 13/253 | 375/340 |
| 2016/0049998 A1* | 2/2016 | Choi | H04H 20/44 | 375/267 |
| 2016/0056922 A1* | 2/2016 | Baek | H04L 1/0042 | 375/267 |
| 2016/0056986 A1* | 2/2016 | Shin | H04L 27/2646 | 375/260 |

(56) References Cited

U.S. PATENT DOCUMENTS

| | | | |
|---|---|---|---|
| 2016/0105222 A1* | 4/2016 | Baek | H04L 27/2602 375/267 |
| 2016/0105223 A1* | 4/2016 | Baek | H04B 7/0413 375/267 |
| 2016/0149682 A1* | 5/2016 | Shin | H04L 12/18 375/260 |
| 2016/0173313 A1* | 6/2016 | Hwang | H04L 5/0007 375/260 |
| 2016/0191286 A1* | 6/2016 | Baek | H03M 13/00 375/340 |
| 2016/0191679 A1* | 6/2016 | Hwang | H04L 1/0006 375/340 |
| 2016/0197753 A1* | 7/2016 | Hwang | H04L 65/607 375/295 |
| 2016/0197759 A1* | 7/2016 | Baek | H04L 1/0071 375/340 |
| 2016/0226687 A1* | 8/2016 | Kim | H04L 25/0232 |
| 2016/0226688 A1* | 8/2016 | Kim | H04L 1/0065 |
| 2016/0226689 A1* | 8/2016 | Kim | H03M 13/255 |
| 2016/0226694 A1* | 8/2016 | Kim | H04L 27/2656 |
| 2016/0381516 A1* | 12/2016 | Kim | H04L 27/2626 370/312 |
| 2016/0381518 A1* | 12/2016 | Kim | H04L 27/2613 375/260 |
| 2017/0005761 A1* | 1/2017 | Oh | H04L 27/2613 |
| 2017/0033959 A1* | 2/2017 | Kim | H04L 1/0052 |
| 2017/0033962 A1* | 2/2017 | Kim | H04H 20/42 |
| 2017/0149592 A1* | 5/2017 | Kim | H04L 27/2613 |
| 2017/0272292 A1* | 9/2017 | Kim | H04L 1/0052 |
| 2017/0311134 A1* | 10/2017 | Kim | H04L 5/0007 |
| 2018/0191464 A1* | 7/2018 | Shin | H04L 1/0075 |
| 2018/0206081 A1* | 7/2018 | Kim | H04L 27/2666 |
| 2018/0213367 A1* | 7/2018 | Kim | H04L 5/0048 |
| 2018/0227160 A1* | 8/2018 | Baek | H04L 1/0041 |
| 2018/0367352 A1* | 12/2018 | Kim | H04L 27/265 |
| 2019/0058619 A1* | 2/2019 | Kim | H03M 13/2707 |
| 2019/0268194 A1* | 8/2019 | Kim | H03M 13/2906 |

FOREIGN PATENT DOCUMENTS

| | | |
|---|---|---|
| WO | 2011105792 A2 | 9/2011 |
| WO | 2011105802 A2 | 9/2011 |

\* cited by examiner

[Figure 3]

[Figure 11]
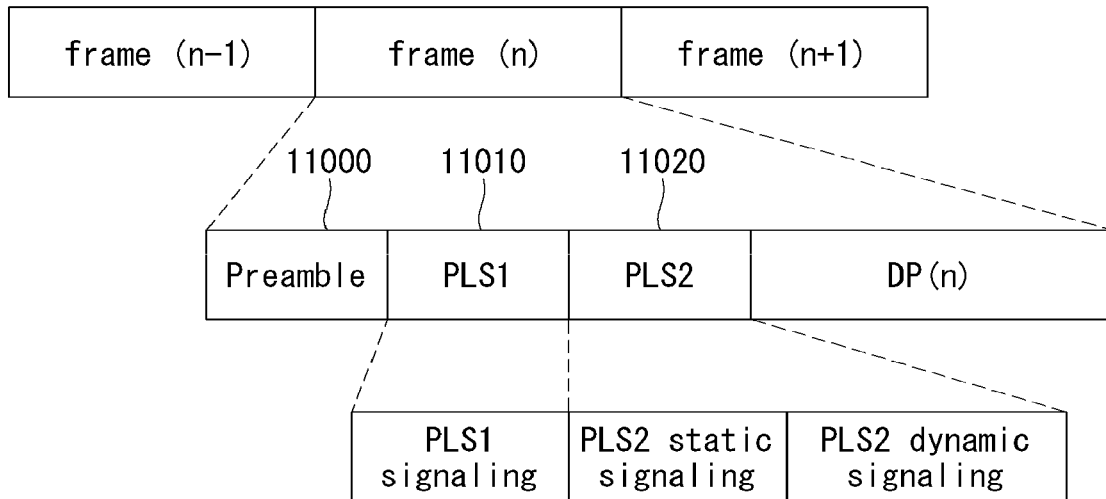
[Figure 12]
| Content | Bits |
|---|---|
| PHY_PROFILE | 3 |
| FFT_SIZE | 2 |
| GI_FRACTION | 3 |
| EAC_FLAG | 1 |
| POLOT_MODE | 1 |
| PAPR_FLAG | 1 |
| FRU_CONFIGURE | 3 |
| RESERVED | 7 |

Figure 14

| Content | Bit |
|---|---|
| FIC_FLAG | 1 |
| AUX_FLAG | 1 |
| NUM_DP | 6 |
| for i = NUM_DP | |
| DP_ID | 6 |
| DP_TYPE | 3 |
| DP_GROUP_ID | 8 |
| BASE_DP_ID | 6 |
| DP_FEC_TYPE | 2 |
| DP_COD | 4 |
| DP_MOD | 4 |
| DP_SSD_FLAG | 1 |
| if PHY_PROFILE = '010' | |
| DP_MIMO | 3 |
| end | |
| DP_TI_TYPE | 1 |
| DP_TI_LENGTH | 2 |
| DP_TI_BYPASS | 1 |
| DP_FRAME_INTERVAL | 2 |
| DP_FIRST_FRAME_IDX | 5 |
| DP_NUM_BLOCK_MAX | 10 |
| DP_PAYLOAD_TYPE | 2 |
| DP_INBAND_MODE | 2 |
| DP_PROTOCAL_TYPE | 2 |
| DP_CRC_MODE | 2 |
| if DP_PAYLOAD_TYPE==TS('00') | |
| DNP_MODE | 2 |
| ISSY_MODE | 2 |
| HC_MODE_TS | 2 |
| if HC_MODE_TS=='01' or '10' | |
| PID | 13 |
| end | |
| if DP_PAYLOAD_TYPE==IP('01') | |
| HC_MODE_IP | 2 |
| end | |
| RESERVED | 8 |
| end | |
| if FIC_FLAG == 1 | |
| FIC_VERSION | 8 |
| FIC_LENGTH_BYTE | 13 |
| RESERVED | 8 |
| end | |
| if AUX_FLAG == 1 | |
| NUM_AUX | 4 |
| AUX_CONFIG_RFU | 8 |
| for i=1:NUM_AUX | |
| AUX_STREAM_TYPE | 4 |
| AUX_PRIVATE_CONF | 28 |
| end | |
| end | |

[Figure 15]

| Content | Bit |
|---|---|
| FRAME_INDEX<br>PLS_CHANGE_COUNTER<br>FIC_CHANGE_COUNTER<br>RESERVED<br>for i = 1:NUM_DP | 5<br>4<br>4<br>16 |
|     DP_ID<br>    DP_START<br>    DP_NUM_BLOCK<br>    RESERVED<br>end | 6<br>15(or 13)<br>10<br>8 |
| EAC_FLAG<br>EAS_WAKE_UP_VERSION_NUM<br>if EAC_FLAG == 1<br>    EAC_LENGTH_BYTE<br>else<br>    EAC_COUNTER<br>end<br>for i = 1:NUM_AUX<br>    AUX_PRIVATE_DYN<br>end<br>CRC 32 | 1<br>8<br><br>12<br><br>12<br><br><br>48<br><br>32 |

[Figure 16]
[Figure 17]
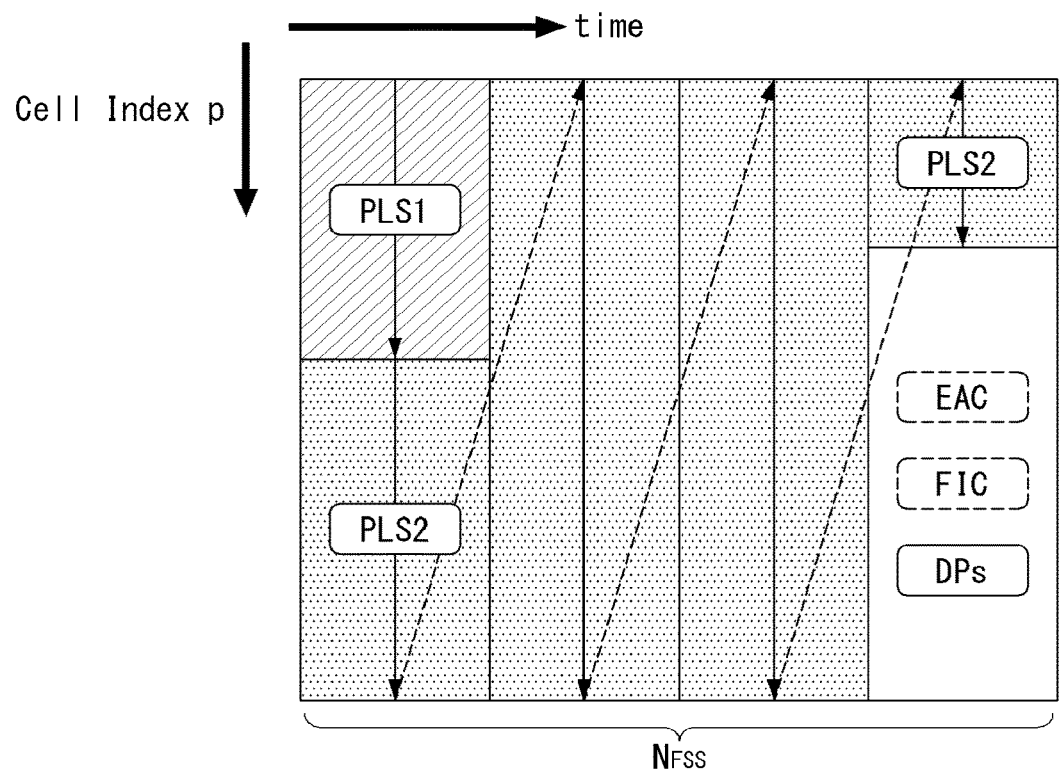

[Figure 18]
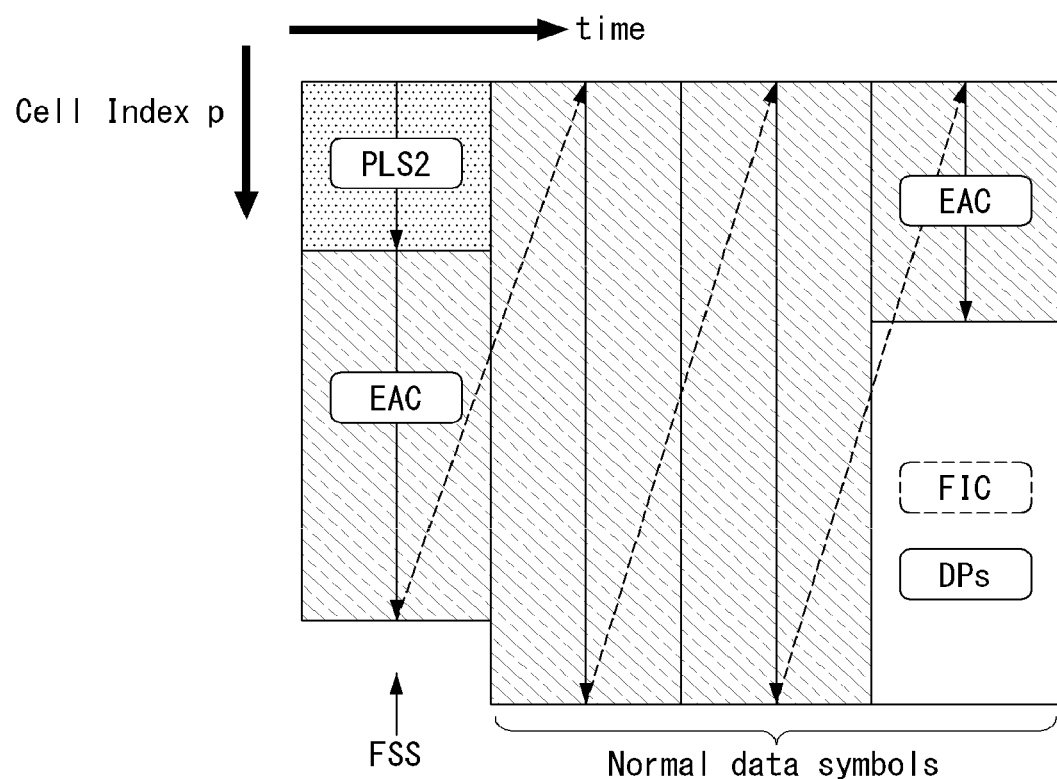

[Figure 19]
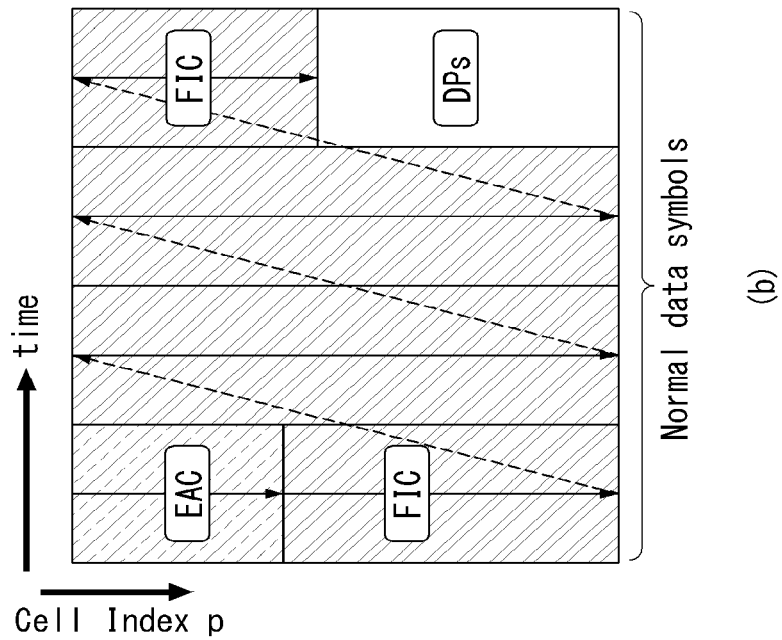
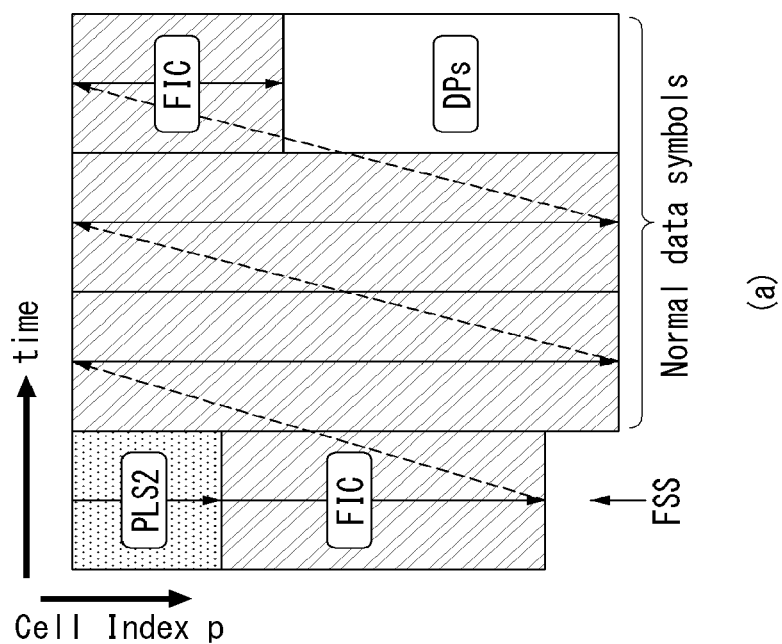

[Figure 20]
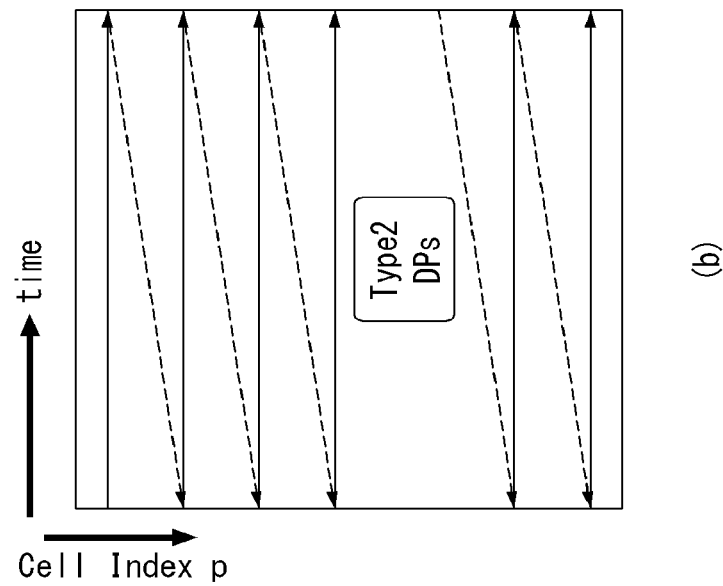
(b)
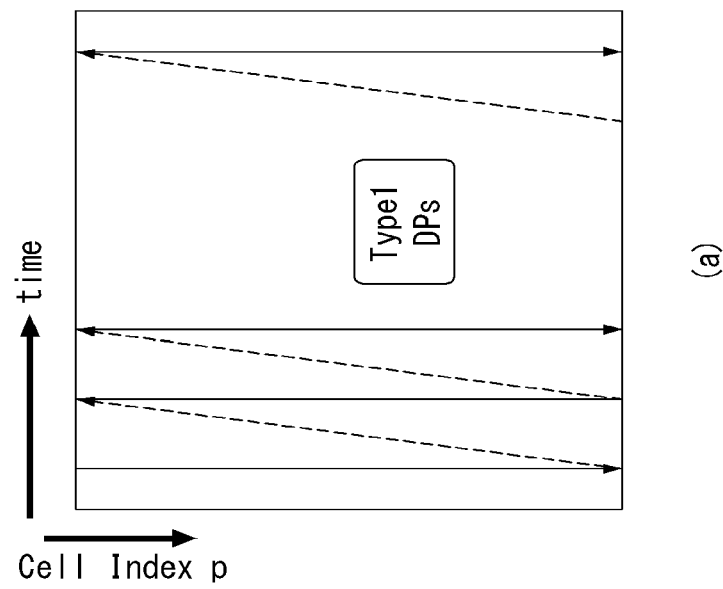
(a)

[Figure 21]
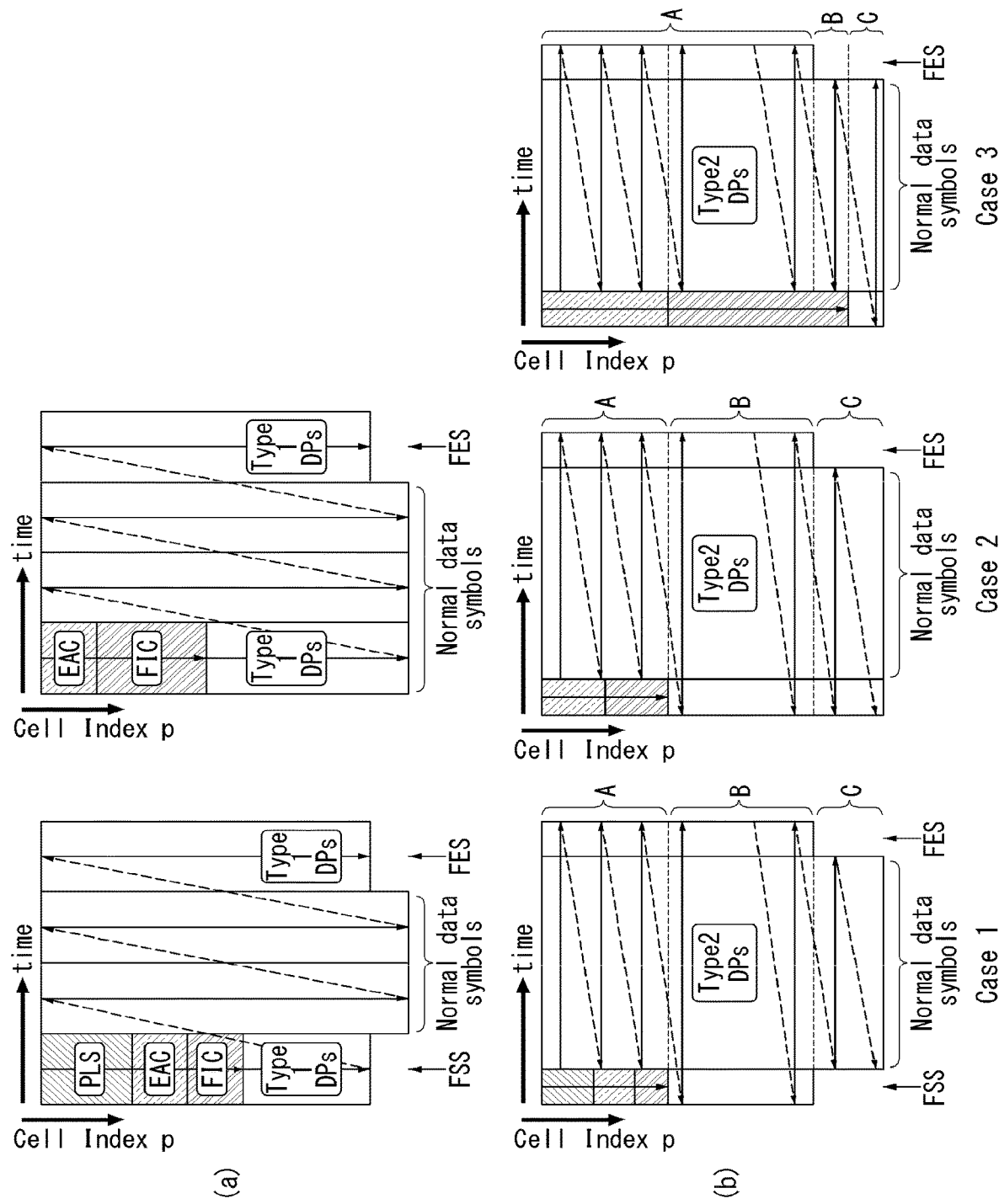

[Figure 22]
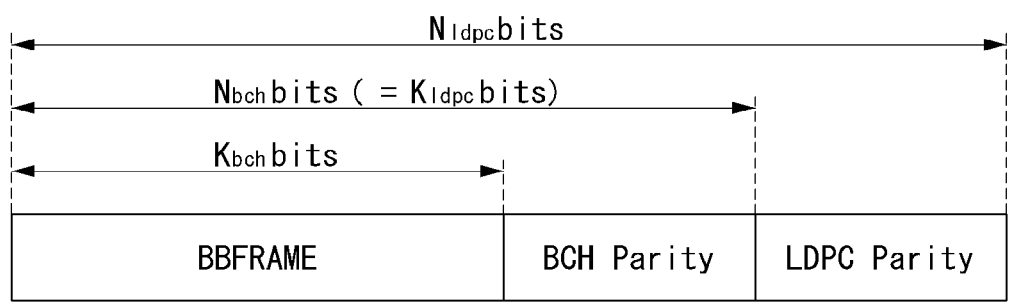

[Figure 26]
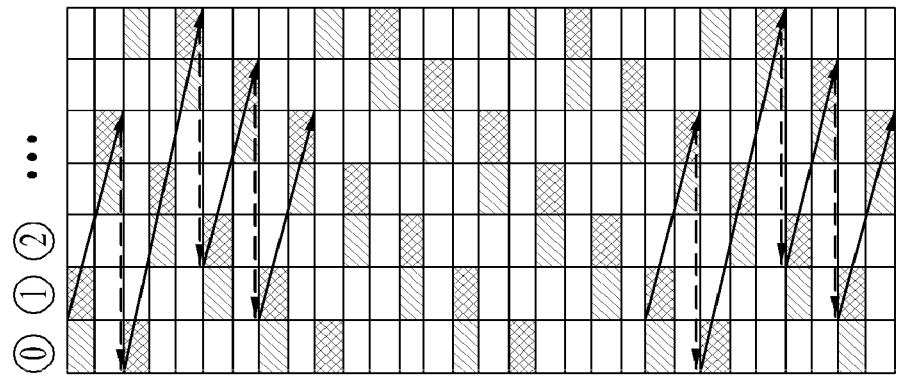
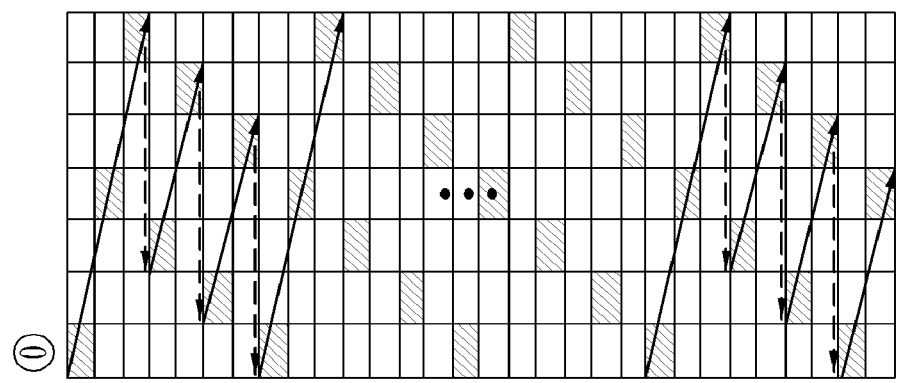
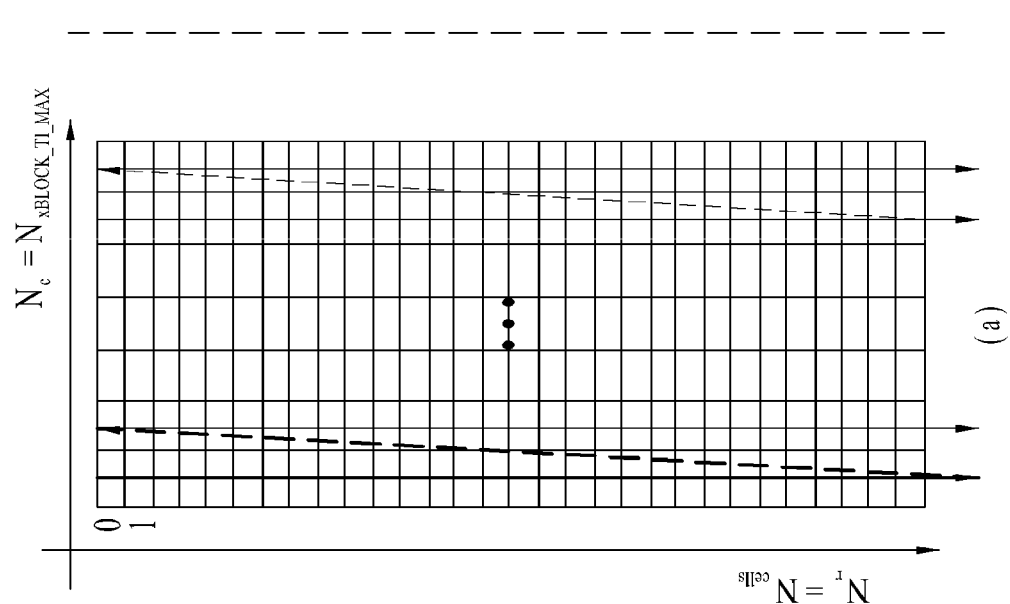

[Figure 27]
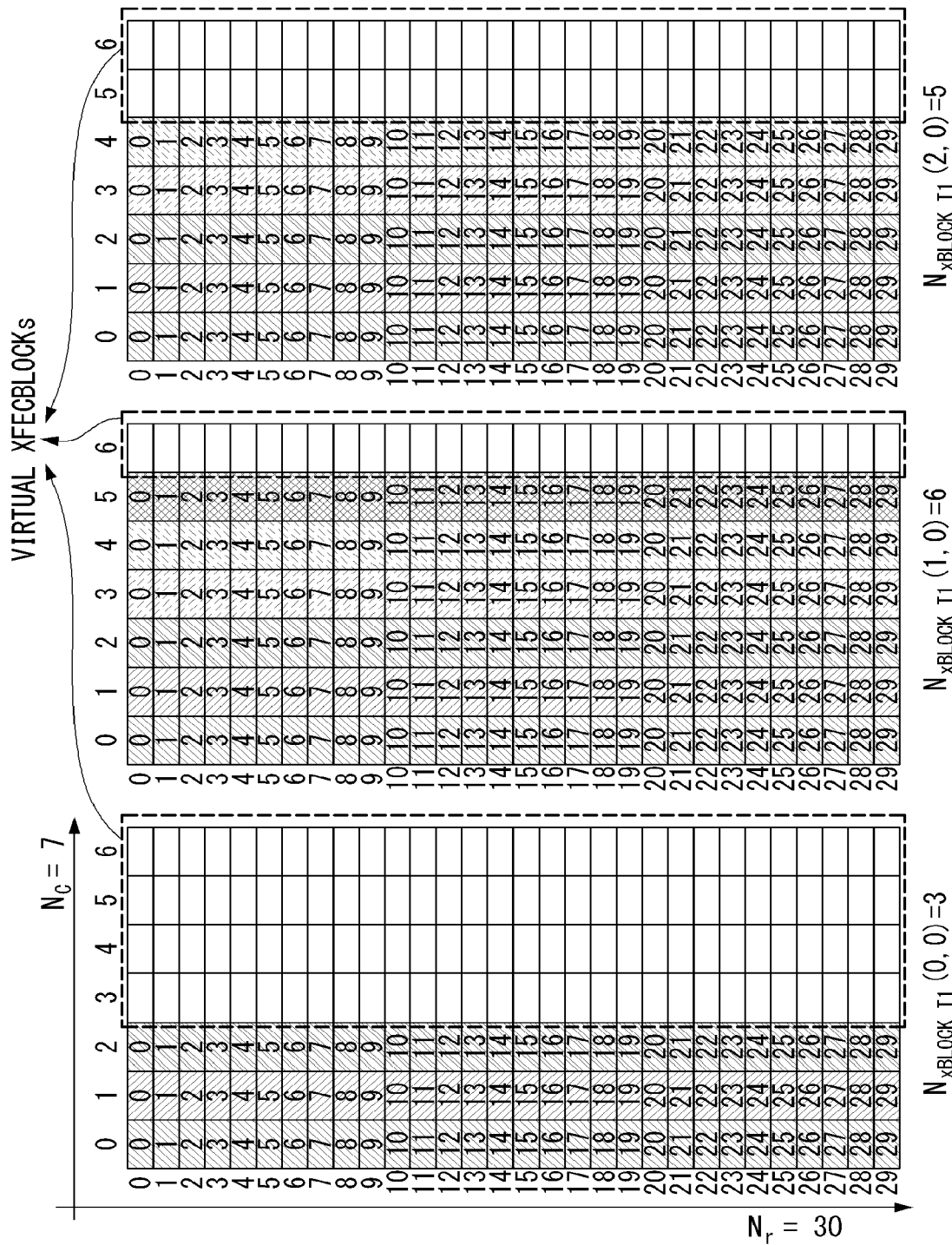

[Figure 31]
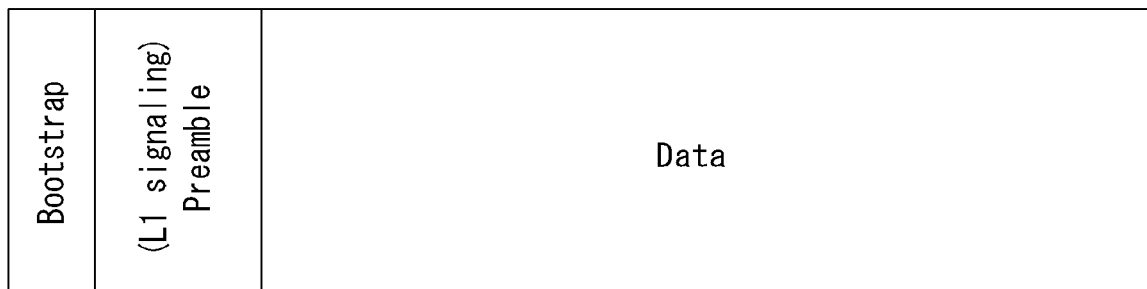
[Figure 32]
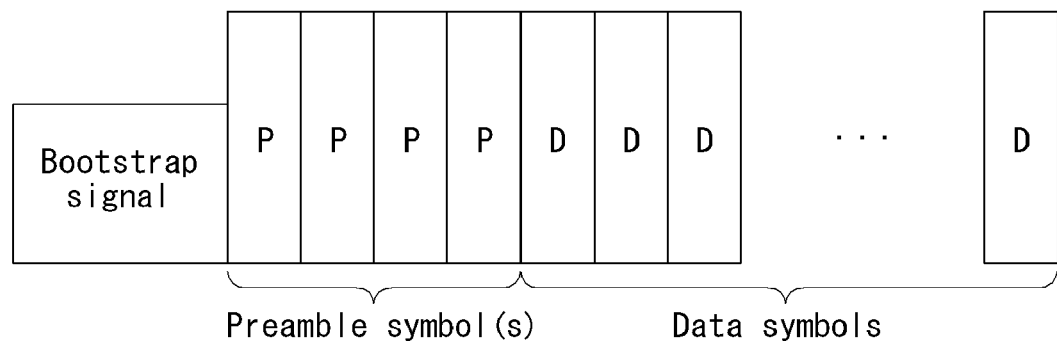

[Figure 34]

A_SP_dB for Data Symbols

| L1_SP_Boost | SP3_2 | SP3_4 | SP4_2 | SP4_4 | SP6_2 | SP6_4 | SP8_2 | SP8_4 |
|---|---|---|---|---|---|---|---|---|
| 000 | 0.00 | 0.00 | 0.00 | 0.00 | 0.00 | 0.00 | 0.00 | 0.00 |
| 001 | -0.10 | 1.40 | 0.60 | 2.10 | 1.60 | 3.00 | 2.20 | 3.60 |
| 010 | 1.40 | 2.90 | 2.10 | 3.60 | 3.10 | 4.50 | 3.80 | 5.10 |
| 011 | 2.20 | 3.80 | 3.00 | 4.40 | 4.00 | 5.40 | 4.60 | 6.00 |
| 100 | 2.90 | 4.40 | 3.60 | 5.10 | 4.60 | 6.00 | 5.30 | 6.60 |
| 101~111 | Reserved | Reserved | Reserved | Reserved | Reserved | Reserved | Reserved | Reserved |
| L1_SP_Boost | SP12_2 | SP12_4 | SP16_2 | SP16_4 | SP24_2 | SP24_4 | SP32_2 | SP32_4 |
| 000 | 0.00 | 0.00 | 0.00 | 0.00 | 0.00 | 0.00 | 0.00 | 0.00 |
| 001 | 3.20 | 4.50 | 3.80 | 5.20 | 4.70 | 6.10 | 5.40 | 6.70 |
| 010 | 4.70 | 6.00 | 5.30 | 6.70 | 6.20 | 7.60 | 6.90 | 8.20 |
| 011 | 5.60 | 6.90 | 6.20 | 7.60 | 7.10 | 8.50 | 7.70 | 9.10 |
| 100 | 6.20 | 7.50 | 6.80 | 8.20 | 7.70 | 9.10 | 8.40 | 9.70 |
| 101~111 | Reserved | Reserved | Reserved | Reserved | Reserved | Reserved | Reserved | Reserved |

[Figure 35]

A_SP for Data Symbols

| L1_SP_Boost | SP3_2 | SP3_4 | SP4_2 | SP4_4 | SP6_2 | SP6_4 | SP8_2 | SP8_4 |
|---|---|---|---|---|---|---|---|---|
| 000 | 1.00 | 1.00 | 1.00 | 1.00 | 1.00 | 1.00 | 1.00 | 1.00 |
| 001 | 0.99 | 1.17 | 1.07 | 1.27 | 1.20 | 1.41 | 1.29 | 1.51 |
| 010 | 1.17 | 1.40 | 1.27 | 1.51 | 1.43 | 1.68 | 1.55 | 1.80 |
| 011 | 1.29 | 1.55 | 1.41 | 1.66 | 1.58 | 1.86 | 1.70 | 2.00 |
| 100 | 1.40 | 1.66 | 1.51 | 1.80 | 1.70 | 2.00 | 1.84 | 2.14 |
| 101~111 | Reserved | Reserved | Reserved | Reserved | Reserved | Reserved | Reserved | Reserved |
| L1_SP_Boost | SP12_2 | SP12_4 | SP16_2 | SP16_4 | SP24_2 | SP24_4 | SP32_2 | SP32_4 |
| 000 | 1.00 | 1.00 | 1.00 | 1.00 | 1.00 | 1.00 | 1.00 | 1.00 |
| 001 | 1.45 | 1.68 | 1.55 | 1.82 | 1.72 | 2.02 | 1.86 | 2.16 |
| 010 | 1.72 | 2.00 | 1.84 | 2.16 | 2.04 | 2.40 | 2.21 | 2.57 |
| 011 | 1.91 | 2.21 | 2.04 | 2.40 | 2.26 | 2.66 | 2.43 | 2.85 |
| 100 | 2.04 | 2.37 | 2.19 | 2.57 | 2.43 | 2.85 | 2.63 | 3.05 |
| 101~111 | Reserved | Reserved | Reserved | Reserved | Reserved | Reserved | Reserved | Reserved |

[Figure 36]

| No | FFT Size | GI length | SP Dx | GUR (=GIF*Dx) | Note |
|---|---|---|---|---|---|
| 1 | 8K | 768 | 4 | 0.75 | Small GI |
| 2 | 8K | 1024 | 3 | 0.75 | Small GI |
| 3 | 8K | 1536 | 4 | 0.75 | Medium GI |
| 4 | 8K | 2048 | 3 | 0.75 | Medium GI |
| 5 | 16K | 768 | 8 | 0.75 | Small GI |
| 6 | 16K | 1024 | 6 | 0.75 | Small GI |
| 7 | 16K | 1536 | 4 | 0.75 | Medium GI |
| 8 | 16K | 2432 | 3 | 0.89 | Medium GI |
| 9 | 16K | 3648 | 4 | 0.89 | Max GI |
| 10 | 16K | 4096 | 3 | 0.75 | Max GI |
| 11 | 32K | 768 | 16 | 0.75 | Small GI |
| 12 | 32K | 1024 | 12 | 0.75 | Small GI |
| 13 | 32K | 1536 | 8 | 0.75 | Medium GI |
| 14 | 32K | 2432 | 6 | 0.89 | Medium GI |
| 15 | 32K | 3648 | 3 | 0.89 | Max GI |
| 16 | 32K | 3648 | 8 | 0.89 | Max GI |
| 17 | 32K | 4864 | 3 | 0.89 | Max GI |

[Figure 37]

A_SP_dB, A_SP for Preamble symbol

|  | 1 | 2 | 3 | 4 | 5 | 6 | 7 | 8 | 9 |
|---|---|---|---|---|---|---|---|---|---|
| A_SP_dB | 1.80 | 0.90 | 1.80 | 0.90 | 3.60 | 2.90 | 1.80 | 1.30 | 2.10 |
| A_SP | 1.23 | 1.11 | 1.23 | 1.11 | 1.51 | 1.40 | 1.23 | 1.16 | 1.27 |
|  | 10 | 11 | 12 | 13 | 14 | 15 | 16 | 17 |  |
| A_SP_dB | 0.90 | 5.30 | 4.60 | 3.60 | 3.20 | 1.30 | 4.00 | 1.30 |  |
| A_SP | 1.11 | 1.84 | 1.70 | 1.51 | 1.45 | 1.16 | 1.58 | 1.16 |  |

[Figure 38]

A_SP_dB, A_SP for Subframe Boundary Symbol

| Pilot Pattern | SP3_2 | SP3_4 | SP4_2 | SP4_4 | SP6_2 | SP6_4 | SP8_2 | SP8_4 |
|---|---|---|---|---|---|---|---|---|
| Dx | 3 | 3 | 4 | 4 | 6 | 6 | 8 | 8 |
| Dy | 1 | 1 | 1 | 1 | 1 | 1 | 1 | 1 |
| s=Dx*Dy | 3 | 3 | 4 | 4 | 6 | 6 | 8 | 8 |
| fint_time | 1 | 1 | 1 | 1 | 1 | 1 | 1 | 1 |
| fint_freq | 0.75 | 0.75 | 0.89 | 0.89 | 0.89 | 0.89 | 0.89 | 0.89 |
| A_SP_dB | 0.90 | 0.90 | 1.80 | 1.80 | 2.90 | 2.90 | 3.60 | 3.60 |
| A_SP | 1.11 | 1.11 | 1.23 | 1.23 | 1.40 | 1.40 | 1.51 | 1.51 |
| Pilot Pattern | SP12_2 | SP12_4 | SP16_2 | SP16_4 | SP24_2 | SP24_4 | SP32_2 | SP32_4 |
| Dx | 12 | 12 | 16 | 16 | 24 | 24 | 32 | 32 |
| Dy | 1 | 1 | 1 | 1 | 1 | 1 | 1 | 1 |
| s=Dx*Dy | 12 | 12 | 16 | 16 | 24 | 24 | 32 | 32 |
| fint_time | 1 | 1 | 1 | 1 | 1 | 1 | 1 | 1 |
| fint_freq | 0.89 | 0.89 | 0.75 | 0.75 | 0.75 | 0.75 | 0.75 | 0.75 |
| A_SP_dB | 4.60 | 4.60 | 5.30 | 5.30 | 6.20 | 6.20 | 6.80 | 6.80 |
| A_SP | 1.70 | 1.70 | 1.84 | 1.84 | 2.04 | 2.04 | 2.19 | 2.19 |

[Figure 39]

Number of active data carriers for normal data symbols (NoA)

| | $C_{red\_coeff}$ | NoC | SP3-2 | SP3-4 | SP4-2 | SP4-4 | SP6-2 | SP6-4 | SP8-2 | SP8-4 |
|---|---|---|---|---|---|---|---|---|---|---|
| Dx | | | 3 | 3 | 4 | 4 | 6 | 6 | 8 | 8 |
| Dy | | | 2 | 4 | 2 | 4 | 2 | 4 | 2 | 4 |
| 8K | 000 | 6913 | 5711 | 6285 | 5999 | 6429 | 6287 | 6573 | 6431 | 6645 |
| 8K | 001 | 6817 | 5631 | 6197 | 5915 | 6339 | 6199 | 6481 | 6341 | 6552 |
| 8K | 010 | 6721 | 5552 | 6110 | 5832 | 6250 | 6112 | 6390 | 6252 | 6460 |
| 8K | 011 | 6625 | 5473 | 6023 | 5749 | 6161 | 6025 | 6299 | 6163 | 6368 |
| 8K | 100 | 6529 | 5394 | 5936 | 5666 | 6072 | 5938 | 6208 | 6074 | 6276 |
| 16K | 000 | 13825 | 11423 | 12573 | 11999 | 12861 | 12575 | 13149 | 12863 | 13293 |
| 16K | 001 | 13633 | 11263 | 12397 | 11831 | 12681 | 12399 | 12965 | 12683 | 13107 |
| 16K | 010 | 13441 | 11106 | 12224 | 11666 | 12504 | 12226 | 12784 | 12506 | 12924 |
| 16K | 011 | 13249 | 10947 | 12049 | 11499 | 12325 | 12051 | 12601 | 12327 | 12739 |
| 16K | 100 | 13057 | 10789 | 11875 | 11333 | 12147 | 11877 | 12419 | 12149 | 12555 |
| 32K | 000 | 27649 | 22847 | 25149 | N/A | N/A | 25151 | 26301 | 25727 | 26589 |
| 32K | 001 | 27265 | 22527 | 24797 | N/A | N/A | 24799 | 25933 | 25367 | 26217 |
| 32K | 010 | 26881 | 22213 | 24451 | N/A | N/A | 24453 | 25571 | 25013 | 25851 |
| 32K | 011 | 26497 | 21895 | 24101 | N/A | N/A | 24103 | 25205 | 24655 | 25481 |
| 32K | 100 | 26113 | 21579 | 23753 | N/A | N/A | 23755 | 24841 | 24299 | 25113 |
| | $C_{red\_coeff}$ | NoC | SP12-2 | SP12-4 | SP16-2 | SP16-4 | SP24-2 | SP24-2 | SP32-2 | SP32-4 |
| Dx | | | 12 | 12 | 16 | 16 | 24 | 24 | 32 | 32 |
| Dy | | | 2 | 4 | 2 | 4 | 2 | 4 | 2 | 4 |
| 8K | 000 | 6913 | 6575 | 6717 | 6647 | 6753 | 6719 | 6789 | 6755 | 6807 |
| 8K | 001 | 6817 | 6483 | 6623 | 6554 | 6660 | 6625 | 6694 | 6661 | 6714 |
| 8K | 010 | 6721 | 6392 | 6530 | 6462 | 6565 | 6532 | 6600 | 6567 | 6619 |
| 8K | 011 | 6625 | 6301 | 6437 | 6370 | 6473 | 6439 | 6506 | 6474 | 6524 |
| 8K | 100 | 6529 | 6210 | 6344 | 6278 | 6378 | 6346 | 6412 | 6380 | 6429 |
| 16K | 000 | 13825 | 13151 | 13437 | 13295 | 13509 | 13439 | 13581 | 13511 | 13617 |
| 16K | 001 | 13633 | 12967 | 13249 | 13109 | 13320 | 13251 | 13391 | 13322 | 13428 |
| 16K | 010 | 13441 | 12786 | 13064 | 12926 | 13134 | 13066 | 13204 | 13136 | 13239 |
| 16K | 011 | 13249 | 12603 | 12877 | 12741 | 12946 | 12879 | 13015 | 12948 | 13051 |
| 16K | 100 | 13057 | 12421 | 12691 | 12557 | 12759 | 12693 | 12827 | 12761 | 12861 |
| 32K | 000 | 27649 | 26303 | 26877 | 26591 | 27021 | 26879 | 27165 | 27023 | 27237 |
| 32K | 001 | 27265 | 25935 | 26501 | 26219 | 26643 | 26503 | 26785 | 26645 | 26856 |
| 32K | 010 | 26881 | 25573 | 26131 | 25853 | 26271 | 26133 | 26411 | 26273 | 26481 |
| 32K | 011 | 26497 | 25207 | 25757 | 25483 | 25895 | 25759 | 26033 | 25897 | 26102 |
| 32K | 100 | 26113 | 24843 | 25385 | 25115 | 25521 | 25387 | 25657 | 25523 | 25725 |

[Figure 40]

Number of SBS pilots (including edge pilots and excluding CPs) (N_SP, SBS)

| | $C_{red\_coeff}$ | NoC | SP3-2 | SP3-4 | SP4-2 | SP4-4 | SP6-2 | SP6-4 | SP8-2 | SP8-4 |
|---|---|---|---|---|---|---|---|---|---|---|
| 8K | 000 | 6913 | 2305 | 2305 | 1729 | 1729 | 1153 | 1153 | 865 | 865 |
| 8K | 001 | 6817 | 2273 | 2273 | 1705 | 1705 | 1137 | 1137 | 853 | 853 |
| 8K | 010 | 6721 | 2241 | 2241 | 1681 | 1681 | 1121 | 1121 | 841 | 841 |
| 8K | 011 | 6625 | 2209 | 2209 | 1657 | 1657 | 1105 | 1105 | 829 | 829 |
| 8K | 100 | 6529 | 2177 | 2177 | 1633 | 1633 | 1089 | 1089 | 817 | 817 |
| 16K | 000 | 13825 | 4609 | 4609 | 3457 | 3457 | 2305 | 2305 | 1729 | 1729 |
| 16K | 001 | 13633 | 4545 | 4545 | 3409 | 3409 | 2273 | 2273 | 1705 | 1705 |
| 16K | 010 | 13441 | 4481 | 4481 | 3361 | 3361 | 2241 | 2241 | 1681 | 1681 |
| 16K | 011 | 13249 | 4417 | 4417 | 3313 | 3313 | 2209 | 2209 | 1657 | 1657 |
| 16K | 100 | 13057 | 4353 | 4353 | 3265 | 3265 | 2177 | 2177 | 1633 | 1633 |
| 32K | 000 | 27649 | 9217 | 9217 | 6913 | 6913 | 4609 | 4609 | 3457 | 3457 |
| 32K | 001 | 27265 | 9089 | 9089 | 6817 | 6817 | 4545 | 4545 | 3409 | 3409 |
| 32K | 010 | 26881 | 8961 | 8961 | 6721 | 6721 | 4481 | 4481 | 3361 | 3361 |
| 32K | 011 | 26497 | 8833 | 8833 | 6625 | 6625 | 4417 | 4417 | 3313 | 3313 |
| 32K | 100 | 26113 | 8705 | 8705 | 6529 | 6529 | 4353 | 4353 | 3265 | 3265 |
| | $C_{red\_coeff}$ | NoC | SP12-2 | SP12-4 | SP16-2 | SP16-4 | SP24-2 | SP24-2 | SP32-2 | SP32-4 |
| 8K | 000 | 6913 | 577 | 577 | 433 | 433 | 289 | 289 | 217 | 217 |
| 8K | 001 | 6817 | 569 | 569 | 427 | 427 | 285 | 285 | 214 | 214 |
| 8K | 010 | 6721 | 561 | 561 | 421 | 421 | 281 | 281 | 211 | 211 |
| 8K | 011 | 6625 | 553 | 553 | 415 | 415 | 277 | 277 | 208 | 208 |
| 8K | 100 | 6529 | 545 | 545 | 409 | 409 | 273 | 273 | 205 | 205 |
| 16K | 000 | 13825 | 1153 | 1153 | 865 | 865 | 577 | 577 | 433 | 433 |
| 16K | 001 | 13633 | 1137 | 1137 | 853 | 853 | 569 | 569 | 427 | 427 |
| 16K | 010 | 13441 | 1121 | 1121 | 841 | 841 | 561 | 561 | 421 | 421 |
| 16K | 011 | 13249 | 1105 | 1105 | 829 | 829 | 553 | 553 | 415 | 415 |
| 16K | 100 | 13057 | 1089 | 1089 | 817 | 817 | 545 | 545 | 409 | 409 |
| 32K | 000 | 27649 | 2305 | 2305 | 1729 | 1729 | 1153 | 1153 | 865 | 865 |
| 32K | 001 | 27265 | 2273 | 2273 | 1705 | 1705 | 1137 | 1137 | 853 | 853 |
| 32K | 010 | 26881 | 2241 | 2241 | 1681 | 1681 | 1121 | 1121 | 841 | 841 |
| 32K | 011 | 26497 | 2209 | 2209 | 1657 | 1657 | 1105 | 1105 | 829 | 829 |
| 32K | 100 | 26113 | 2177 | 2177 | 1633 | 1633 | 1089 | 1089 | 817 | 817 |

[Figure 41]

Number of data carriers in SBS ($N_{DATA,SBS}=NoC-N_{SP,SBS}-N_{NSP-CP}$)

| | $C_{red\_coeff}$ | NoC | SP3-2 | SP3-4 | SP4-2 | SP4-4 | SP6-2 | SP6-4 | SP8-2 | SP8-4 |
|---|---|---|---|---|---|---|---|---|---|---|
| 8K | 000 | 6913 | 4560 | 4560 | 5136 | 5136 | 5712 | 5712 | 6000 | 6000 |
| 8K | 001 | 6817 | 4496 | 4496 | 5064 | 5064 | 5632 | 5632 | 5916 | 5916 |
| 8K | 010 | 6721 | 4433 | 4433 | 4993 | 4993 | 5553 | 5553 | 5833 | 5833 |
| 8K | 011 | 6625 | 4370 | 4370 | 4922 | 4922 | 5474 | 5474 | 5750 | 5750 |
| 8K | 100 | 6529 | 4307 | 4307 | 4851 | 4851 | 5395 | 5395 | 5667 | 5667 |
| 16K | 000 | 13825 | 9120 | 9120 | 10272 | 10272 | 11424 | 11424 | 12000 | 12000 |
| 16K | 001 | 13633 | 8992 | 8992 | 10128 | 10128 | 11264 | 11264 | 11832 | 11832 |
| 16K | 010 | 13441 | 8867 | 8867 | 9987 | 9987 | 11107 | 11107 | 11667 | 11667 |
| 16K | 011 | 13249 | 8740 | 8740 | 9844 | 9844 | 10948 | 10948 | 11500 | 11500 |
| 16K | 100 | 13057 | 8614 | 8614 | 9702 | 9702 | 10790 | 10790 | 11334 | 11334 |
| 32K | 000 | 27649 | 13438 | 13438 | 15742 | 15742 | 18046 | 18046 | 19198 | 19198 |
| 32K | 001 | 27265 | 13246 | 13246 | 15518 | 15518 | 17790 | 17790 | 18926 | 18926 |
| 32K | 010 | 26881 | 13066 | 13066 | 15306 | 15306 | 17546 | 17546 | 18666 | 18666 |
| 32K | 011 | 26497 | 12878 | 12878 | 15086 | 15086 | 17294 | 17294 | 18398 | 18398 |
| 32K | 100 | 26113 | 12694 | 12694 | 14870 | 14870 | 17046 | 17046 | 18134 | 18134 |
| | $C_{red\_coeff}$ | NoC | SP12-2 | SP12-4 | SP16-2 | SP16-4 | SP24-2 | SP24-2 | SP32-2 | SP32-4 |
| 8K | 000 | 6913 | 6288 | 6288 | 6432 | 6432 | 6576 | 6576 | 6648 | 6648 |
| 8K | 001 | 6817 | 6200 | 6200 | 6342 | 6342 | 6484 | 6484 | 6555 | 6555 |
| 8K | 010 | 6721 | 6113 | 6113 | 6253 | 6253 | 6393 | 6393 | 6463 | 6463 |
| 8K | 011 | 6625 | 6026 | 6026 | 6164 | 6164 | 6302 | 6302 | 6371 | 6371 |
| 8K | 100 | 6529 | 5939 | 5939 | 6075 | 6075 | 6211 | 6211 | 6279 | 6279 |
| 16K | 000 | 13825 | 12576 | 12576 | 12864 | 12864 | 13152 | 13152 | 13296 | 13296 |
| 16K | 001 | 13633 | 12400 | 12400 | 12684 | 12684 | 12968 | 12968 | 13110 | 13110 |
| 16K | 010 | 13441 | 12227 | 12227 | 12507 | 12507 | 12787 | 12787 | 12927 | 12927 |
| 16K | 011 | 13249 | 12052 | 12052 | 12328 | 12328 | 12604 | 12604 | 12742 | 12742 |
| 16K | 100 | 13057 | 11878 | 11878 | 12150 | 12150 | 12422 | 12422 | 12558 | 12558 |
| 32K | 000 | 27649 | 20350 | 20350 | 20926 | 20926 | 21502 | 21502 | 21790 | 21790 |
| 32K | 001 | 27265 | 20062 | 20062 | 20630 | 20630 | 21198 | 21198 | 21482 | 21482 |
| 32K | 010 | 26881 | 19786 | 19786 | 20346 | 20346 | 20906 | 20906 | 21186 | 21186 |
| 32K | 011 | 26497 | 19502 | 19502 | 20054 | 20054 | 20606 | 20606 | 20882 | 20882 |
| 32K | 100 | 26113 | 19222 | 19222 | 19766 | 19766 | 20310 | 20310 | 20582 | 20582 |

[Figure 42]

Number of non-SP-bearing CPs ($N_{NSP-CP}$)

| $C_{red\_coeff}$ | 8K | 16K | 32K |
|---|---|---|---|
| 0 | 48 | 96 | 192 |
| 1 | 48 | 96 | 192 |
| 2 | 47 | 93 | 186 |
| 3 | 46 | 92 | 184 |
| 4 | 45 | 90 | 180 |

[Figure 43]

Number of active data carriers in SBS (NoA$_{SBS}$) when C$_{red\_coeff}$=000

| | L1_SP_Boost | SP3_2 | SP3_4 | SP4_2 | SP4_4 | SP6_2 | SP6_4 | SP8_2 | SP8_4 |
|---|---|---|---|---|---|---|---|---|---|
| 8K | 000 | 4560 | 4560 | 5136 | 5136 | 5712 | 5712 | 6000 | 6000 |
| | 001 | 4560 | 3904 | 5009 | 4332 | 5456 | 4856 | 5716 | 5168 |
| | 010 | 4123 | 2922 | 4600 | 3467 | 5114 | 4147 | 5398 | 4558 |
| | 011 | 3801 | 2148 | 4278 | 2868 | 4843 | 3588 | 5188 | 4078 |
| | 100 | 3467 | 1534 | 4022 | 2245 | 4629 | 3146 | 4971 | 3697 |
| 16K | 000 | 9120 | 9120 | 10272 | 10272 | 11424 | 11424 | 12000 | 12000 |
| | 001 | 9120 | 7807 | 10017 | 8663 | 10912 | 9708 | 11431 | 10331 |
| | 010 | 8244 | 5841 | 9199 | 6930 | 10225 | 8288 | 10793 | 9109 |
| | 011 | 7601 | 4290 | 8554 | 5731 | 9684 | 7168 | 10375 | 8146 |
| | 100 | 6933 | 3063 | 8043 | 4484 | 9256 | 6282 | 9939 | 7383 |
| 32K | 000 | 18240 | 18240 | N/A | N/A | 22848 | 22848 | 24000 | 24000 |
| | 001 | 18240 | 15612 | N/A | N/A | 21823 | 19412 | 22861 | 20658 |
| | 010 | 16488 | 11678 | N/A | N/A | 20449 | 16570 | 21585 | 18212 |
| | 011 | 15202 | 8576 | N/A | N/A | 19367 | 14329 | 20747 | 16283 |
| | 100 | 13865 | 6121 | N/A | N/A | 18510 | 12555 | 19876 | 14755 |
| | L1_SP_Boost | SP12_2 | SP12_4 | SP16_2 | SP16_4 | SP24_2 | SP24_4 | SP32_2 | SP32_4 |
| 8K | 000 | 6288 | 6288 | 6432 | 6432 | 6576 | 6576 | 6648 | 6648 |
| | 001 | 5976 | 5508 | 6132 | 5691 | 6297 | 5922 | 6384 | 6064 |
| | 010 | 5729 | 5010 | 5919 | 5252 | 6123 | 5564 | 6231 | 5757 |
| | 011 | 5533 | 4616 | 5751 | 4906 | 5986 | 5282 | 6125 | 5515 |
| | 100 | 5379 | 4305 | 5618 | 4633 | 5877 | 5058 | 6015 | 5324 |
| 16K | 000 | 12576 | 12576 | 12864 | 12864 | 13152 | 13152 | 13296 | 13296 |
| | 001 | 11950 | 11011 | 12262 | 11374 | 12593 | 11834 | 12766 | 12116 |
| | 010 | 11455 | 10010 | 11835 | 10493 | 12243 | 11113 | 12458 | 11497 |
| | 011 | 11064 | 9221 | 11499 | 9798 | 11968 | 10544 | 12245 | 11008 |
| | 100 | 10755 | 8596 | 11233 | 9248 | 11750 | 10094 | 12024 | 10622 |
| 32K | 000 | 25152 | 25152 | 25728 | 25728 | 26304 | 26304 | 26592 | 26592 |
| | 001 | 23899 | 22016 | 24521 | 22740 | 25183 | 23658 | 25529 | 24221 |
| | 010 | 22907 | 20010 | 23667 | 20974 | 24483 | 22211 | 24913 | 22976 |
| | 011 | 22124 | 18429 | 22994 | 19581 | 23931 | 21070 | 24486 | 21995 |
| | 100 | 21505 | 17177 | 22461 | 18479 | 23494 | 20167 | 24042 | 21218 |

[Figure 44]

Number of active data carriers in SBS (NoA$_{SBS}$) when C$_{red\_coeff}$=001

| | L1_SP_Boost | SP3_2 | SP3_4 | SP4_2 | SP4_4 | SP6_2 | SP6_4 | SP8_2 | SP8_4 |
|---|---|---|---|---|---|---|---|---|---|
| 8K  | 000 | 4496 | 4496 | 5064 | 5064 | 5632 | 5632 | 5916 | 5916 |
|     | 001 | 4496 | 3849 | 4938 | 4272 | 5380 | 4788 | 5636 | 5096 |
|     | 010 | 4065 | 2881 | 4535 | 3419 | 5042 | 4089 | 5322 | 4494 |
|     | 011 | 3748 | 2117 | 4218 | 2828 | 4775 | 3538 | 5116 | 4021 |
|     | 100 | 3418 | 1513 | 3966 | 2214 | 4564 | 3102 | 4901 | 3645 |
| 16K | 000 | 8992 | 8992 | 10128 | 10128 | 11264 | 11264 | 11832 | 11832 |
|     | 001 | 8992 | 7697 | 9876 | 8541 | 10759 | 9572 | 11271 | 10187 |
|     | 010 | 8129 | 5758 | 9070 | 6833 | 10082 | 8171 | 10642 | 8982 |
|     | 011 | 7495 | 4229 | 8434 | 5650 | 9549 | 7068 | 10229 | 8032 |
|     | 100 | 6835 | 3019 | 7930 | 4420 | 9126 | 6194 | 9800 | 7280 |
| 32K | 000 | 17984 | 17984 | N/A | N/A | 22528 | 22528 | 23664 | 23664 |
|     | 001 | 17984 | 15393 | N/A | N/A | 21517 | 19140 | 22541 | 20369 |
|     | 010 | 16256 | 11513 | N/A | N/A | 20163 | 16337 | 21282 | 17956 |
|     | 011 | 14988 | 8454 | N/A | N/A | 19095 | 14127 | 20456 | 16054 |
|     | 100 | 13669 | 6033 | N/A | N/A | 18250 | 12378 | 19597 | 14548 |
| | L1_SP_Boost | SP12_2 | SP12_4 | SP16_2 | SP16_4 | SP24_2 | SP24_4 | SP32_2 | SP32_4 |
| 8K  | 000 | 6200 | 6200 | 6342 | 6342 | 6484 | 6484 | 6555 | 6555 |
|     | 001 | 5892 | 5431 | 6046 | 5608 | 6209 | 5839 | 6294 | 5971 |
|     | 010 | 5648 | 4940 | 5836 | 5173 | 6038 | 5486 | 6142 | 5664 |
|     | 011 | 5456 | 4552 | 5671 | 4831 | 5902 | 5208 | 6037 | 5422 |
|     | 100 | 5304 | 4245 | 5540 | 4559 | 5795 | 4988 | 5928 | 5231 |
| 16K | 000 | 12400 | 12400 | 12684 | 12684 | 12968 | 12968 | 13110 | 13110 |
|     | 001 | 11783 | 10857 | 12090 | 11215 | 12416 | 11668 | 12587 | 11941 |
|     | 010 | 11294 | 9870 | 11669 | 10346 | 12072 | 10957 | 12284 | 11327 |
|     | 011 | 10909 | 9091 | 11338 | 9661 | 11800 | 10397 | 12074 | 10844 |
|     | 100 | 10604 | 8475 | 11075 | 9118 | 11585 | 9953 | 11856 | 10461 |
| 32K | 000 | 24800 | 24800 | 25368 | 25368 | 25936 | 25936 | 26220 | 26220 |
|     | 001 | 23564 | 21707 | 24178 | 22422 | 24830 | 23327 | 25172 | 23882 |
|     | 010 | 22586 | 19730 | 23336 | 20680 | 24140 | 21900 | 24564 | 22654 |
|     | 011 | 21815 | 18170 | 22672 | 19307 | 23596 | 20775 | 24143 | 21687 |
|     | 100 | 21204 | 16936 | 22146 | 18220 | 23165 | 19885 | 23705 | 20921 |

[Figure 45]

Number of active data carriers in SBS (NoA$_{SBS}$) when C$_{red\_coeff}$=010

| | L1_SP_Boost | SP3_2 | SP3_4 | SP4_2 | SP4_4 | SP6_2 | SP6_4 | SP8_2 | SP8_4 |
|---|---|---|---|---|---|---|---|---|---|
| 8K | 000 | 4433 | 4433 | 4993 | 4993 | 5553 | 5553 | 5833 | 5833 |
| | 001 | 4433 | 3796 | 4869 | 4212 | 5304 | 4720 | 5557 | 5024 |
| | 010 | 4008 | 2841 | 4472 | 3371 | 4971 | 4032 | 5247 | 4432 |
| | 011 | 3695 | 2088 | 4158 | 2788 | 4708 | 3488 | 5044 | 3964 |
| | 100 | 3371 | 1492 | 3910 | 2183 | 4500 | 3058 | 4833 | 3595 |
| 16K | 000 | 8867 | 8867 | 9987 | 9987 | 11107 | 11107 | 11667 | 11667 |
| | 001 | 8867 | 7591 | 9739 | 8422 | 10609 | 9438 | 11114 | 10045 |
| | 010 | 8016 | 5679 | 8943 | 6738 | 9942 | 8058 | 10494 | 8857 |
| | 011 | 7391 | 4172 | 8316 | 5572 | 9416 | 6970 | 10087 | 7920 |
| | 100 | 6741 | 2979 | 7820 | 4360 | 8999 | 6108 | 9664 | 7179 |
| 32K | 000 | 17734 | 17734 | N/A | N/A | 22214 | 22214 | 23334 | 23334 |
| | 001 | 17734 | 15179 | N/A | N/A | 21217 | 18873 | 22227 | 20085 |
| | 010 | 16031 | 11354 | N/A | N/A | 19882 | 16110 | 20986 | 17707 |
| | 011 | 14780 | 8339 | N/A | N/A | 18829 | 13932 | 20171 | 15831 |
| | 100 | 13480 | 5951 | N/A | N/A | 17996 | 12207 | 19324 | 14347 |
| | L1_SP_Boost | SP12_2 | SP12_4 | SP16_2 | SP16_4 | SP24_2 | SP24_4 | SP32_2 | SP32_4 |
| 8K | 000 | 6113 | 6113 | 6253 | 6253 | 6393 | 6393 | 6463 | 6463 |
| | 001 | 5810 | 5355 | 5961 | 5532 | 6122 | 5757 | 6207 | 5890 |
| | 010 | 5569 | 4870 | 5754 | 5106 | 5953 | 5409 | 6058 | 5589 |
| | 011 | 5380 | 4488 | 5591 | 4770 | 5820 | 5135 | 5955 | 5351 |
| | 100 | 5229 | 4186 | 5462 | 4504 | 5714 | 4918 | 5848 | 5164 |
| 16K | 000 | 12227 | 12227 | 12507 | 12507 | 12787 | 12787 | 12927 | 12927 |
| | 001 | 11619 | 10706 | 11921 | 11058 | 12243 | 11506 | 12412 | 11780 |
| | 010 | 11137 | 9732 | 11507 | 10202 | 11903 | 10805 | 12113 | 11178 |
| | 011 | 10757 | 8965 | 11180 | 9526 | 11636 | 10252 | 11906 | 10703 |
| | 100 | 10456 | 8358 | 10921 | 8992 | 11424 | 9815 | 11691 | 10328 |
| 32K | 000 | 24454 | 24454 | 25014 | 25014 | 25574 | 25574 | 25854 | 25854 |
| | 001 | 23236 | 21405 | 23841 | 22109 | 24484 | 23002 | 24821 | 23549 |
| | 010 | 22271 | 19455 | 23011 | 20392 | 23803 | 21595 | 24221 | 22339 |
| | 011 | 21511 | 17918 | 22356 | 19038 | 23267 | 20486 | 23806 | 21385 |
| | 100 | 20909 | 16701 | 21838 | 17967 | 22842 | 19608 | 23375 | 20630 |

[Figure 46]

Number of active data carriers in SBS (NoA$_{SBS}$) when C$_{red\_coeff}$=011

| | L1_SP_Boost | SP3_2 | SP3_4 | SP4_2 | SP4_4 | SP6_2 | SP6_4 | SP8_2 | SP8_4 |
|---|---|---|---|---|---|---|---|---|---|
| 8K | 000 | 4370 | 4370 | 4922 | 4922 | 5474 | 5474 | 5750 | 5750 |
| | 001 | 4370 | 3742 | 4800 | 4152 | 5229 | 4653 | 5478 | 4953 |
| | 010 | 3951 | 2800 | 4408 | 3323 | 4901 | 3974 | 5173 | 4369 |
| | 011 | 3643 | 2058 | 4099 | 2749 | 4641 | 3439 | 4972 | 3908 |
| | 100 | 3323 | 1471 | 3855 | 2152 | 4436 | 3015 | 4764 | 3544 |
| 16K | 000 | 8740 | 8740 | 9844 | 9844 | 10948 | 10948 | 11500 | 11500 |
| | 001 | 8740 | 7482 | 9599 | 8302 | 10457 | 9303 | 10955 | 9901 |
| | 010 | 7901 | 5597 | 8815 | 6642 | 9799 | 7943 | 10344 | 8730 |
| | 011 | 7285 | 4112 | 8197 | 5492 | 9281 | 6870 | 9942 | 7807 |
| | 100 | 6644 | 2936 | 7708 | 4297 | 8870 | 6021 | 9525 | 7076 |
| 32K | 000 | 17480 | 17480 | N/A | N/A | 21896 | 21896 | 23000 | 23000 |
| | 001 | 17480 | 14962 | N/A | N/A | 20913 | 18603 | 21909 | 19798 |
| | 010 | 15801 | 11192 | N/A | N/A | 19597 | 15879 | 20685 | 17453 |
| | 011 | 14568 | 8219 | N/A | N/A | 18560 | 13732 | 19882 | 15604 |
| | 100 | 13287 | 5866 | N/A | N/A | 17738 | 12032 | 19048 | 14141 |
| | L1_SP_Boost | SP12_2 | SP12_4 | SP16_2 | SP16_4 | SP24_2 | SP24_4 | SP32_2 | SP32_4 |
| 8K | 000 | 6026 | 6026 | 6164 | 6164 | 6302 | 6302 | 6371 | 6371 |
| | 001 | 5727 | 5279 | 5876 | 5450 | 6035 | 5675 | 6117 | 5809 |
| | 010 | 5490 | 4801 | 5672 | 5028 | 5868 | 5333 | 5970 | 5514 |
| | 011 | 5303 | 4425 | 5512 | 4695 | 5737 | 5062 | 5868 | 5281 |
| | 100 | 5155 | 4126 | 5385 | 4432 | 5633 | 4848 | 5762 | 5097 |
| 16K | 000 | 12052 | 12052 | 12328 | 12328 | 12604 | 12604 | 12742 | 12742 |
| | 001 | 11452 | 10552 | 11751 | 10900 | 12068 | 11341 | 12234 | 11606 |
| | 010 | 10977 | 9593 | 11342 | 10056 | 11733 | 10650 | 11940 | 11010 |
| | 011 | 10603 | 8837 | 11020 | 9390 | 11469 | 10106 | 11735 | 10540 |
| | 100 | 10307 | 8238 | 10765 | 8863 | 11260 | 9675 | 11523 | 10168 |
| 32K | 000 | 24104 | 24104 | 24656 | 24656 | 25208 | 25208 | 25484 | 25484 |
| | 001 | 22903 | 21099 | 23500 | 21793 | 24133 | 22673 | 24465 | 23212 |
| | 010 | 21952 | 19177 | 22681 | 20100 | 23463 | 21286 | 23875 | 22019 |
| | 011 | 21203 | 17661 | 22036 | 18766 | 22934 | 20193 | 23466 | 21079 |
| | 100 | 20609 | 16462 | 21525 | 17710 | 22515 | 19328 | 23040 | 20335 |

[Figure 47]

Number of active data carriers in SBS (NoA$_{SBS}$) when C$_{red\_coeff}$=100

|  | L1_SP_Boost | SP3_2 | SP3_4 | SP4_2 | SP4_4 | SP6_2 | SP6_4 | SP8_2 | SP8_4 |
|---|---|---|---|---|---|---|---|---|---|
| 8K | 000 | 4307 | 4307 | 4851 | 4851 | 5395 | 5395 | 5667 | 5667 |
|  | 001 | 4307 | 3688 | 4731 | 4092 | 5154 | 4586 | 5399 | 4881 |
|  | 010 | 3894 | 2760 | 4345 | 3275 | 4830 | 3917 | 5098 | 4306 |
|  | 011 | 3591 | 2029 | 4040 | 2710 | 4575 | 3390 | 4901 | 3852 |
|  | 100 | 3275 | 1450 | 3799 | 2121 | 4372 | 2972 | 4695 | 3493 |
| 16K | 000 | 8614 | 8614 | 9702 | 9702 | 10790 | 10790 | 11334 | 11334 |
|  | 001 | 8614 | 7374 | 9461 | 8182 | 10306 | 9169 | 10797 | 9758 |
|  | 010 | 7787 | 5517 | 8688 | 6546 | 9658 | 7828 | 10194 | 8604 |
|  | 011 | 7180 | 4053 | 8079 | 5413 | 9147 | 6771 | 9799 | 7695 |
|  | 100 | 6549 | 2894 | 7597 | 4236 | 8743 | 5934 | 9388 | 6974 |
| 32K | 000 | 17228 | 17228 | N/A | N/A | 21580 | 21580 | 22668 | 22668 |
|  | 001 | 17228 | 14746 | N/A | N/A | 20612 | 18335 | 21593 | 19512 |
|  | 010 | 15573 | 11031 | N/A | N/A | 19315 | 15651 | 20387 | 17202 |
|  | 011 | 14359 | 8101 | N/A | N/A | 18292 | 13534 | 19596 | 15380 |
|  | 100 | 13096 | 5782 | N/A | N/A | 17483 | 11859 | 18773 | 13938 |
|  | L1_SP_Boost | SP12_2 | SP12_4 | SP16_2 | SP16_4 | SP24_2 | SP24_4 | SP32_2 | SP32_4 |
| 8K | 000 | 5939 | 5939 | 6075 | 6075 | 6211 | 6211 | 6279 | 6279 |
|  | 001 | 5644 | 5203 | 5792 | 5375 | 5948 | 5594 | 6030 | 5728 |
|  | 010 | 5411 | 4732 | 5591 | 4961 | 5784 | 5256 | 5886 | 5438 |
|  | 011 | 5227 | 4361 | 5432 | 4635 | 5654 | 4990 | 5786 | 5210 |
|  | 100 | 5081 | 4067 | 5307 | 4377 | 5552 | 4779 | 5682 | 5030 |
| 16K | 000 | 11878 | 11878 | 12150 | 12150 | 12422 | 12422 | 12558 | 12558 |
|  | 001 | 11287 | 10400 | 11581 | 10743 | 11894 | 11178 | 12058 | 11444 |
|  | 010 | 10819 | 9455 | 11178 | 9911 | 11564 | 10497 | 11767 | 10860 |
|  | 011 | 10450 | 8710 | 10861 | 9255 | 11304 | 9960 | 11566 | 10399 |
|  | 100 | 10158 | 8120 | 10609 | 8736 | 11098 | 9536 | 11357 | 10034 |
| 32K | 000 | 23756 | 23756 | 24300 | 24300 | 24844 | 24844 | 25116 | 25116 |
|  | 001 | 22572 | 20794 | 23160 | 21478 | 23785 | 22345 | 24112 | 22877 |
|  | 010 | 21636 | 18900 | 22354 | 19810 | 23124 | 20979 | 23530 | 21702 |
|  | 011 | 20897 | 17407 | 21718 | 18495 | 22603 | 19902 | 23127 | 20775 |
|  | 100 | 20312 | 16225 | 21215 | 17454 | 22190 | 19049 | 22708 | 20042 |

[Figure 49]
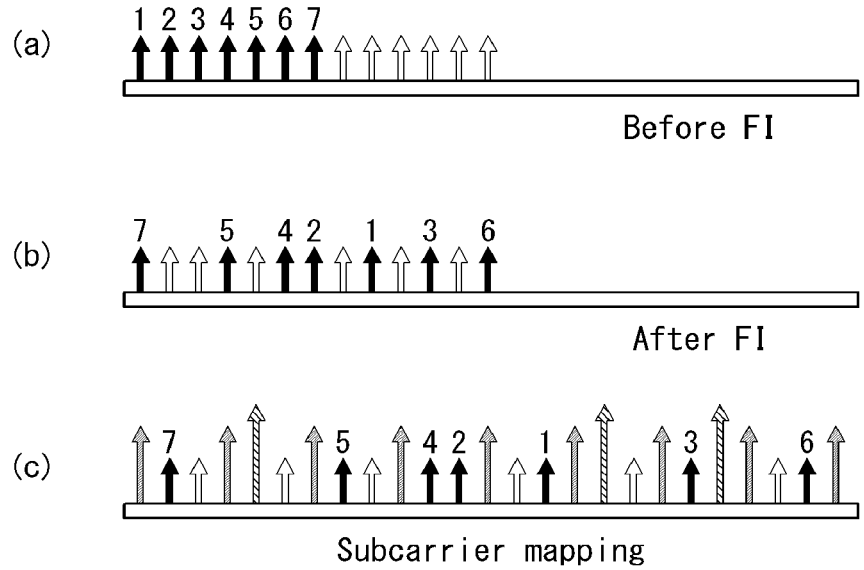
[Figure 50]
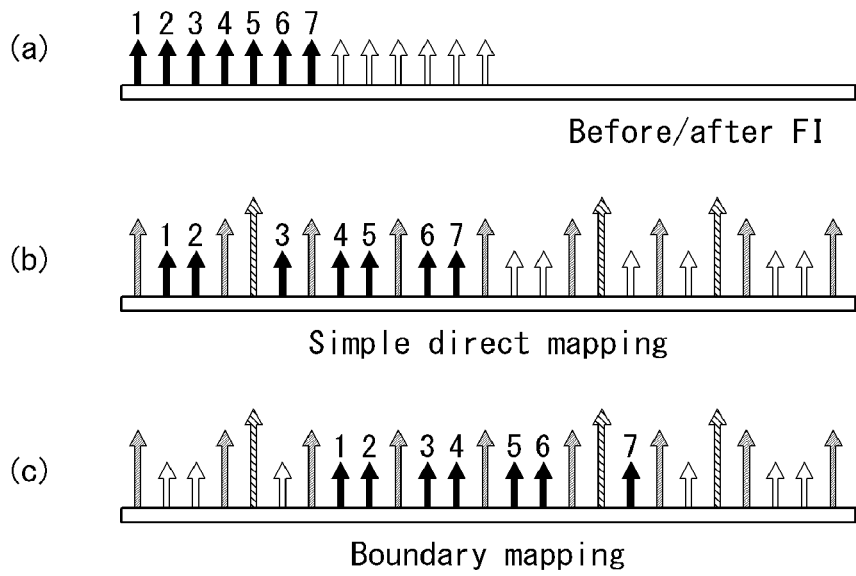

[Figure 51]
(a) 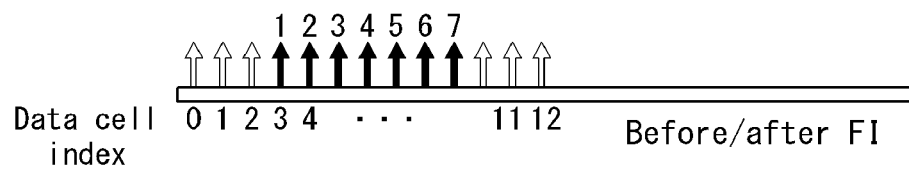
$N_{DATA, SBS} = 13, NoA_{SBS} = 7, N_{null, SBS} = 6$
Data cell index : $0 \sim N_{DATA, SBS} - 1$,
Start address of the first data cell,
SBS_NoA_Start
$= \left\lfloor \dfrac{N_{null, SBS}}{2} \right\rfloor = 3$
(b) 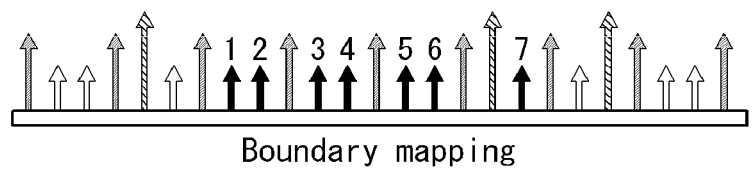
[Figure 52]
(a) 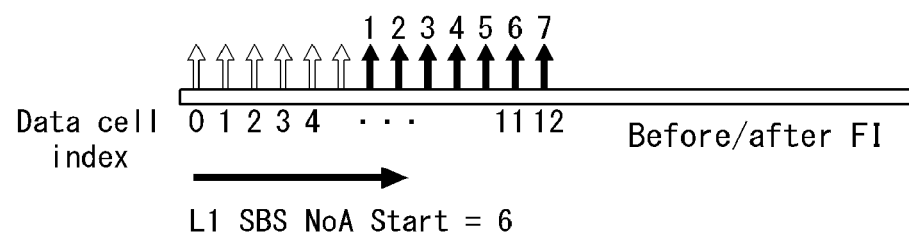
L1_SBS_NoA_Start = 6
(b) 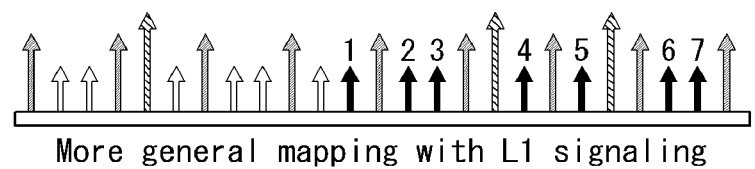

[Figure 53]
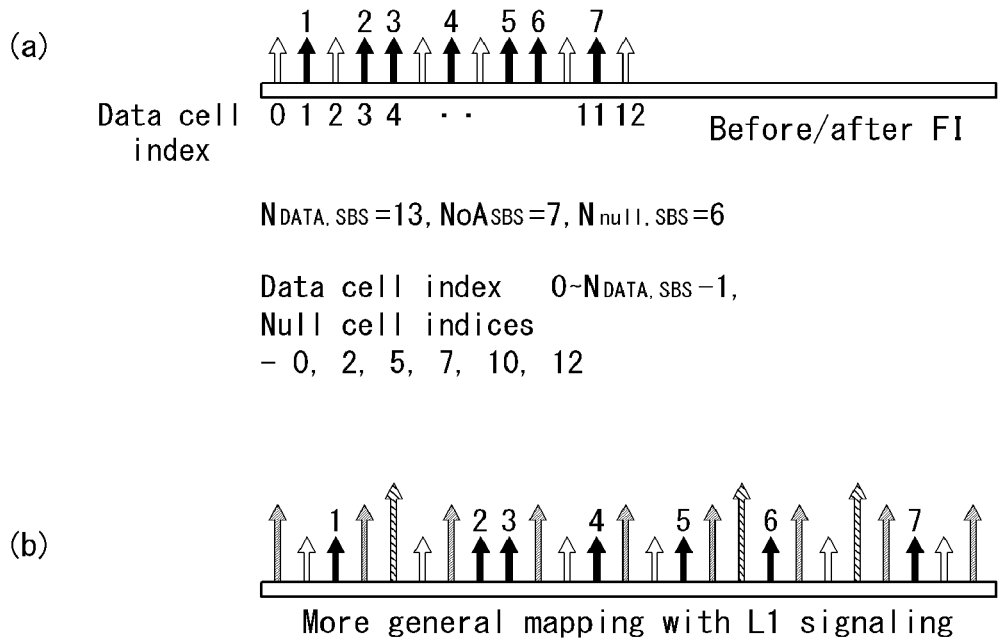
[Figure 54]
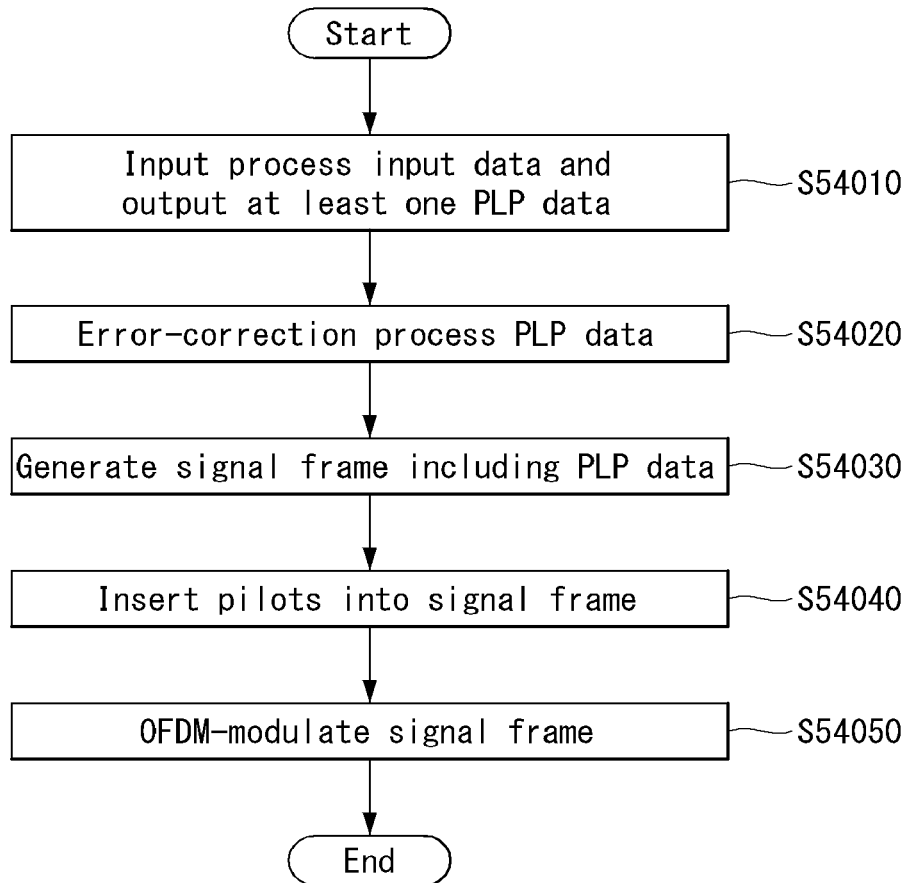

[Figure 56]
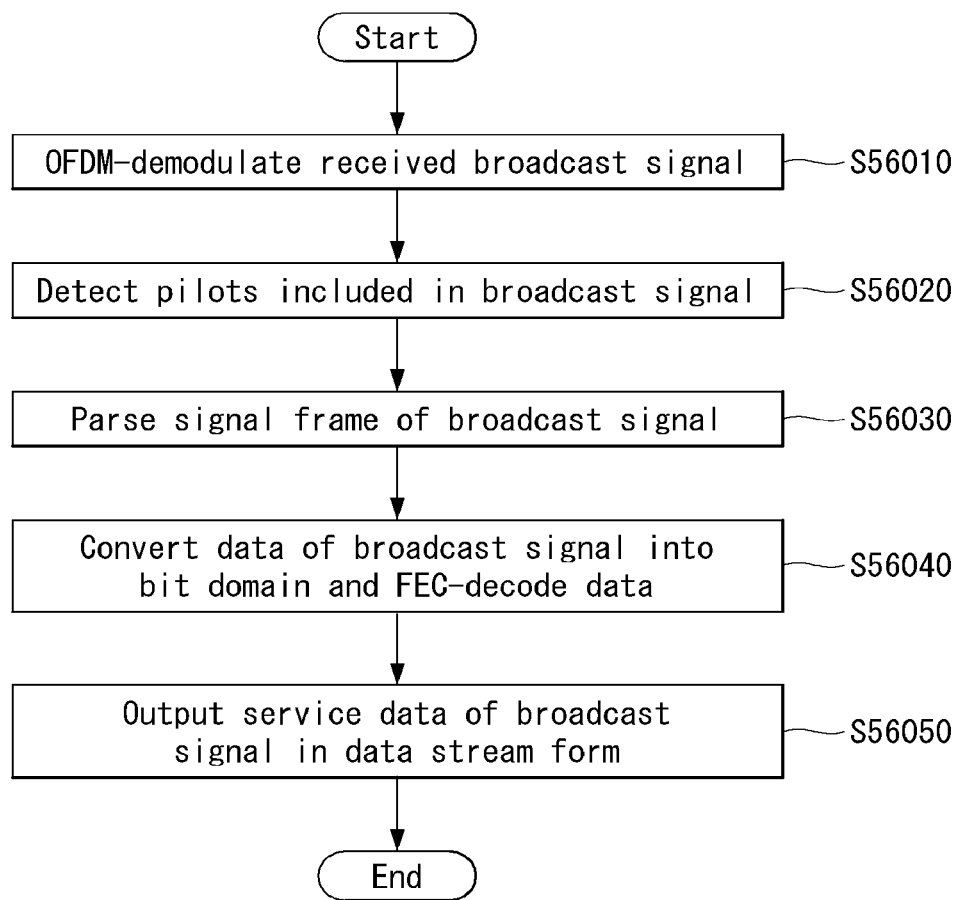

APPARATUS AND METHOD FOR SENDING AND RECEIVING BROADCAST SIGNALS

CROSS-REFERENCE TO RELATED APPLICATIONS

This application is a continuation of U.S. patent application Ser. No. 16/399,425, filed Apr. 30, 2019, which is a continuation of U.S. patent application Ser. No. 16/140,000, filed Sep. 24, 2018, now U.S. Pat. No. 10,382,239, which is a continuation of U.S. patent application Ser. No. 15/615,663, filed on Jun. 6, 2017, now U.S. Pat. No. 10,158,513, which is a continuation of U.S. patent application Ser. No. 15/061,458 filed on Mar. 4, 2016, now U.S. Pat. No. 9,705,723, which claims priority to U.S. Provisional Application No. 62/197,542 filed on Jul. 27, 2015, U.S. Provisional Application No. 62/199,844 filed on Jul. 31, 2015, U.S. Provisional Application No. 62/201,531 filed on Aug. 5, 2015 and U.S. Provisional Application No. 62/198,117 filed on Jul. 28, 2015, all of which are incorporated by reference in their entirety herein.

BACKGROUND OF THE INVENTION

Field of the Invention

The present invention relates to an apparatus for transmitting broadcast signals, an apparatus for receiving broadcast signals and methods for transmitting and receiving broadcast signals.

Discussion of the Related Art

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

SUMMARY OF THE INVENTION

A broadcast signal receiver for processing a broadcast signal including signaling information according to an embodiment of the present invention includes a Fast Fourier Transform (FFT) module configured to Orthogonal Frequency Division Multiplexing (OFDM)-demodulate a received broadcast signal, a pilot detector configured to detect pilots included in the broadcast signal, a frame parsing module configured to parse the signal frame of the broadcast signal, the signal frame including a preamble and at least one subframe, a demapping and decoding module configured to convert the Physical Layer Pipe (PLP) data of the broadcast signal into a bit domain and to Forward Error Correction (FEC)-decode the PLP data, and an output processing module configured to receive the PLP data and to output a data stream. The subframe includes data symbols and at least one Subframe Boundary Symbol (SBS), and the SBS includes data carriers and subframe boundary pilots.

In the broadcast signal receiver according to an embodiment of the present invention, the data symbols of the subframe may include Scattered Pilots (SPs), amplitude of the SPs may be determined based on an SP boosting parameter indicative of a power boosting level of the SPs, and amplitude of the subframe boundary pilots may be determined based on the SP boosting parameter.

In the broadcast signal receiver according to an embodiment of the present invention, the subframe boundary pilots may be placed based on a pilot separation in the frequency direction of an SP pattern for the subframe, and the data carriers of the SBS may include the specific number of active data carriers and the specific number of null carriers.

In the broadcast signal receiver according to an embodiment of the present invention, the number of active data carriers may be determined based on the SP boosting parameter.

In the broadcast signal receiver according to an embodiment of the present invention, the number of null carriers may be determined based on the amplitude of the SPs.

In the broadcast signal receiver according to an embodiment of the present invention, the number of null carriers may be obtained by subtracting the number of active data carriers from the number of data carriers.

In the broadcast signal receiver according to an embodiment of the present invention, the active data carriers may be placed at the center of all the data carriers, and half of the null cells may be placed at the band edges of the data carriers.

Furthermore, a method of receiving a broadcast signal according to an embodiment of the present invention includes Orthogonal Frequency Division Multiplexing (OFDM)-demodulating a received broadcast signal, detecting pilots included in the broadcast signal, parsing the signal frame of the broadcast signal, the signal frame including a preamble and at least one subframe, converting the Physical Layer Pipe (PLP) data of the broadcast signal into a bit domain and Forward Error Correction (FEC)-decoding the PLP data, and receiving the PLP data and outputting a data stream. The subframe may include data symbols and at least one Subframe Boundary Symbol (SBS), and the SBS may include data carriers and subframe boundary pilots.

The present invention can process data according to service characteristics to control QoS (Quality of Services) for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

Further aspects and effects of the present invention will be described more detail with embodiments in belows.

BRIEF DESCRIPTION OF THE DRAWINGS

FIG. 11 illustrates a signaling hierarchy structure of the frame according to an embodiment of the present invention.

FIG. 12 illustrates preamble signaling data according to an embodiment of the present invention.

FIG. 14 illustrates PLS2 data according to an embodiment of the present invention.

FIG. 15 illustrates PLS2 data according to another embodiment of the present invention.

FIG. 16 illustrates a logical structure of a frame according to an embodiment of the present invention.

FIG. 17 illustrates PLS mapping according to an embodiment of the present invention.

FIG. 18 illustrates EAC mapping according to an embodiment of the present invention.

FIG. 19 illustrates FIC mapping according to an embodiment of the present invention.

FIG. 20 illustrates a type of DP according to an embodiment of the present invention.

FIG. 21 illustrates DP mapping according to an embodiment of the present invention.

FIG. 22 illustrates an FEC structure according to an embodiment of the present invention.

FIG. 26 illustrates a basic operation of a twisted row-column block interleaver according to an exemplary embodiment of the present invention.

FIG. 27 illustrates an operation of a twisted row-column block interleaver according to another exemplary embodiment of the present invention.

FIG. 31 shows the structure of a signal frame according to an embodiment of the present invention.

FIG. 32 shows the structure of a signal frame according to an embodiment of the present invention.

FIGS. 34 and 35 show SP boosting information according to an embodiment of the present invention.

FIGS. 36 and 37 show preamble pilot boosting information according to an embodiment of the present invention.

FIG. 38 shows the SP power boosting levels of a frame boundary symbol.

FIG. 39 shows the Number of Active carriers (NoA) for a normal data symbol according to an embodiment of the present invention.

FIG. 40 shows the number of pilots of an SBS "N_SP, SBS" according to an embodiment of the present invention.

FIG. 41 shows the number of data carriers of an SBS according to an embodiment of the present invention.

FIG. 42 shows the number of CPs per symbol according to an embodiment of the present invention.

FIGS. 43 to 47 show the number of active data carriers of an SBS "NoA_SBS" depending on an NoC reduction coefficient "C_red_coeff" according to an embodiment of the present invention.

FIG. 49 shows a method of mapping the null carriers of an SBS according to an embodiment of the present invention.

FIG. 50 shows a method of mapping the null carriers of an SBS according to another embodiment of the present invention.

FIG. 51 shows a method of mapping the null carriers of an SBS according to another embodiment of the present invention.

FIG. 52 shows a method of mapping the null carriers of an SBS according to another embodiment of the present invention.

FIG. 53 shows a method of mapping null carriers according to another embodiment of the present invention.

FIG. 54 shows a method of transmitting a broadcast signal according to an embodiment of the present invention.

FIG. 56 shows a method of receiving a broadcast signal according to an embodiment of the present invention.

DETAILED DESCRIPTION OF THE EMBODIMENTS

Figure 1:
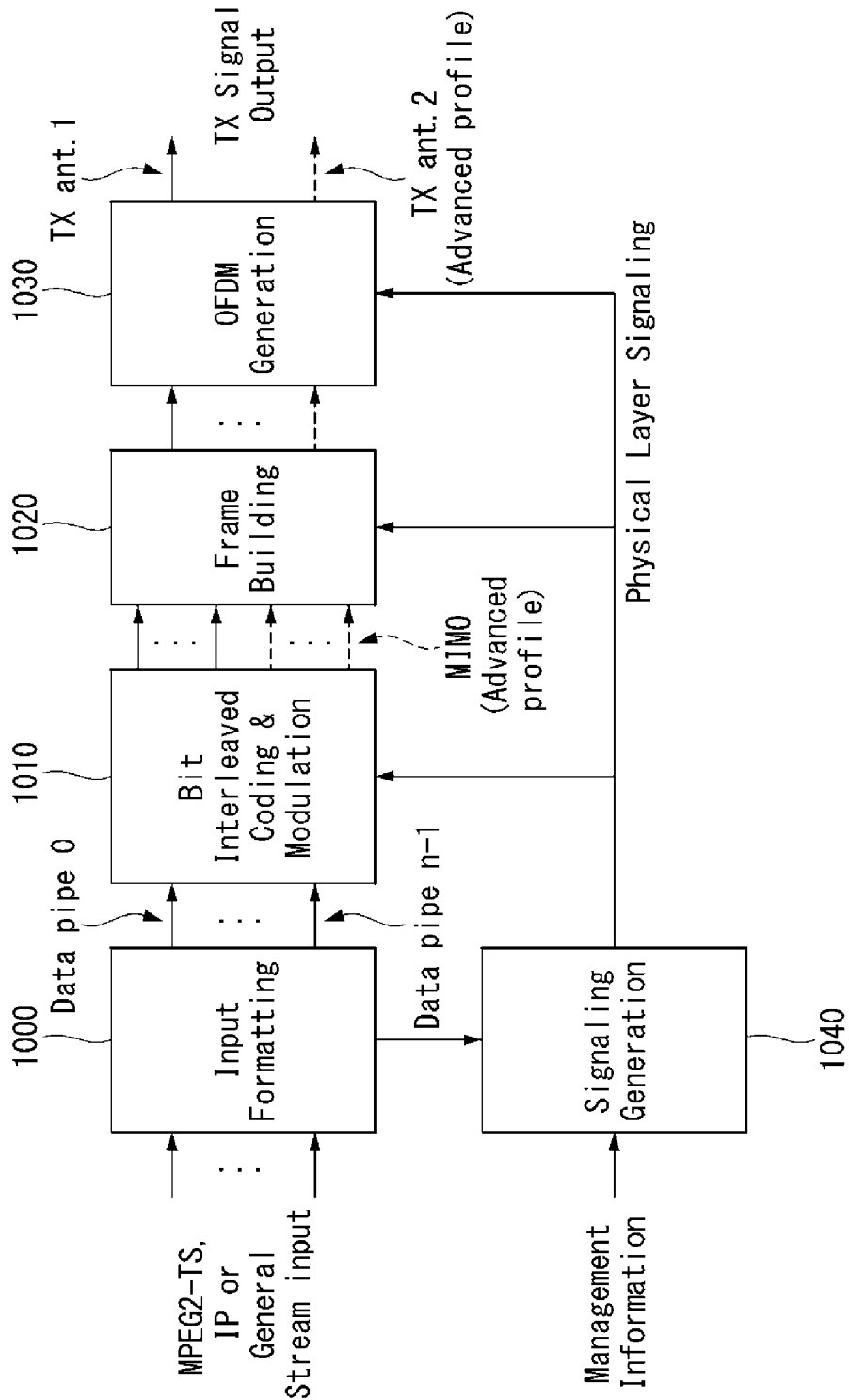
FIG. 1 illustrates a structure of an apparatus for transmitting broadcast signals for future broadcast services according to an embodiment of the present invention.

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings. Also, the term block and module are used similarly to indicate logical/functional unit of particular signal/data processing.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

The present invention may defines three physical layer (PL) profiles—base, handheld and advanced profiles—each optimized to minimize receiver complexity while attaining the performance required for a particular use case. The physical layer (PHY) profiles are subsets of all configurations that a corresponding receiver should implement.

The three PHY profiles share most of the functional blocks but differ slightly in specific blocks and/or parameters. Additional PHY profiles can be defined in the future. For the system evolution, future profiles can also be multiplexed with the existing profiles in a single RF channel through a future extension frame (FEF). The details of each PHY profile are described below.

1. Base Profile

The base profile represents a main use case for fixed receiving devices that are usually connected to a roof-top antenna. The base profile also includes portable devices that could be transported to a place but belong to a relatively stationary reception category. Use of the base profile could be extended to handheld devices or even vehicular by some improved implementations, but those use cases are not expected for the base profile receiver operation.

Target SNR range of reception is from approximately 10 to 20 dB, which includes the 15 dB SNR reception capability of the existing broadcast system (e.g. ATSC A/53). The receiver complexity and power consumption is not as critical as in the battery-operated handheld devices, which will use the handheld profile. Key system parameters for the base profile are listed in below table 1.

TABLE 1

| LDPC codeword length | 16K, 64K bits |
|---|---|
| Constellation size | 4~10 bpcu (bits per channel use) |
| Time de-interleaving memory size | $\leq 2^{19}$ data cells |
| Pilot patterns | Pilot pattern for fixed reception |
| FFT size | 16K, 32K points |

2. Handheld Profile

The handheld profile is designed for use in handheld and vehicular devices that operate with battery power. The devices can be moving with pedestrian or vehicle speed. The power consumption as well as the receiver complexity is very important for the implementation of the devices of the handheld profile. The target SNR range of the handheld profile is approximately 0 to 10 dB, but can be configured to reach below 0 dB when intended for deeper indoor reception.

In addition to low SNR capability, resilience to the Doppler Effect caused by receiver mobility is the most important performance attribute of the handheld profile. Key system parameters for the handheld profile are listed in the below table 2.

TABLE 2

| LDPC codeword length | 16K bits |
|---|---|
| Constellation size | 2~8 bpcu |
| Time de-interleaving memory size | $\leq 2^{18}$ data cells |
| Pilot patterns | Pilot patterns for mobile and indoor reception |
| FFT size | 8K, 16K points |

3. Advanced Profile

The advanced profile provides highest channel capacity at the cost of more implementation complexity. This profile requires using MIMO transmission and reception, and UHDTV service is a target use case for which this profile is specifically designed. The increased capacity can also be used to allow an increased number of services in a given bandwidth, e.g., multiple SDTV or HDTV services.

The target SNR range of the advanced profile is approximately 20 to 30 dB. MIMO transmission may initially use existing elliptically-polarized transmission equipment, with extension to full-power cross-polarized transmission in the future. Key system parameters for the advanced profile are listed in below table 3.

TABLE 3

| LDPC codeword length | 16K, 64K bits |
|---|---|
| Constellation size | 8~12 bpcu |
| Time de-interleaving memory size | $\leq 2^{19}$ data cells |
| Pilot patterns | Pilot pattern for fixed reception |
| FFT size | 16K, 32K points |

In this case, the base profile can be used as a profile for both the terrestrial broadcast service and the mobile broadcast service. That is, the base profile can be used to define a concept of a profile which includes the mobile profile. Also, the advanced profile can be divided advanced profile for a base profile with MIMO and advanced profile for a handheld profile with MIMO. Moreover, the three profiles can be changed according to intention of the designer.

The following terms and definitions may apply to the present invention. The following terms and definitions can be changed according to design.

auxiliary stream: sequence of cells carrying data of as yet undefined modulation and coding, which may be used for future extensions or as required by broadcasters or network operators base data pipe: data pipe that carries service signaling data baseband frame (or BBFRAME): set of Kbch bits which form the input to one FEC encoding process (BCH and LDPC encoding)

cell: modulation value that is carried by one carrier of the OFDM transmission coded block: LDPC-encoded block of PLS1 data or one of the LDPC-encoded blocks of PLS2 data data pipe: logical channel in the physical layer that carries service data or related metadata, which may carry one or multiple service(s) or service component(s).

data pipe unit: a basic unit for allocating data cells to a DP in a frame.

data symbol: OFDM symbol in a frame which is not a preamble symbol (the frame signaling symbol and frame edge symbol is included in the data symbol)

DP_ID: this 8-bit field identifies uniquely a DP within the system identified by the SYSTEM_ID dummy cell: cell carrying a pseudo-random value used to fill the remaining capacity not used for PLS signaling, DPs or auxiliary streams emergency alert channel: part of a frame that carries EAS information data frame: physical layer time slot that starts with a preamble and ends with a frame edge symbol frame repetition unit: a set of frames belonging to same or different physical layer profile including a FEF, which is repeated eight times in a super-frame fast information channel: a logical channel in a frame that carries the mapping information between a service and the corresponding base DP FECBLOCK: set of LDPC-encoded bits of a DP data FFT size: nominal FFT size used for a particular mode, equal to the active symbol period Ts expressed in cycles of the elementary period T frame signaling symbol: OFDM symbol with higher pilot density used at the start of a frame in certain combinations of FFT size, guard interval and scattered pilot(sp) pattern, which carries a part of the PLS data frame edge symbol: OFDM symbol with higher pilot density used at the end of a frame in certain combinations of FFT size, guard interval and scattered pilot pattern frame-group: the set of all the frames having the same PHY profile type in a super-frame.

future extension frame: physical layer time slot within the super-frame that could be used for future extension, which starts with a preamble Futurecast UTB system: proposed physical layer broadcasting system, of which the input is one or more MPEG2-TS or IP or general stream(s) and of which the output is an RF signal input stream: A stream of data for an ensemble of services delivered to the end users by the system.

normal data symbol: data symbol excluding the frame signaling symbol and the frame edge symbol PHY profile: subset of all configurations that a corresponding receiver should implement PLS: physical layer signaling data consisting of PLS1 and PLS2

PLS1: a first set of PLS data carried in the FSS symbols having a fixed size, coding and modulation, which carries basic information about the system as well as the parameters needed to decode the PLS2

NOTE: PLS1 data remains constant for the duration of a frame-group.

PLS2: a second set of PLS data transmitted in the FSS symbol, which carries more detailed PLS data about the system and the DPs PLS2 dynamic data: PLS2 data that may dynamically change frame-by-frame PLS2 static data: PLS2 data that remains static for the duration of a frame-group preamble signaling data: signaling data carried by the preamble symbol and used to identify the basic mode of the system preamble symbol: fixed-length pilot symbol that carries basic PLS data and is located in the beginning of a frame NOTE: The preamble symbol is mainly used for fast initial band scan to detect the system signal, its timing, frequency offset, and FFT-size.

reserved for future use: not defined by the present document but may be defined in future super-frame: set of eight frame repetition units time interleaving block (TI block): set of cells within which time interleaving is carried out, corresponding to one use of the time interleaver memory TI group: unit over which dynamic capacity allocation for a particular DP is carried out, made up of an integer, dynamically varying number of XFECBLOCKs NOTE: The TI group may be mapped directly to one frame or may be mapped to multiple frames. It may contain one or more TI blocks.

Type 1 DP: DP of a frame where all DPs are mapped into the frame in TDM fashion

Type 2 DP: DP of a frame where all DPs are mapped into the frame in FDM fashion

XFECBLOCK: set of Ncells cells carrying all the bits of one LDPC FECBLOCK

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting block 1000, a BICM (Bit interleaved coding & modulation) block 1010, a frame structure block 1020, an OFDM (Orthogonal Frequency Division Multiplexing) generation block 1030 and a signaling generation block 1040. A description will be given of the operation of each module of the apparatus for transmitting broadcast signals.

IP stream/packets and MPEG2-TS are the main input formats, other stream types are handled as General Streams. In addition to these data inputs, Management Information is input to control the scheduling and allocation of the corresponding bandwidth for each input stream. One or multiple TS stream(s), IP stream(s) and/or General Stream(s) inputs are simultaneously allowed.

The input formatting block 1000 can demultiplex each input stream into one or multiple data pipe(s), to each of which an independent coding and modulation is applied. The data pipe (DP) is the basic unit for robustness control, thereby affecting quality-of-service (QoS). One or multiple service(s) or service component(s) can be carried by a single DP. Details of operations of the input formatting block 1000 will be described later.

The data pipe is a logical channel in the physical layer that carries service data or related metadata, which may carry one or multiple service(s) or service component(s).

Also, the data pipe unit: a basic unit for allocating data cells to a DP in a frame.

In the BICM block 1010, parity data is added for error correction and the encoded bit streams are mapped to complex-value constellation symbols. The symbols are interleaved across a specific interleaving depth that is used for the corresponding DP. For the advanced profile, MIMO encoding is performed in the BICM block 1010 and the additional data path is added at the output for MIMO transmission. Details of operations of the BICM block 1010 will be described later.

The Frame Building block 1020 can map the data cells of the input DPs into the OFDM symbols within a frame. After mapping, the frequency interleaving is used for frequency-domain diversity, especially to combat frequency-selective fading channels. Details of operations of the Frame Building block 1020 will be described later.

After inserting a preamble at the beginning of each frame, the OFDM Generation block 1030 can apply conventional OFDM modulation having a cyclic prefix as guard interval. For antenna space diversity, a distributed MISO scheme is applied across the transmitters. In addition, a Peak-to-Average Power Reduction (PAPR) scheme is performed in the time domain. For flexible network planning, this proposal provides a set of various FFT sizes, guard interval lengths and corresponding pilot patterns. Details of operations of the OFDM Generation block 1030 will be described later.

The Signaling Generation block 1040 can create physical layer signaling information used for the operation of each functional block. This signaling information is also transmitted so that the services of interest are properly recovered at the receiver side. Details of operations of the Signaling Generation block 1040 will be described later.

Figure 2:
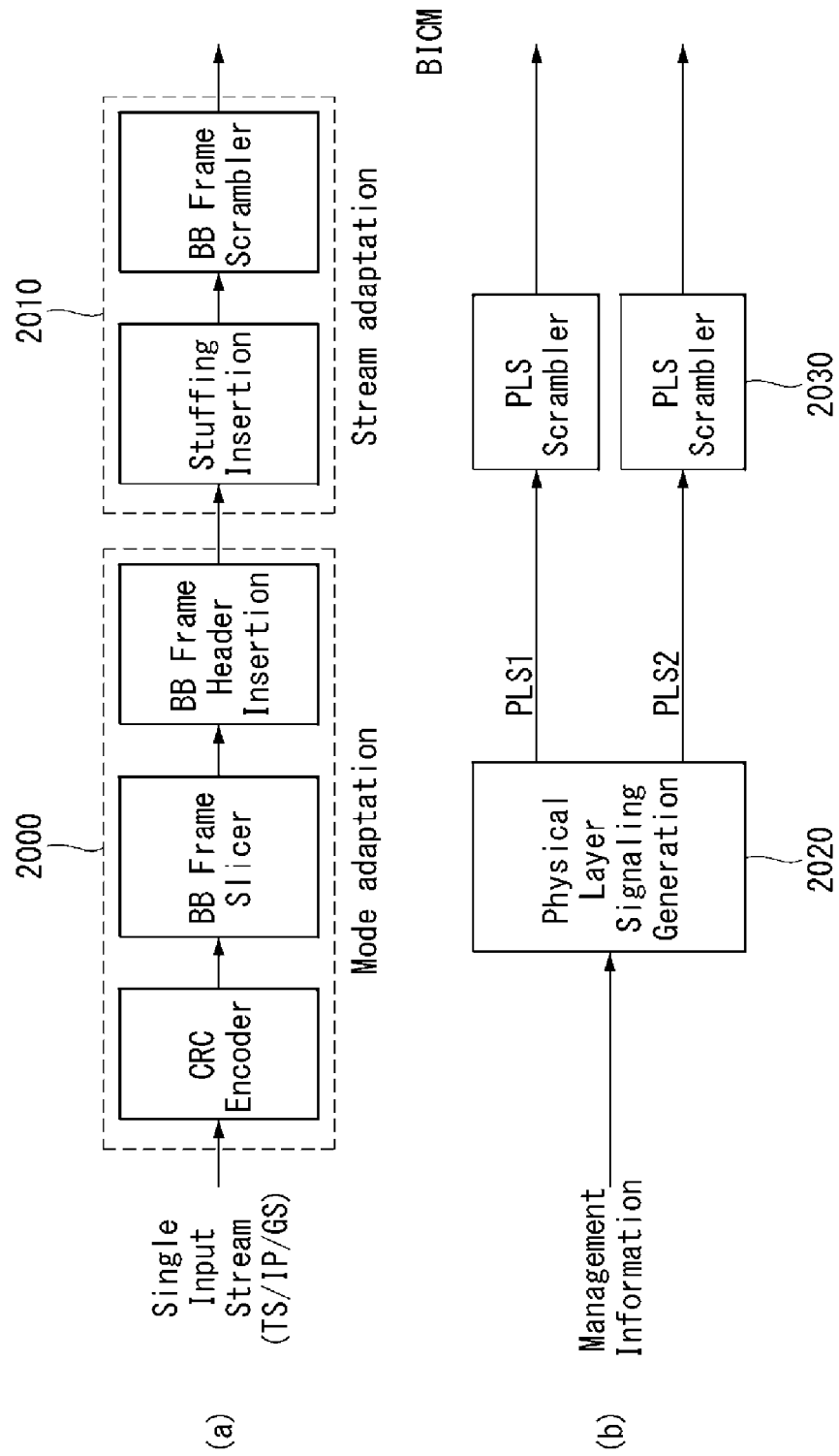
FIG. 2 illustrates an input formatting block according to one embodiment of the present invention.
Figure 3:
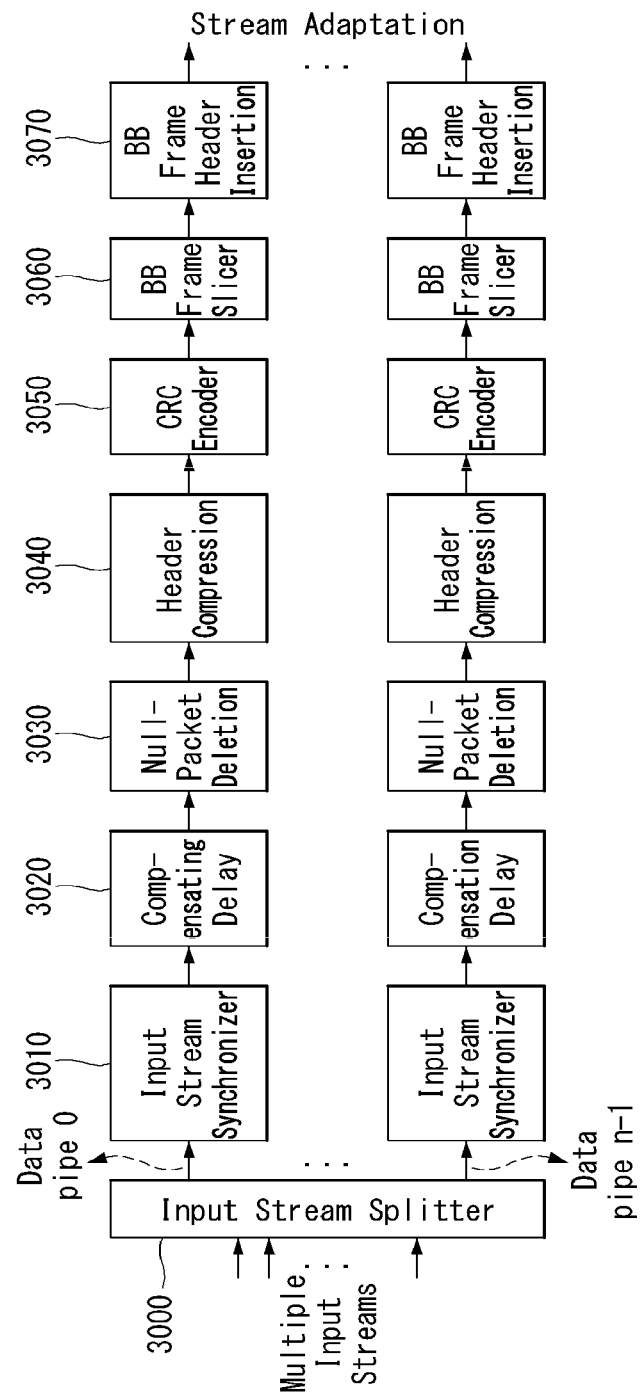
FIG. 3 illustrates an input formatting block according to another embodiment of the present invention.
Figure 4:
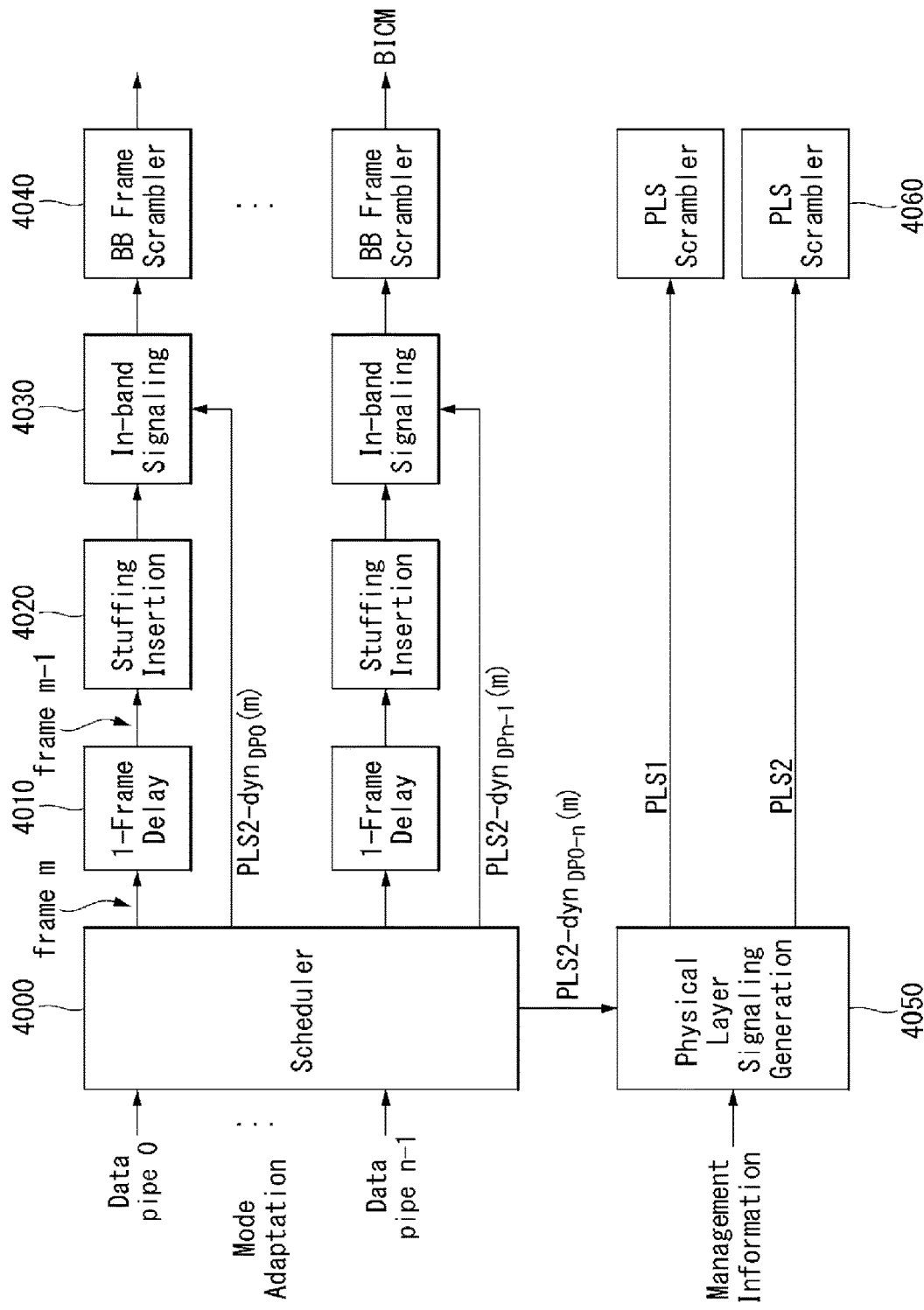
FIG. 4 illustrates an input formatting block according to another embodiment of the present invention.

FIGS. 2, 3 and 4 illustrate the input formatting block 1000 according to embodiments of the present invention. A description will be given of each figure.

FIG. 2 illustrates an input formatting block according to one embodiment of the present invention. FIG. 2 shows an input formatting module when the input signal is a single input stream.

The input formatting block illustrated in FIG. 2 corresponds to an embodiment of the input formatting block 1000 described with reference to FIG. 1.

The input to the physical layer may be composed of one or multiple data streams. Each data stream is carried by one DP. The mode adaptation modules slice the incoming data stream into data fields of the baseband frame (BBF). The system supports three types of input data streams: MPEG2-TS, Internet protocol (IP) and Generic stream (GS). MPEG2-TS is characterized by fixed length (188 byte) packets with the first byte being a sync-byte (0x47). An IP stream is composed of variable length IP datagram packets, as signaled within IP packet headers. The system supports both IPv4 and IPv6 for the IP stream. GS may be composed of variable length packets or constant length packets, signaled within encapsulation packet headers.

(a) shows a mode adaptation block 2000 and a stream adaptation 2010 for signal DP and (b) shows a PLS generation block 2020 and a PLS scrambler 2030 for generating and processing PLS data. A description will be given of the operation of each block.

The Input Stream Splitter splits the input TS, IP, GS streams into multiple service or service component (audio, video, etc.) streams. The mode adaptation module 2010 is comprised of a CRC Encoder, BB (baseband) Frame Slicer, and BB Frame Header Insertion block.

The CRC Encoder provides three kinds of CRC encoding for error detection at the user packet (UP) level, i.e., CRC-8, CRC-16, and CRC-32. The computed CRC bytes are appended after the UP. CRC-8 is used for TS stream and CRC-32 for IP stream. If the GS stream doesn't provide the CRC encoding, the proposed CRC encoding should be applied.

BB Frame Slicer maps the input into an internal logical-bit format. The first received bit is defined to be the MSB. The BB Frame Slicer allocates a number of input bits equal to the available data field capacity. To allocate a number of input bits equal to the BBF payload, the UP packet stream is sliced to fit the data field of BBF.

BB Frame Header Insertion block can insert fixed length BBF header of 2 bytes is inserted in front of the BB Frame. The BBF header is composed of STUFFI (1 bit), SYNCD (13 bits), and RFU (2 bits). In addition to the fixed 2-Byte BBF header, BBF can have an extension field (1 or 3 bytes) at the end of the 2-byte BBF header.

The stream adaptation 2010 is comprised of stuffing insertion block and BB scrambler.

The stuffing insertion block can insert stuffing field into a payload of a BB frame. If the input data to the stream adaptation is sufficient to fill a BB-Frame, STUFFI is set to '0' and the BBF has no stuffing field. Otherwise STUFFI is set to '1' and the stuffing field is inserted immediately after the BBF header. The stuffing field comprises two bytes of the stuffing field header and a variable size of stuffing data.

The BB scrambler scrambles complete BBF for energy dispersal. The scrambling sequence is synchronous with the BBF. The scrambling sequence is generated by the feedback shift register.

The PLS generation block 2020 can generate physical layer signaling (PLS) data. The PLS provides the receiver with a means to access physical layer DPs. The PLS data consists of PLS1 data and PLS2 data.

The PLS1 data is a first set of PLS data carried in the FSS symbols in the frame having a fixed size, coding and modulation, which carries basic information about the system as well as the parameters needed to decode the PLS2 data. The PLS1 data provides basic transmission parameters including parameters required to enable the reception and decoding of the PLS2 data. Also, the PLS1 data remains constant for the duration of a frame-group.

The PLS2 data is a second set of PLS data transmitted in the FSS symbol, which carries more detailed PLS data about the system and the DPs. The PLS2 contains parameters that provide sufficient information for the receiver to decode the desired DP. The PLS2 signaling further consists of two types of parameters, PLS2 Static data (PLS2-STAT data) and PLS2 dynamic data (PLS2-DYN data). The PLS2 Static data is PLS2 data that remains static for the duration of a frame-group and the PLS2 dynamic data is PLS2 data that may dynamically change frame-by-frame.

Details of the PLS data will be described later.

The PLS scrambler 2030 can scramble the generated PLS data for energy dispersal.

The above-described blocks may be omitted or replaced by blocks having similar or identical functions.

FIG. 3 illustrates an input formatting block according to another embodiment of the present invention.

The input formatting block illustrated in FIG. 3 corresponds to an embodiment of the input formatting block 1000 described with reference to FIG. 1.

FIG. 3 shows a mode adaptation block of the input formatting block when the input signal corresponds to multiple input streams.

The mode adaptation block of the input formatting block for processing the multiple input streams can independently process the multiple input streams.

Referring to FIG. 3, the mode adaptation block for respectively processing the multiple input streams can include an input stream splitter 3000, an input stream synchronizer 3010, a compensating delay block 3020, a null packet deletion block 3030, a head compression block 3040, a CRC encoder 3050, a BB frame slicer 3060 and a BB header insertion block 3070. Description will be given of each block of the mode adaptation block.

Operations of the CRC encoder 3050, BB frame slicer 3060 and BB header insertion block 3070 correspond to those of the CRC encoder, BB frame slicer and BB header insertion block described with reference to FIG. 2 and thus description thereof is omitted.

The input stream splitter 3000 can split the input TS, IP, GS streams into multiple service or service component (audio, video, etc.) streams.

The input stream synchronizer 3010 may be referred as ISSY. The ISSY can provide suitable means to guarantee Constant Bit Rate (CBR) and constant end-to-end transmission delay for any input data format. The ISSY is always used for the case of multiple DPs carrying TS, and optionally used for multiple DPs carrying GS streams.

The compensating delay block 3020 can delay the split TS packet stream following the insertion of ISSY information to allow a TS packet recombining mechanism without requiring additional memory in the receiver.

The null packet deletion block 3030, is used only for the TS input stream case. Some TS input streams or split TS streams may have a large number of null-packets present in order to accommodate VBR (variable bit-rate) services in a CBR TS stream. In this case, in order to avoid unnecessary transmission overhead, null-packets can be identified and not transmitted. In the receiver, removed null-packets can be re-inserted in the exact place where they were originally by reference to a deleted null-packet (DNP) counter that is inserted in the transmission, thus guaranteeing constant bit-rate and avoiding the need for time-stamp (PCR) updating.

The head compression block 3040 can provide packet header compression to increase transmission efficiency for TS or IP input streams. Because the receiver can have a priori information on certain parts of the header, this known information can be deleted in the transmitter.

For Transport Stream, the receiver has a-priori information about the sync-byte configuration (0x47) and the packet length (188 Byte). If the input TS stream carries content that has only one PID, i.e., for only one service component (video, audio, etc.) or service sub-component (SVC base layer, SVC enhancement layer, MVC base view or MVC dependent views), TS packet header compression can be applied (optionally) to the Transport Stream. IP packet header compression is used optionally if the input steam is an IP stream.

The above-described blocks may be omitted or replaced by blocks having similar or identical functions.

FIG. 4 illustrates an input formatting block according to another embodiment of the present invention.

The input formatting block illustrated in FIG. 4 corresponds to an embodiment of the input formatting block 1000 described with reference to FIG. 1.

FIG. 4 illustrates a stream adaptation block of the input formatting module when the input signal corresponds to multiple input streams.

Referring to FIG. 4, the mode adaptation block for respectively processing the multiple input streams can include a scheduler 4000, an 1-Frame delay block 4010, a stuffing insertion block 4020, an in-band signaling 4030, a BB Frame scrambler 4040, a PLS generation block 4050 and a PLS scrambler 4060. Description will be given of each block of the stream adaptation block.

Operations of the stuffing insertion block 4020, the BB Frame scrambler 4040, the PLS generation block 4050 and the PLS scrambler 4060 correspond to those of the stuffing insertion block, BB scrambler, PLS generation block and the PLS scrambler described with reference to FIG. 2 and thus description thereof is omitted.

The scheduler 4000 can determine the overall cell allocation across the entire frame from the amount of FECBLOCKs of each DP. Including the allocation for PLS, EAC and FIC, the scheduler generate the values of PLS2-DYN data, which is transmitted as in-band signaling or PLS cell in FSS of the frame. Details of FECBLOCK, EAC and FIC will be described later.

The 1-Frame delay block 4010 can delay the input data by one transmission frame such that scheduling information about the next frame can be transmitted through the current frame for in-band signaling information to be inserted into the DPs.

The in-band signaling 4030 can insert un-delayed part of the PLS2 data into a DP of a frame.

The above-described blocks may be omitted or replaced by blocks having similar or identical functions.

Figure 5:
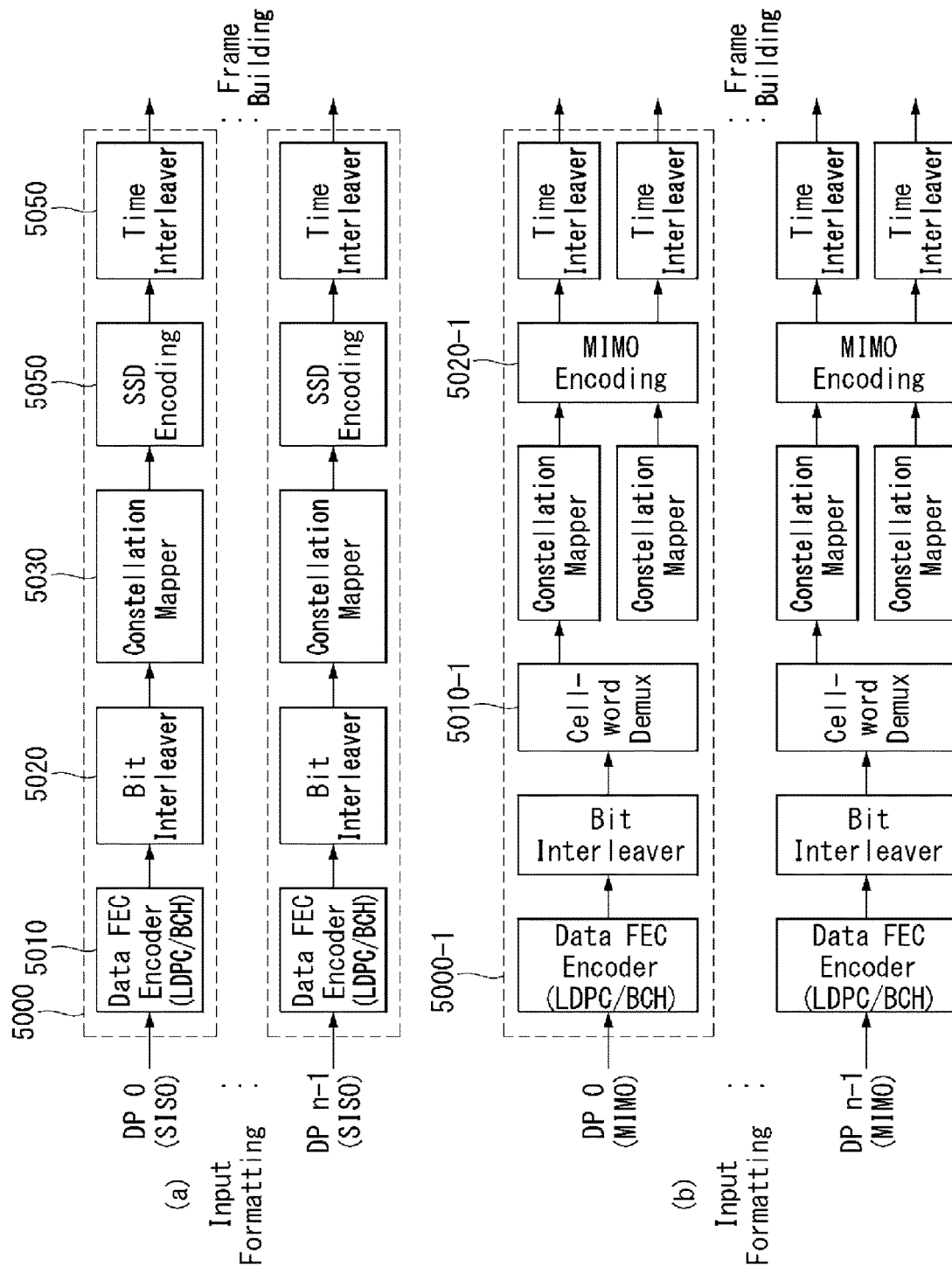
FIG. 5 illustrates a BICM block according to an embodiment of the present invention.

FIG. 5 illustrates a BICM block according to an embodiment of the present invention.

The BICM block illustrated in FIG. 5 corresponds to an embodiment of the BICM block 1010 described with reference to FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the a BICM block according to an embodiment of the present invention can independently process DPs input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each DP.

(a) shows the BICM block shared by the base profile and the handheld profile and (b) shows the BICM block of the advanced profile.

The BICM block shared by the base profile and the handheld profile and the BICM block of the advanced profile can include plural processing blocks for processing each DP.

A description will be given of each processing block of the BICM block for the base profile and the handheld profile and the BICM block for the advanced profile.

A processing block 5000 of the BICM block for the base profile and the handheld profile can include a Data FEC encoder 5010, a bit interleaver 5020, a constellation mapper 5030, an SSD (Signal Space Diversity) encoding block 5040 and a time interleaver 5050.

The Data FEC encoder 5010 can perform the FEC encoding on the input BBF to generate FECBLOCK procedure using outer coding (BCH), and inner coding (LDPC). The outer coding (BCH) is optional coding method. Details of operations of the Data FEC encoder 5010 will be described later.

The bit interleaver 5020 can interleave outputs of the Data FEC encoder 5010 to achieve optimized performance with combination of the LDPC codes and modulation scheme while providing an efficiently implementable structure. Details of operations of the bit interleaver 5020 will be described later.

The constellation mapper 5030 can modulate each cell word from the bit interleaver 5020 in the base and the handheld profiles, or cell word from the Cell-word demultiplexer 5010-1 in the advanced profile using either QPSK, QAM-16, non-uniform QAM (NUQ-64, NUQ-256, NUQ-1024) or non-uniform constellation (NUC-16, NUC-64, NUC-256, NUC-1024) to give a power-normalized constellation point, el. This constellation mapping is applied only for DPs. Observe that QAM-16 and NUQs are square shaped, while NUCs have arbitrary shape. When each constellation is rotated by any multiple of 90 degrees, the rotated constellation exactly overlaps with its original one. This "rotation-sense" symmetric property makes the capacities and the average powers of the real and imaginary components equal to each other. Both NUQs and NUCs are defined specifically for each code rate and the particular one used is signaled by the parameter DP_MOD filed in PLS2 data.

The SSD encoding block 5040 can precode cells in two (2D), three (3D), and four (4D) dimensions to increase the reception robustness under difficult fading conditions.

The time interleaver 5050 can operates at the DP level. The parameters of time interleaving (TI) may be set differently for each DP. Details of operations of the time interleaver 5050 will be described later.

A processing block 5000-1 of the BICM block for the advanced profile can include the Data FEC encoder, bit interleaver, constellation mapper, and time interleaver. However, the processing block 5000-1 is distinguished from the processing block 5000 further includes a cell-word demultiplexer 5010-1 and a MIMO encoding block 5020-1.

Also, the operations of the Data FEC encoder, bit interleaver, constellation mapper, and time interleaver in the processing block 5000-1 correspond to those of the Data FEC encoder 5010, bit interleaver 5020, constellation mapper 5030, and time interleaver 5050 described and thus description thereof is omitted.

The cell-word demultiplexer 5010-1 is used for the DP of the advanced profile to divide the single cell-word stream into dual cell-word streams for MIMO processing. Details of operations of the cell-word demultiplexer 5010-1 will be described later.

The MIMO encoding block 5020-1 can processing the output of the cell-word demultiplexer 5010-1 using MIMO encoding scheme. The MIMO encoding scheme was optimized for broadcasting signal transmission. The MIMO technology is a promising way to get a capacity increase but it depends on channel characteristics. Especially for broadcasting, the strong LOS component of the channel or a difference in the received signal power between two antennas caused by different signal propagation characteristics makes it difficult to get capacity gain from MIMO. The proposed MIMO encoding scheme overcomes this problem using a rotation-based pre-coding and phase randomization of one of the MIMO output signals.

MIMO encoding is intended for a 2×2 MIMO system requiring at least two antennas at both the transmitter and the receiver. Two MIMO encoding modes are defined in this proposal; full-rate spatial multiplexing (FR-SM) and full-rate full-diversity spatial multiplexing (FRFD-SM). The FR-SM encoding provides capacity increase with relatively small complexity increase at the receiver side while the FRFD-SM encoding provides capacity increase and additional diversity gain with a great complexity increase at the receiver side. The proposed MIMO encoding scheme has no restriction on the antenna polarity configuration.

MIMO processing is required for the advanced profile frame, which means all DPs in the advanced profile frame are processed by the MIMO encoder. MIMO processing is applied at DP level. Pairs of the Constellation Mapper outputs NUQ (e1,i and e2,i) are fed to the input of the MIMO Encoder. Paired MIMO Encoder output (g1,i and g2,i) is transmitted by the same carrier k and OFDM symbol l of their respective TX antennas.

The above-described blocks may be omitted or replaced by blocks having similar or identical functions.

Figure 6:
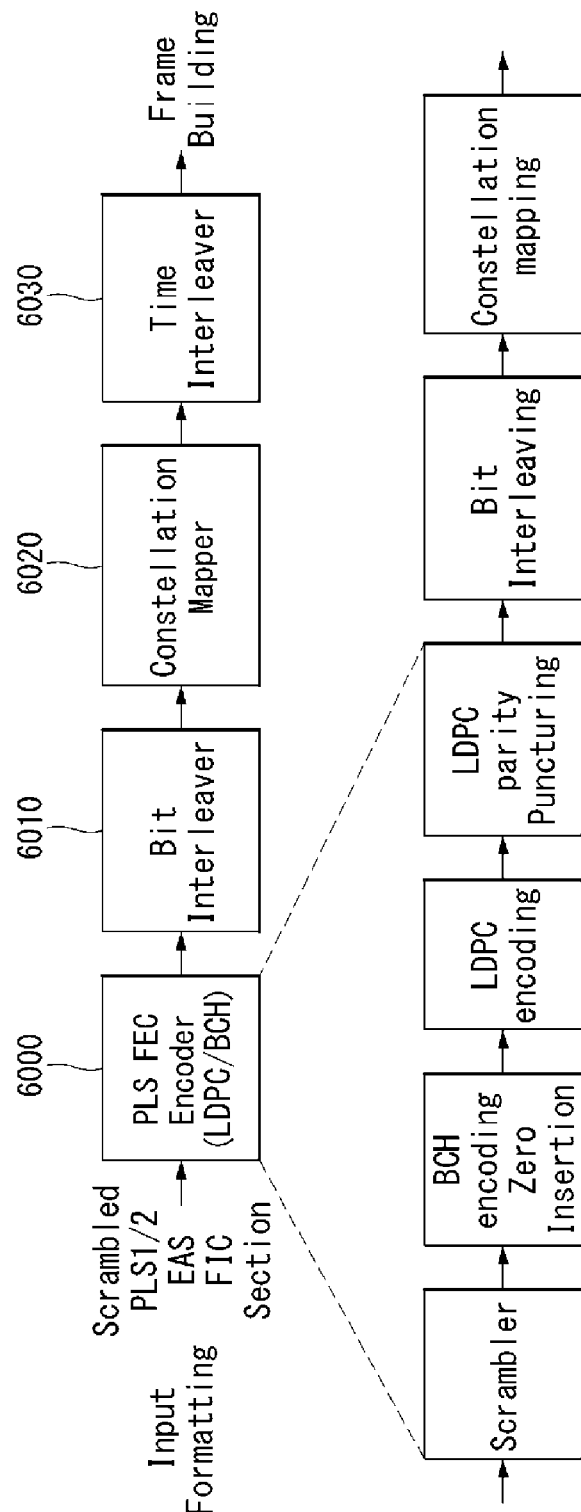
FIG. 6 illustrates a BICM block according to another embodiment of the present invention.

FIG. 6 illustrates a BICM block according to another embodiment of the present invention.

The BICM block illustrated in FIG. 6 corresponds to an embodiment of the BICM block 1010 described with reference to FIG. 1.

FIG. 6 illustrates a BICM block for protection of physical layer signaling (PLS), emergency alert channel (EAC) and fast information channel (FIC). EAC is a part of a frame that carries EAS information data and FIC is a logical channel in a frame that carries the mapping information between a service and the corresponding base DP. Details of the EAC and FIC will be described later.

Referring to FIG. 6, the BICM block for protection of PLS, EAC and FIC can include a PLS FEC encoder 6000, a bit interleaver 6010, a constellation mapper 6020 and time interleaver 6030.

Also, the PLS FEC encoder 6000 can include a scrambler, BCH encoding/zero insertion block, LDPC encoding block and LDPC parity puncturing block. Description will be given of each block of the BICM block.

The PLS FEC encoder 6000 can encode the scrambled PLS 1/2 data, EAC and FIC section.

The scrambler can scramble PLS1 data and PLS2 data before BCH encoding and shortened and punctured LDPC encoding.

The BCH encoding/zero insertion block can perform outer encoding on the scrambled PLS 1/2 data using the shortened BCH code for PLS protection and insert zero bits after the BCH encoding. For PLS1 data only, the output bits of the zero insertion may be permutted before LDPC encoding.

The LDPC encoding block can encode the output of the BCH encoding/zero insertion block using LDPC code. To generate a complete coded block, Cldpc, parity bits, Pldpc are encoded systematically from each zero-inserted PLS information block, Ildpc and appended after it.

$$C_{ldpc}=[I_{ldpc}\ P_{ldpc}]=[i_0,i_1,\ldots,i_{K_{ldpc}-1},p_0,p_1,\ldots,p_{N_{ldpc}-K_{ldpc}-1}]$$ [Equation 1]

The LDPC code parameters for PLS1 and PLS2 are as following table 4.

TABLE 4

| Signaling Type | Ksig | Kbch | Nbch_parity | Kldpc (=Nbch) | Nldpc | Nldpc_parity | code rate | Qldpc |
|---|---|---|---|---|---|---|---|---|
| PLS1 | 342 | 1020 | 60 | 1080 | 4320 | 3240 | 1/4 | 36 |
| PLS2 | <1021 >1020 | 2100 | | 2160 | 7200 | 5040 | 3/10 | 56 |

The LDPC parity puncturing block can perform puncturing on the PLS1 data and PLS 2 data.

When shortening is applied to the PLS1 data protection, some LDPC parity bits are punctured after LDPC encoding. Also, for the PLS2 data protection, the LDPC parity bits of PLS2 are punctured after LDPC encoding. These punctured bits are not transmitted.

The bit interleaver 6010 can interleave the each shortened and punctured PLS1 data and PLS2 data.

The constellation mapper 6020 can map the bit interleaved PLS1 data and PLS2 data onto constellations.

The time interleaver 6030 can interleave the mapped PLS1 data and PLS2 data.

The above-described blocks may be omitted or replaced by blocks having similar or identical functions.

Figure 7:
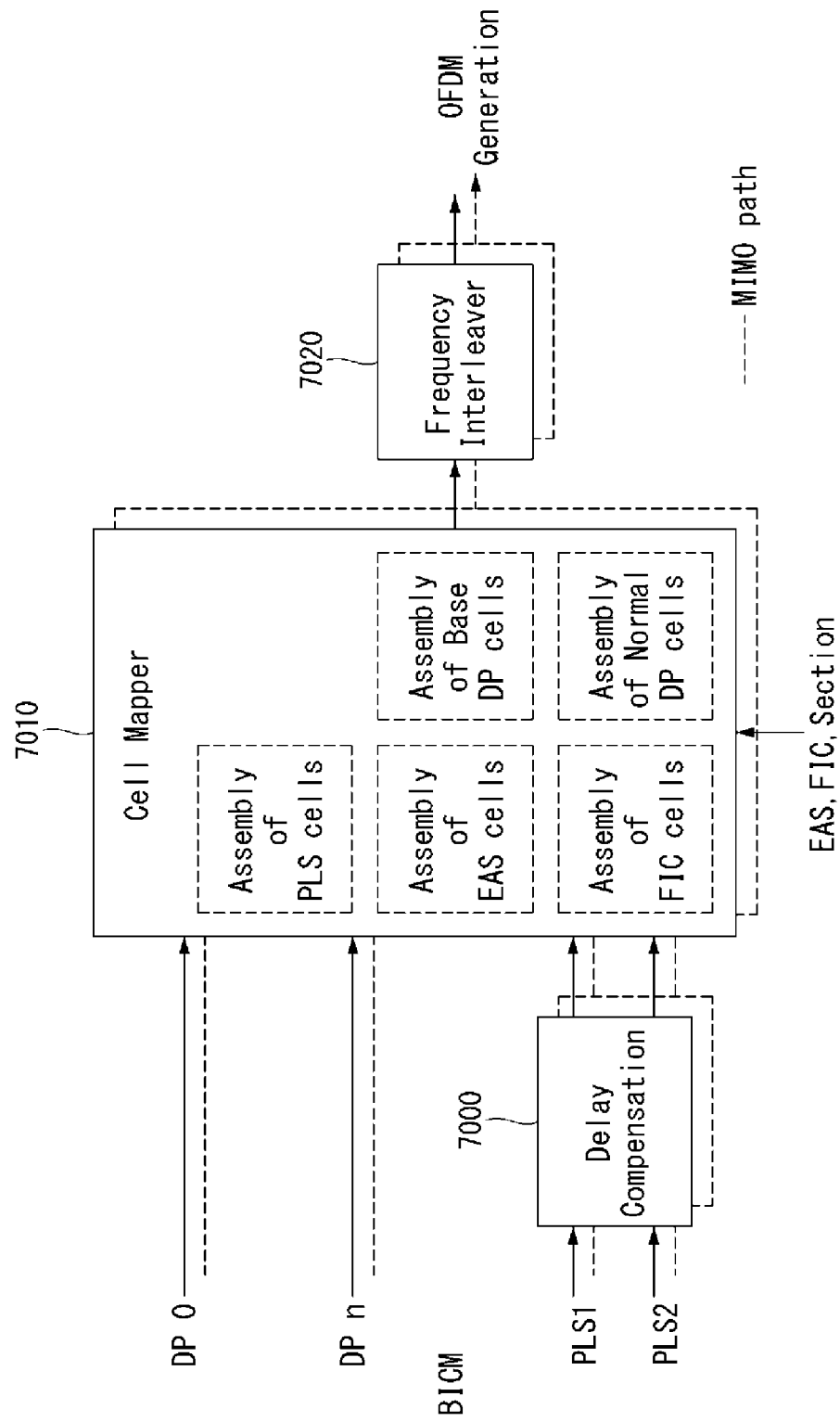
FIG. 7 illustrates a frame building block according to one embodiment of the present invention.

FIG. 7 illustrates a frame building block according to one embodiment of the present invention.

The frame building block illustrated in FIG. 7 corresponds to an embodiment of the frame building block 1020 described with reference to FIG. 1.

Referring to FIG. 7, the frame building block can include a delay compensation block 7000, a cell mapper 7010 and a frequency interleaver 7020. Description will be given of each block of the frame building block.

The delay compensation block 7000 can adjust the timing between the data pipes and the corresponding PLS data to ensure that they are co-timed at the transmitter end. The PLS data is delayed by the same amount as data pipes are by addressing the delays of data pipes caused by the Input Formatting block and BICM block. The delay of the BICM block is mainly due to the time interleaver 5050. In-band signaling data carries information of the next TI group so that they are carried one frame ahead of the DPs to be signaled. The Delay Compensating block delays in-band signaling data accordingly.

The cell mapper 7010 can map PLS, EAC, FIC, DPs, auxiliary streams and dummy cells into the active carriers of the OFDM symbols in the frame. The basic function of the cell mapper 7010 is to map data cells produced by the TIs for each of the DPs, PLS cells, and EAC/FIC cells, if any, into arrays of active OFDM cells corresponding to each of the OFDM symbols within a frame. Service signaling data (such as PSI(program specific information)/SI) can be separately gathered and sent by a data pipe. The Cell Mapper operates according to the dynamic information produced by the scheduler and the configuration of the frame structure. Details of the frame will be described later.

The frequency interleaver 7020 can randomly interleave data cells received from the cell mapper 7010 to provide frequency diversity. Also, the frequency interleaver 7020 can operate on very OFDM symbol pair comprised of two sequential OFDM symbols using a different interleaving-seed order to get maximum interleaving gain in a single frame. Details of operations of the frequency interleaver 7020 will be described later.

The above-described blocks may be omitted or replaced by blocks having similar or identical functions.

Figure 8:
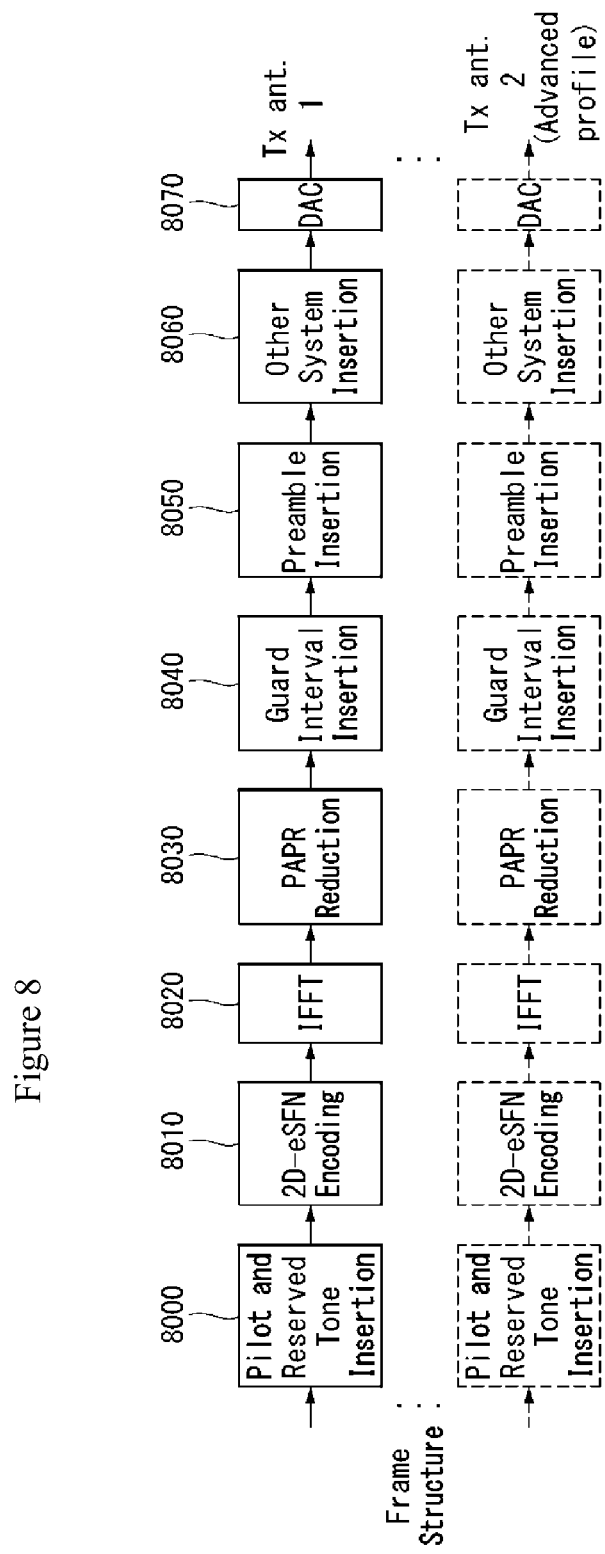
FIG. 8 illustrates an OFDM generation block according to an embodiment of the present invention.

FIG. 8 illustrates an OFMD generation block according to an embodiment of the present invention.

The OFMD generation block illustrated in FIG. 8 corresponds to an embodiment of the OFMD generation block 1030 described with reference to FIG. 1.

The OFDM generation block modulates the OFDM carriers by the cells produced by the Frame Building block, inserts the pilots, and produces the time domain signal for transmission. Also, this block subsequently inserts guard intervals, and applies PAPR (Peak-to-Average Power Radio) reduction processing to produce the final RF signal.

Referring to FIG. 8, the frame building block can include a pilot and reserved tone insertion block 8000, a 2D-eSFN encoding block 8010, an IFFT (Inverse Fast Fourier Transform) block 8020, a PAPR reduction block 8030, a guard interval insertion block 8040, a preamble insertion block 8050, other system insertion block 8060 and a DAC block 8070. Description will be given of each block of the frame building block.

The pilot and reserved tone insertion block 8000 can insert pilots and the reserved tone.

Various cells within the OFDM symbol are modulated with reference information, known as pilots, which have transmitted values known a priori in the receiver. The information of pilot cells is made up of scattered pilots(SP), continual pilots(CP), edge pilots(EP), FSS (frame signaling symbol) pilots and FES (frame edge symbol) pilots. Each pilot is transmitted at a particular boosted power level according to pilot type and pilot pattern. The value of the pilot information is derived from a reference sequence, which is a series of values, one for each transmitted carrier on any given symbol. The pilots can be used for frame synchronization, frequency synchronization, time synchronization, channel estimation, and transmission mode identification, and also can be used to follow the phase noise.

Reference information, taken from the reference sequence, is transmitted in scattered pilot cells in every symbol except the preamble, FSS and FES of the frame. Continual pilots are inserted in every symbol of the frame. The number and location of continual pilots depends on both the FFT size and the scattered pilot pattern. The edge carriers are edge pilots in every symbol except for the preamble symbol. They are inserted in order to allow frequency interpolation up to the edge of the spectrum. FSS pilots are inserted in FSS(s) and FES pilots are inserted in FES. They are inserted in order to allow time interpolation up to the edge of the frame.

The system according to an embodiment of the present invention supports the SFN network, where distributed MISO scheme is optionally used to support very robust transmission mode. The 2D-eSFN is a distributed MISO scheme that uses multiple TX antennas, each of which is located in the different transmitter site in the SFN network.

The 2D-eSFN encoding block 8010 can process a 2D-eSFN processing to distorts the phase of the signals transmitted from multiple transmitters, in order to create both time and frequency diversity in the SFN configuration. Hence, burst errors due to low flat fading or deep-fading for a long time can be mitigated.

The IFFT block 8020 can modulate the output from the 2D-eSFN encoding block 8010 using OFDM modulation scheme. Any cell in the data symbols which has not been designated as a pilot (or as a reserved tone) carries one of the data cells from the frequency interleaver. The cells are mapped to OFDM carriers.

The PAPR reduction block 8030 can perform a PAPR reduction on input signal using various PAPR reduction algorithm in the time domain.

The guard interval insertion block 8040 can insert guard intervals and the preamble insertion block 8050 can insert preamble in front of the signal. Details of a structure of the preamble will be described later. The other system insertion block 8060 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services.

The different broadcast services may refer to a terrestrial broadcast service, mobile broadcast service, etc. Data related to respective broadcast services can be transmitted through different frames.

The DAC block 8070 can convert an input digital signal into an analog signal and output the analog signal. The signal output from the DAC block 8070 can be transmitted through multiple output antennas according to the physical layer profiles. A Tx antenna according to an embodiment of the present invention can have vertical or horizontal polarity.

The above-described blocks may be omitted or replaced by blocks having similar or identical functions according to design.

Figure 9:
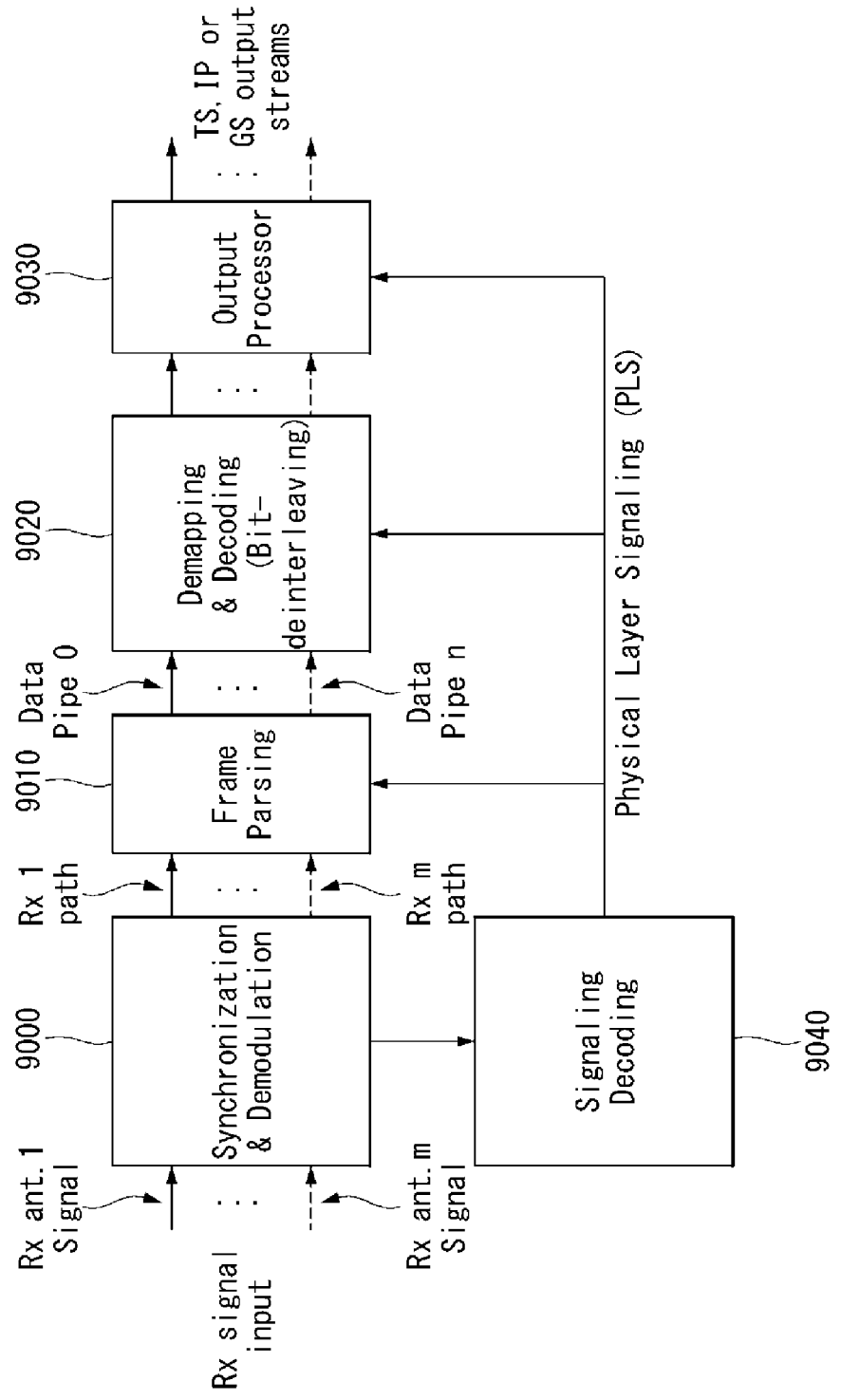
FIG. 9 illustrates a structure of an apparatus for receiving broadcast signals for future broadcast services according to an embodiment of the present invention.

FIG. 9 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1.

The apparatus for receiving broadcast signals for future broadcast services according to an embodiment of the present invention can include a synchronization & demodulation module 9000, a frame parsing module 9010, a demapping & decoding module 9020, an output processor 9030 and a signaling decoding module 9040. A description will be given of operation of each module of the apparatus for receiving broadcast signals.

The synchronization & demodulation module 9000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 9010 can parse input signal frames and extract data through which a service selected by a user is transmitted. If the apparatus for transmitting broadcast signals performs interleaving, the frame parsing module 9010 can carry out deinterleaving corresponding to a reverse procedure of interleaving. In this case, the positions of a signal and data that need to be extracted can be obtained by decoding data output from the signaling decoding module 9400 to restore scheduling information generated by the apparatus for transmitting broadcast signals.

The demapping & decoding module 9020 can convert the input signals into bit domain data and then deinterleave the same as necessary. The demapping & decoding module 9200 can perform demapping for mapping applied for transmission efficiency and correct an error generated on a transmission channel through decoding. In this case, the demapping & decoding module 9020 can obtain transmission parameters necessary for demapping and decoding by decoding the data output from the signaling decoding module 9040.

The output processor 9030 can perform reverse procedures of various compression/signal processing procedures which are applied by the apparatus for transmitting broadcast signals to improve transmission efficiency. In this case, the output processor 9030 can acquire necessary control information from data output from the signaling decoding module 9040. The output of the output processor 9030 corresponds to a signal input to the apparatus for transmitting broadcast signals and may be MPEG-TSs, IP streams (v4 or v6) and generic streams.

The signaling decoding module 9040 can obtain PLS information from the signal demodulated by the synchronization & demodulation module 9000. As described above, the frame parsing module 9010, demapping & decoding module 9020 and output processor 9030 can execute functions thereof using the data output from the signaling decoding module 9040.

Figure 10:
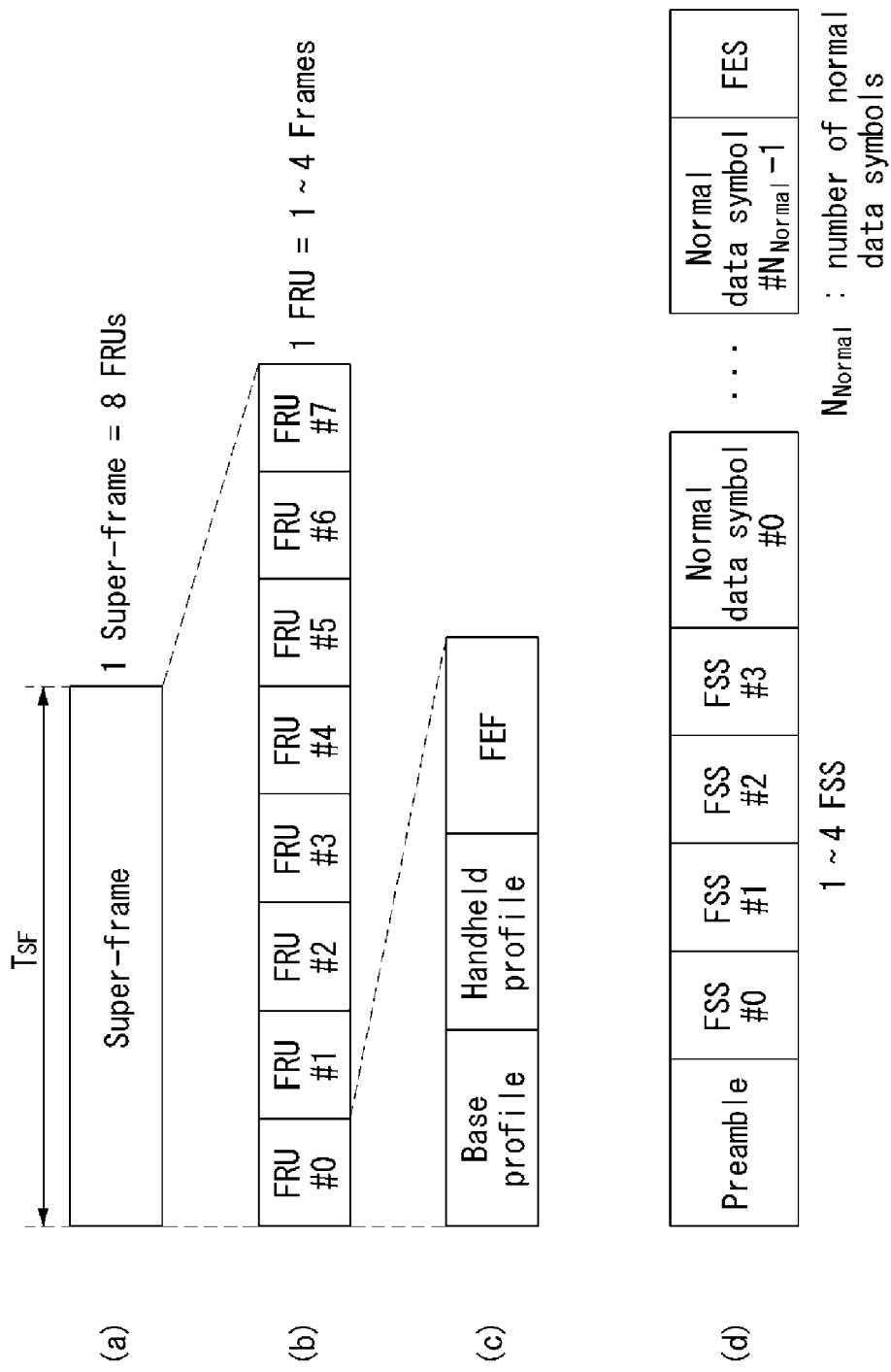
FIG. 10 illustrates a frame structure according to an embodiment of the present invention.

FIG. 10 illustrates a frame structure according to an embodiment of the present invention.

FIG. 10 shows an example configuration of the frame types and FRUs in a super-frame. (a) shows a super frame according to an embodiment of the present invention, (b) shows FRU (Frame Repetition Unit) according to an embodiment of the present invention, (c) shows frames of variable PHY profiles in the FRU and (d) shows a structure of a frame.

A super-frame may be composed of eight FRUs. The FRU is a basic multiplexing unit for TDM of the frames, and is repeated eight times in a super-frame.

Each frame in the FRU belongs to one of the PHY profiles, (base, handheld, advanced) or FEF. The maximum allowed number of the frames in the FRU is four and a given PHY profile can appear any number of times from zero times to four times in the FRU (e.g., base, base, handheld, advanced). PHY profile definitions can be extended using reserved values of the PHY_PROFILE in the preamble, if required.

The FEF part is inserted at the end of the FRU, if included. When the FEF is included in the FRU, the minimum number of FEFs is 8 in a super-frame. It is not recommended that FEF parts be adjacent to each other.

One frame is further divided into a number of OFDM symbols and a preamble. As shown in (d), the frame comprises a preamble, one or more frame signaling symbols (FSS), normal data symbols and a frame edge symbol (FES).

The preamble is a special symbol that enables fast Futurecast UTB system signal detection and provides a set of basic transmission parameters for efficient transmission and reception of the signal. The detailed description of the preamble will be will be described later.

The main purpose of the FSS(s) is to carry the PLS data. For fast synchronization and channel estimation, and hence fast decoding of PLS data, the FSS has more dense pilot pattern than the normal data symbol. The FES has exactly the same pilots as the FSS, which enables frequency-only interpolation within the FES and temporal interpolation, without extrapolation, for symbols immediately preceding the FES.

FIG. 11 illustrates a signaling hierarchy structure of the frame according to an embodiment of the present invention.

FIG. 11 illustrates the signaling hierarchy structure, which is split into three main parts: the preamble signaling data 11000, the PLS1 data 11010 and the PLS2 data 11020. The purpose of the preamble, which is carried by the preamble symbol in every frame, is to indicate the transmission type and basic transmission parameters of that frame. The PLS1 enables the receiver to access and decode the PLS2 data, which contains the parameters to access the DP of interest. The PLS2 is carried in every frame and split into two main parts: PLS2-STAT data and PLS2-DYN data. The static and dynamic portion of PLS2 data is followed by padding, if necessary.

FIG. 12 illustrates preamble signaling data according to an embodiment of the present invention.

Preamble signaling data carries 21 bits of information that are needed to enable the receiver to access PLS data and trace DPs within the frame structure. Details of the preamble signaling data are as follows:

PHY_PROFILE: This 3-bit field indicates the PHY profile type of the current frame. The mapping of different PHY profile types is given in below table 5.

TABLE 5

| Value | PHY profile |
|---|---|
| 000 | Base profile |
| 001 | Handheld profile |
| 010 | Advanced profiled |

TABLE 5-continued

| Value | PHY profile |
|---|---|
| 011~110 | Reserved |
| 111 | FEF |

FFT_SIZE: This 2 bit field indicates the FFT size of the current frame within a frame-group, as described in below table 6.

TABLE 6

| Value | FFT size |
|---|---|
| 00 | 8K FFT |
| 01 | 16K FFT |
| 10 | 32K FFT |
| 11 | Reserved |

GI_FRACTION: This 3 bit field indicates the guard interval fraction value in the current super-frame, as described in below table 7.

TABLE 7

| Value | GI_FRACTION |
|---|---|
| 000 | 1/5 |
| 001 | 1/10 |
| 010 | 1/20 |
| 011 | 1/40 |
| 100 | 1/80 |
| 101 | 1/160 |
| 110~111 | Reserved |

EAC_FLAG: This 1 bit field indicates whether the EAC is provided in the current frame. If this field is set to '1', emergency alert service (EAS) is provided in the current frame. If this field set to '0', EAS is not carried in the current frame. This field can be switched dynamically within a super-frame.

PILOT_MODE: This 1-bit field indicates whether the pilot mode is mobile mode or fixed mode for the current frame in the current frame-group. If this field is set to '0', mobile pilot mode is used. If the field is set to '1', the fixed pilot mode is used.

PAPR_FLAG: This 1-bit field indicates whether PAPR reduction is used for the current frame in the current frame-group. If this field is set to value '1', tone reservation is used for PAPR reduction. If this field is set to '0', PAPR reduction is not used.

FRU_CONFIGURE: This 3-bit field indicates the PHY profile type configurations of the frame repetition units (FRU) that are present in the current super-frame. All profile types conveyed in the current super-frame are identified in this field in all preambles in the current super-frame. The 3-bit field has a different definition for each profile, as show in below table 8.

TABLE 8

| | Current PHY_PROFILE = '000' (base) | Current PHY_PROFILE = '001' (handheld) | Current PHY_PROFILE = '010' (advanced) | Current PHY_PROFILE = '111' (FEF) |
|---|---|---|---|---|
| FRU_CONFIGURE = 000 | Only base profile present | Only handheld profile present | Only advanced profile present | Only FEF present |
| FRU_CONFIGURE = 1XX | Handheld profile present | Base profile present | Base profile present | Base profile present |
| FRU_CONFIGURE = X1X | Advanced profile present | Advanced profile present | Handheld profile present | Handheld profile present |
| FRU_CONFIGURE = XX1 | FEF present | FEF present | FEF present | Advanced profile present |

RESERVED: This 7-bit field is reserved for future use.

Figure 13:
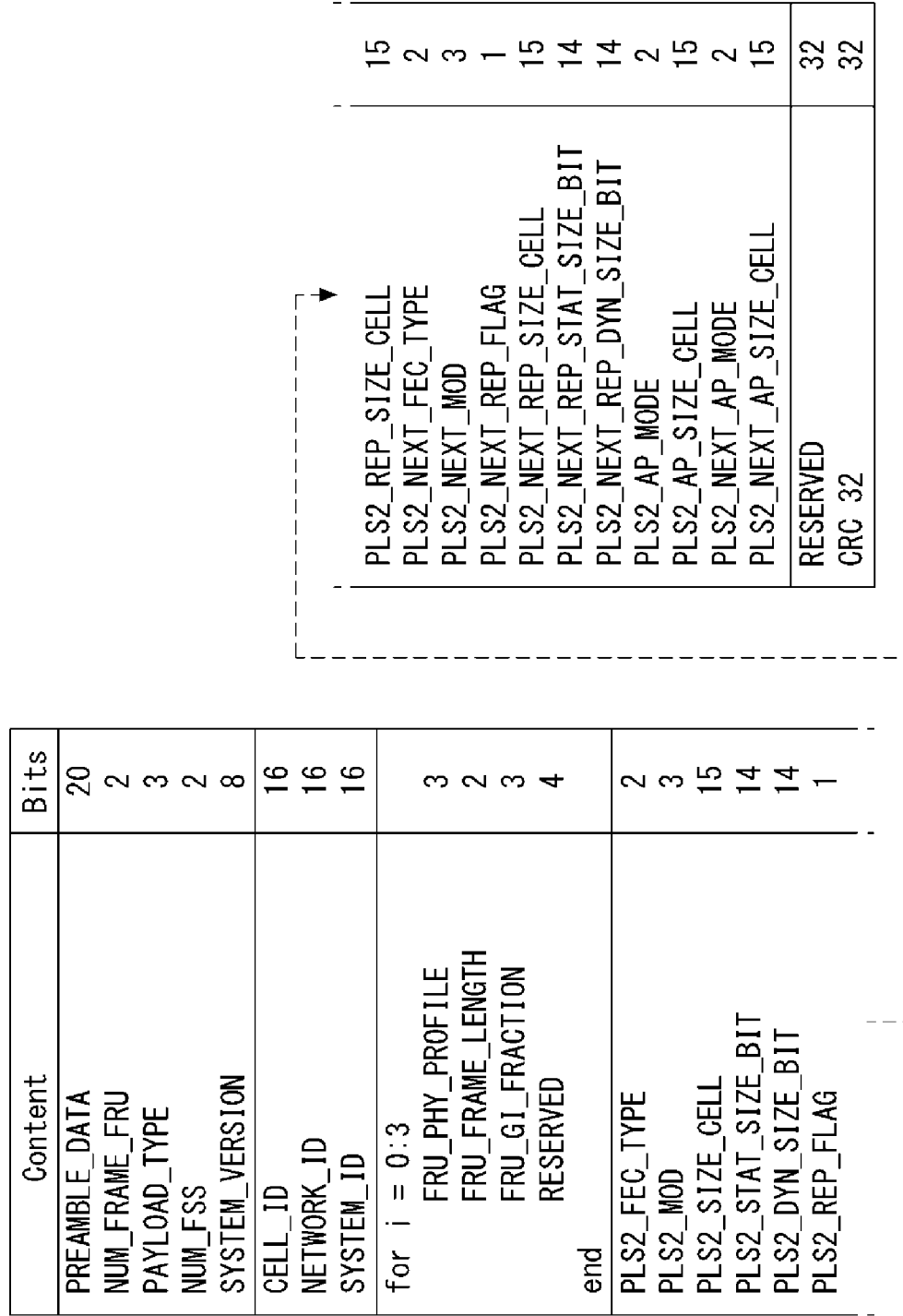
FIG. 13 illustrates PLS1 data according to an embodiment of the present invention.

FIG. 13 illustrates PLS1 data according to an embodiment of the present invention.

PLS1 data provides basic transmission parameters including parameters required to enable the reception and decoding of the PLS2. As above mentioned, the PLS1 data remain unchanged for the entire duration of one frame-group. The detailed definition of the signaling fields of the PLS1 data are as follows:

PREAMBLE_DATA: This 20-bit field is a copy of the preamble signaling data excluding the EAC_FLAG.

NUM_FRAME_FRU: This 2-bit field indicates the number of the frames per FRU.

PAYLOAD_TYPE: This 3-bit field indicates the format of the payload data carried in the frame-group. PAYLOAD_TYPE is signaled as shown in table 9.

TABLE 9

| Value | Payload type |
|---|---|
| 1XX | TS stream is transmitted |
| X1X | IP stream is transmitted |
| XX1 | GS stream is transmitted |

NUM_FSS: This 2-bit field indicates the number of FSS symbols in the current frame.

SYSTEM_VERSION: This 8-bit field indicates the version of the transmitted signal format. The SYSTEM_VERSION is divided into two 4-bit fields, which are a major version and a minor version.

Major version: The MSB four bits of SYSTEM_VERSION field indicate major version information. A change in the major version field indicates a non-backward-compatible change. The default value is '0000'. For the version described in this standard, the value is set to '0000'.

Minor version: The LSB four bits of SYSTEM_VERSION field indicate minor version information. A charge in the minor version field is backward-compatible.

CELL_ID: This is a 16-bit field which uniquely identifies a geographic cell in an ATSC network. An ATSC cell coverage area may consist of one or more frequencies, depending on the number of frequencies used per Futurecast UTB system. If the value of the CELL_ID is not known or unspecified, this field is set to '0'.

NETWORK_ID: This is a 16-bit field which uniquely identifies the current ATSC network.

SYSTEM_ID: This 16-bit field uniquely identifies the Futurecast UTB system within the ATSC network. The Futurecast UTB system is the terrestrial broadcast system whose input is one or more input streams (TS, IP, GS) and whose output is an RF signal. The Futurecast UTB system carries one or more PHY profiles and FEF, if any. The same Futurecast UTB system may carry different input streams and use different RF frequencies in different geographical areas, allowing local service insertion. The frame structure and scheduling is controlled in one place and is identical for all transmissions within a Futurecast UTB system. One or more Futurecast UTB systems may have the same SYSTEM_ID meaning that they all have the same physical layer structure and configuration.

The following loop consists of FRU_PHY_PROFILE, FRU_FRAME_LENGTH, FRU_GI_FRACTION, and RESERVED which are used to indicate the FRU configuration and the length of each frame type. The loop size is fixed so that four PHY profiles (including a FEF) are signaled within the FRU. If NUM_FRAME_FRU is less than 4, the unused fields are filled with zeros.

FRU_PHY_PROFILE: This 3-bit field indicates the PHY profile type of the (i+1)th (i is the loop index) frame of the associated FRU. This field uses the same signaling format as shown in the table 8.

FRU_FRAME_LENGTH: This 2-bit field indicates the length of the (i+1)th frame of the associated FRU. Using FRU_FRAME_LENGTH together with FRU_GI_FRACTION, the exact value of the frame duration can be obtained.

FRU_GI_FRACTION: This 3-bit field indicates the guard interval fraction value of the (i+1)th frame of the associated FRU. FRU_GI_FRACTION is signaled according to the table 7.

RESERVED: This 4-bit field is reserved for future use.

The following fields provide parameters for decoding the PLS2 data.

PLS2_FEC_TYPE: This 2-bit field indicates the FEC type used by the PLS2 protection. The FEC type is signaled according to table 10. The details of the LDPC codes will be described later.

TABLE 10

| Contents | PLS2 FEC type |
| --- | --- |
| 00 | 4K-1/4 and 7K-3/10 LDPC codes |
| 01~11 | Reserved |

PLS2_MOD: This 3-bit field indicates the modulation type used by the PLS2. The modulation type is signaled according to table 11.

TABLE 11

| Value | PLS2_MODE |
| --- | --- |
| 000 | BPSK |
| 001 | QPSK |
| 010 | QAM-16 |
| 011 | NUQ-64 |
| 100~111 | Reserved |

PLS2_SIZE_CELL: This 15-bit field indicates Ctotal_partial_block, the size (specified as the number of QAM cells) of the collection of full coded blocks for PLS2 that is carried in the current frame-group. This value is constant during the entire duration of the current frame-group.

PLS2_STAT_SIZE_BIT: This 14-bit field indicates the size, in bits, of the PLS2-STAT for the current frame-group. This value is constant during the entire duration of the current frame-group.

PLS2_DYN_SIZE_BIT: This 14-bit field indicates the size, in bits, of the PLS2-DYN for the current frame-group. This value is constant during the entire duration of the current frame-group.

PLS2_REP_FLAG: This 1-bit flag indicates whether the PLS2 repetition mode is used in the current frame-group. When this field is set to value '1', the PLS2 repetition mode is activated. When this field is set to value '0', the PLS2 repetition mode is deactivated.

PLS2_REP_SIZE_CELL: This 15-bit field indicates Ctotal_partial_block, the size (specified as the number of QAM cells) of the collection of partial coded blocks for PLS2 carried in every frame of the current frame-group, when PLS2 repetition is used. If repetition is not used, the value of this field is equal to 0. This value is constant during the entire duration of the current frame-group.

PLS2_NEXT_FEC_TYPE: This 2-bit field indicates the FEC type used for PLS2 that is carried in every frame of the next frame-group. The FEC type is signaled according to the table 10.

PLS2_NEXT_MOD: This 3-bit field indicates the modulation type used for PLS2 that is carried in every frame of the next frame-group. The modulation type is signaled according to the table 11.

PLS2_NEXT_REP_FLAG: This 1-bit flag indicates whether the PLS2 repetition mode is used in the next frame-group. When this field is set to value '1', the PLS2 repetition mode is activated. When this field is set to value '0', the PLS2 repetition mode is deactivated.

PLS2_NEXT_REP_SIZE_CELL: This 15-bit field indicates Ctotal_full_block, The size (specified as the number of QAM cells) of the collection of full coded blocks for PLS2 that is carried in every frame of the next frame-group, when PLS2 repetition is used. If repetition is not used in the next frame-group, the value of this field is equal to 0. This value is constant during the entire duration of the current frame-group.

PLS2_NEXT_REP_STAT_SIZE_BIT: This 14-bit field indicates the size, in bits, of the PLS2-STAT for the next frame-group. This value is constant in the current frame-group.

PLS2_NEXT_REP_DYN_SIZE_BIT: This 14-bit field indicates the size, in bits, of the PLS2-DYN for the next frame-group. This value is constant in the current frame-group.

PLS2_AP_MODE: This 2-bit field indicates whether additional parity is provided for PLS2 in the current frame-group. This value is constant during the entire duration of the current frame-group. The below table 12 gives the values of this field. When this field is set to '00', additional parity is not used for the PLS2 in the current frame-group.

TABLE 12

| Value | PLS2-AP mode |
|---|---|
| 00 | AP is not provided |
| 01 | AP1 mode |
| 10~11 | Reserved |

PLS2_AP_SIZE_CELL: This 15-bit field indicates the size (specified as the number of QAM cells) of the additional parity bits of the PLS2. This value is constant during the entire duration of the current frame-group.

PLS2_NEXT_AP_MODE: This 2-bit field indicates whether additional parity is provided for PLS2 signaling in every frame of next frame-group. This value is constant during the entire duration of the current frame-group. The table 12 defines the values of this field PLS2_NEXT_AP_SIZE_CELL: This 15-bit field indicates the size (specified as the number of QAM cells) of the additional parity bits of the PLS2 in every frame of the next frame-group. This value is constant during the entire duration of the current frame-group.

RESERVED: This 32-bit field is reserved for future use.

CRC_32: A 32-bit error detection code, which is applied to the entire PLS1 signaling.

FIG. 14 illustrates PLS2 data according to an embodiment of the present invention.

FIG. 14 illustrates PLS2-STAT data of the PLS2 data. The PLS2-STAT data are the same within a frame-group, while the PLS2-DYN data provide information that is specific for the current frame.

The details of fields of the PLS2-STAT data are as follows:

FIC_FLAG: This 1-bit field indicates whether the FIC is used in the current frame-group. If this field is set to '1', the FIC is provided in the current frame. If this field set to '0', the FIC is not carried in the current frame. This value is constant during the entire duration of the current frame-group.

AUX_FLAG: This 1-bit field indicates whether the auxiliary stream(s) is used in the current frame-group. If this field is set to '1', the auxiliary stream is provided in the current frame. If this field set to '0', the auxiliary stream is not carried in the current frame. This value is constant during the entire duration of current frame-group.

NUM_DP: This 6-bit field indicates the number of DPs carried within the current frame. The value of this field ranges from 1 to 64, and the number of DPs is NUM_DP+1.

DP_ID: This 6-bit field identifies uniquely a DP within a PHY profile.

DP_TYPE: This 3-bit field indicates the type of the DP. This is signaled according to the below table 13.

TABLE 13

| Value | DP Type |
|---|---|
| 000 | DP Type 1 |
| 001 | DP Type 2 |
| 010~111 | reserved |

DP_GROUP_ID: This 8-bit field identifies the DP group with which the current DP is associated. This can be used by a receiver to access the DPs of the service components associated with a particular service, which will have the same DP_GROUP_ID.

BASE_DP_ID: This 6-bit field indicates the DP carrying service signaling data (such as PSI/SI) used in the Management layer. The DP indicated by BASE_DP_ID may be either a normal DP carrying the service signaling data along with the service data or a dedicated DP carrying only the service signaling data DP_FEC_TYPE: This 2-bit field indicates the FEC type used by the associated DP. The FEC type is signaled according to the below table 14.

TABLE 14

| Value | FEC_TYPE |
|---|---|
| 00 | 16K LDPC |
| 01 | 64K LDPC |
| 10~11 | Reserved |

DP_COD: This 4-bit field indicates the code rate used by the associated DP. The code rate is signaled according to the below table 15.

TABLE 15

| Value | Code rate |
|---|---|
| 0000 | 5/15 |
| 0001 | 6/15 |
| 0010 | 7/15 |
| 0011 | 8/15 |
| 0100 | 9/15 |
| 0101 | 10/15 |
| 0110 | 11/15 |
| 0111 | 12/15 |
| 1000 | 13/15 |
| 1001~1111 | Reserved |

DP_MOD: This 4-bit field indicates the modulation used by the associated DP. The modulation is signaled according to the below table 16.

TABLE 16

| Value | Modulation |
|---|---|
| 0000 | QPSK |
| 0001 | QAM-16 |
| 0010 | NUQ-64 |
| 0011 | NUQ-256 |
| 0100 | NUQ-1024 |
| 0101 | NUC-16 |
| 0110 | NUC-64 |
| 0111 | NUC-256 |
| 1000 | NUC-1024 |
| 1001~1111 | reserved |

DP_SSD_FLAG: This 1-bit field indicates whether the SSD mode is used in the associated DP. If this field is set to value '1', SSD is used. If this field is set to value '0', SSD is not used.

The following field appears only if PHY_PROFILE is equal to '010', which indicates the advanced profile:

DP_MIMO: This 3-bit field indicates which type of MIMO encoding process is applied to the associated DP. The type of MIMO encoding process is signaled according to the table 17.

TABLE 17

| Value | MIMO encoding |
|---|---|
| 000 | FR-SM |
| 001 | FRFD-SM |
| 010~111 | reserved |

DP_TI_TYPE: This 1-bit field indicates the type of time-interleaving. A value of '0' indicates that one TI group corresponds to one frame and contains one or more TI-blocks. A value of '1' indicates that one TI group is carried in more than one frame and contains only one TI-block.

DP_TI_LENGTH: The use of this 2-bit field (the allowed values are only 1, 2, 4, 8) is determined by the values set within the DP_TI_TYPE field as follows:

If the DP_TI_TYPE is set to the value '1', this field indicates PI, the number of the frames to which each TI group is mapped, and there is one TI-block per TI group (NTI=1). The allowed PI values with 2-bit field are defined in the below table 18.

If the DP_TI_TYPE is set to the value '0', this field indicates the number of TI-blocks NTI per TI group, and there is one TI group per frame (Pi=1). The allowed PI values with 2-bit field are defined in the below table 18.

TABLE 18

| 2-bit field | PI | NTI |
|---|---|---|
| 00 | 1 | 1 |
| 01 | 2 | 2 |
| 10 | 4 | 3 |
| 11 | 8 | 4 |

DP_FRAME_INTERVAL: This 2-bit field indicates the frame interval (IJUMP) within the frame-group for the associated DP and the allowed values are 1, 2, 4, 8 (the corresponding 2-bit field is '00', '01', '10', or '11', respectively). For DPs that do not appear every frame of the frame-group, the value of this field is equal to the interval between successive frames. For example, if a DP appears on the frames 1, 5, 9, 13, etc., this field is set to '4'. For DPs that appear in every frame, this field is set to '1'.

DP_TI_BYPASS: This 1-bit field determines the availability of time interleaver 5050. If time interleaving is not used for a DP, it is set to '1'. Whereas if time interleaving is used it is set to '0'.

DP_FIRST_FRAME_IDX: This 5-bit field indicates the index of the first frame of the super-frame in which the current DP occurs. The value of DP_FIRST_FRAME_IDX ranges from 0 to 31

DP_NUM_BLOCK_MAX: This 10-bit field indicates the maximum value of DP_NUM_BLOCKS for this DP. The value of this field has the same range as DP_NUM_BLOCKS.

DP_PAYLOAD_TYPE: This 2-bit field indicates the type of the payload data carried by the given DP. DP_PAYLOAD_TYPE is signaled according to the below table 19.

TABLE 19

| Value | Payload Type |
|---|---|
| 00 | TS. |
| 01 | IP |
| 10 | GS |
| 11 | reserved |

DP_INBAND_MODE: This 2-bit field indicates whether the current DP carries in-band signaling information. The in-band signaling type is signaled according to the below table 20.

TABLE 20

| Value | In-band mode |
|---|---|
| 00 | In-band signaling is not carried. |
| 01 | INBAND-PLS is carried only |
| 10 | INBAND-ISSY is carried only |
| 11 | INBAND-PLS and INBAND-ISSY are carried |

DP_PROTOCOL_TYPE: This 2-bit field indicates the protocol type of the payload carried by the given DP. It is signaled according to the below table 21 when input payload types are selected.

TABLE 21

| Value | If DP_PAYLOAD_TYPE Is TS | If DP_PAYLOAD_TYPE Is IP | If DP_PAYLOAD_TYPE Is GS |
|---|---|---|---|
| 00 | MPEG2-TS | IPv4 | (Note) |
| 01 | Reserved | IPv6 | Reserved |
| 10 | Reserved | Reserved | Reserved |
| 11 | Reserved | Reserved | Reserved |

DP_CRC_MODE: This 2-bit field indicates whether CRC encoding is used in the Input Formatting block. The CRC mode is signaled according to the below table 22.

TABLE 22

| Value | CRC mode |
|---|---|
| 00 | Not used |
| 01 | CRC-8 |
| 10 | CRC-16 |
| 11 | CRC-32 |

DNP_MODE: This 2-bit field indicates the null-packet deletion mode used by the associated DP when DP_PAYLOAD_TYPE is set to TS ('00'). DNP_MODE is signaled according to the below table 23. If DP_PAYLOAD_TYPE is not TS ('00'), DNP_MODE is set to the value '00'.

TABLE 23

| Value | Null-packet deletion mode |
|---|---|
| 00 | Not used |
| 01 | DNP-NORMAL |
| 10 | DNP-OFFSET |
| 11 | reserved |

ISSY_MODE: This 2-bit field indicates the ISSY mode used by the associated DP when DP_PAYLOAD_TYPE is set to TS ('00'). The ISSY_MODE is signaled according to the below table 24 If DP_PAYLOAD_TYPE is not TS ('00'), ISSY_MODE is set to the value '00'.

TABLE 24

| Value | ISSY mode |
|---|---|
| 00 | Not used |
| 01 | ISSY-UP |

TABLE 24-continued

| Value | ISSY mode |
|---|---|
| 10 | ISSY-BBF |
| 11 | reserved |

HC_MODE_TS: This 2-bit field indicates the TS header compression mode used by the associated DP when DP_PAYLOAD_TYPE is set to TS ('00'). The HC_MODE_TS is signaled according to the below table 25.

TABLE 25

| Value | Header compression mode |
|---|---|
| 00 | HC_MODE_TS 1 |
| 01 | HC_MODE_TS 2 |
| 10 | HC_MODE_TS 3 |
| 11 | HC_MODE_TS 4 |

HC_MODE_IP: This 2-bit field indicates the IP header compression mode when DP_PAYLOAD_TYPE is set to IP ('01'). The HC_MODE_IP is signaled according to the below table 26.

TABLE 26

| Value | Header compression mode |
|---|---|
| 00 | No compression |
| 01 | HC_MODE_IP 1 |
| 10-11 | reserved |

PID: This 13-bit field indicates the PID number for TS header compression when DP_PAYLOAD_TYPE is set to TS ('00') and HC_MODE_TS is set to '01' or '10'.

RESERVED: This 8-bit field is reserved for future use.

The following field appears only if FIC_FLAG is equal to '1':

FIC_VERSION: This 8-bit field indicates the version number of the FIC.

FIC_LENGTH_BYTE: This 13-bit field indicates the length, in bytes, of the FIC.

RESERVED: This 8-bit field is reserved for future use.

The following field appears only if AUX_FLAG is equal to '1':

NUM_AUX: This 4-bit field indicates the number of auxiliary streams. Zero means no auxiliary streams are used.

AUX_CONFIG_RFU: This 8-bit field is reserved for future use.

AUX_STREAM_TYPE: This 4-bit is reserved for future use for indicating the type of the current auxiliary stream.

AUX_PRIVATE_CONFIG: This 28-bit field is reserved for future use for signaling auxiliary streams.

FIG. 15 illustrates PLS2 data according to another embodiment of the present invention.

FIG. 15 illustrates PLS2-DYN data of the PLS2 data. The values of the PLS2-DYN data may change during the duration of one frame-group, while the size of fields remains constant.

The details of fields of the PLS2-DYN data are as follows:

FRAME_INDEX: This 5-bit field indicates the frame index of the current frame within the super-frame. The index of the first frame of the super-frame is set to '0'.

PLS_CHANGE_COUNTER: This 4-bit field indicates the number of super-frames ahead where the configuration will change. The next super-frame with changes in the configuration is indicated by the value signaled within this field. If this field is set to the value '0000', it means that no scheduled change is foreseen: e.g., value '1' indicates that there is a change in the next super-frame.

FIC_CHANGE_COUNTER: This 4-bit field indicates the number of super-frames ahead where the configuration (i.e., the contents of the FIC) will change. The next super-frame with changes in the configuration is indicated by the value signaled within this field. If this field is set to the value '0000', it means that no scheduled change is foreseen: e.g. value '0001' indicates that there is a change in the next super-frame.

RESERVED: This 16-bit field is reserved for future use.

The following fields appear in the loop over NUM_DP, which describe the parameters associated with the DP carried in the current frame.

DP_ID: This 6-bit field indicates uniquely the DP within a PHY profile.

DP_START: This 15-bit (or 13-bit) field indicates the start position of the first of the DPs using the DPU addressing scheme. The DP_START field has differing length according to the PHY profile and FFT size as shown in the below table 27.

TABLE 27

| | DP_START field size | |
|---|---|---|
| PHY profile | 64K | 16K |
| Base | 13 bits | 15 bits |
| Handheld | — | 13 bits |
| Advanced | 13 bits | 15 bits |

DP_NUM_BLOCK: This 10-bit field indicates the number of FEC blocks in the current TI group for the current DP. The value of DP_NUM_BLOCK ranges from 0 to 1023

RESERVED: This 8-bit field is reserved for future use.

The following fields indicate the FIC parameters associated with the EAC.

EAC_FLAG: This 1-bit field indicates the existence of the EAC in the current frame. This bit is the same value as the EAC_FLAG in the preamble.

EAS_WAKE_UP_VERSION_NUM: This 8-bit field indicates the version number of a wake-up indication.

If the EAC_FLAG field is equal to '1', the following 12 bits are allocated for EAC_LENGTH_BYTE field. If the EAC_FLAG field is equal to '0', the following 12 bits are allocated for EAC_COUNTER.

EAC_LENGTH_BYTE: This 12-bit field indicates the length, in byte, of the EAC.

EAC_COUNTER: This 12-bit field indicates the number of the frames before the frame where the EAC arrives.

The following field appears only if the AUX_FLAG field is equal to '1':

AUX_PRIVATE_DYN: This 48-bit field is reserved for future use for signaling auxiliary streams. The meaning of this field depends on the value of AUX_STREAM_TYPE in the configurable PLS2-STAT.

CRC_32: A 32-bit error detection code, which is applied to the entire PLS2.

FIG. 16 illustrates a logical structure of a frame according to an embodiment of the present invention.

As above mentioned, the PLS, EAC, FIC, DPs, auxiliary streams and dummy cells are mappec into the active carriers of the OFDM symbols in the frame. The PLS1 and PLS2 are first mapped into one or more FSS(s). After that, EAC cells, if any, are mapped immediately following the PLS field, followed next by FIC cells, if any. The DPs are mapped next after the PLS or EAC, FIC, if any. Type 1 DPs follows first, and Type 2 DPs next. The details of a type of the DP will be described later. In some case, DPs may carry some special data for EAS or service signaling data. The auxiliary stream or streams, if any, follow the DPs, which in turn are followed by dummy cells. Mapping them all together in the above mentioned order, i.e. PLS, EAC, FIC, DPs, auxiliary streams and dummy data cells exactly fill the cell capacity in the frame.

FIG. 17 illustrates PLS mapping according to an embodiment of the present invention.

PLS cells are mapped to the active carriers of FSS(s). Depending on the number of cells occupied by PLS, one or more symbols are designated as FSS(s), and the number of FSS(s) N_FSS is signaled by NUM_FSS in PLS1. The FSS is a special symbol for carrying PLS cells. Since robustness and latency are critical issues in the PLS, the FSS(s) has higher density of pilots allowing fast synchronization and frequency-only interpolation within the FSS.

PLS cells are mapped to active carriers of the NFSS FSS(s) in a top-down manner as shown in an example in FIG. 17. The PLS1 cells are mapped first from the first cell of the first FSS in an increasing order of the cell index. The PLS2 cells follow immediately after the last cell of the PLS1 and mapping continues downward until the last cell index of the first FSS. If the total number of required PLS cells exceeds the number of active carriers of one FSS, mapping proceeds to the next FSS and continues in exactly the same manner as the first FSS.

After PLS mapping is completed, DPs are carried next. If EAC, FIC or both are present in the current frame, they are placed between PLS and "normal" DPs.

FIG. 18 illustrates EAC mapping according to an embodiment of the present invention.

EAC is a dedicated channel for carrying EAS messages and links to the DPs for EAS. EAS support is provided but EAC itself may or may not be present in every frame. EAC, if any, is mapped immediately after the PLS2 cells. EAC is not preceded by any of the FIC, DPs, auxiliary streams or dummy cells other than the PLS cells. The procedure of mapping the EAC cells is exactly the same as that of the PLS.

The EAC cells are mapped from the next cell of the PLS2 in increasing order of the cell index as shown in the example in FIG. 18. Depending on the EAS message size, EAC cells may occupy a few symbols, as shown in FIG. 18.

EAC cells follow immediately after the last cell of the PLS2, and mapping continues downward until the last cell index of the last FSS. If the total number of required EAC cells exceeds the number of remaining active carriers of the last FSS mapping proceeds to the next symbol and continues in exactly the same manner as FSS(s). The next symbol for mapping in this case is the normal data symbol, which has more active carriers than a FSS.

After EAC mapping is completed, the FIC is carried next, if any exists. If FIC is not transmitted (as signaled in the PLS2 field), DPs follow immediately after the last cell of the EAC.

FIG. 19 illustrates FIC mapping according to an embodiment of the present invention.

(a) shows an example mapping of FIC cell without EAC and (b) shows an example mapping of FIC cell with EAC.

FIC is a dedicated channel for carrying cross-layer information to enable fast service acquisition and channel scanning. This information primarily includes channel binding information between DPs and the services of each broadcaster. For fast scan, a receiver can decode FIC and obtain information such as broadcaster ID, number of services, and BASE_DP_ID. For fast service acquisition, in addition to FIC, base DP can be decoded using BASE_DP_ID. Other than the content it carries, a base DP is encoded and mapped to a frame in exactly the same way as a normal DP. Therefore, no additional description is required for a base DP. The FIC data is generated and consumed in the Management Layer. The content of FIC data is as described in the Management Layer specification.

The FIC data is optional and the use of FIC is signaled by the FIC_FLAG parameter in the static part of the PLS2. If FIC is used, FIC_FLAG is set to '1' and the signaling field for FIC is defined in the static part of PLS2. Signaled in this field are FIC_VERSION, and FIC_LENGTH_BYTE. FIC uses the same modulation, coding and time interleaving parameters as PLS2. FIC shares the same signaling parameters such as PLS2_MOD and PLS2_FEC. FIC data, if any, is mapped immediately after PLS2 or EAC if any. FIC is not preceded by any normal DPs, auxiliary streams or dummy cells. The method of mapping FIC cells is exactly the same as that of EAC which is again the same as PLS.

Without EAC after PLS, FIC cells are mapped from the next cell of the PLS2 in an increasing order of the cell index as shown in an example in (a). Depending on the FIC data size, FIC cells may be mapped over a few symbols, as shown in (b).

FIC cells follow immediately after the last cell of the PLS2, and mapping continues downward until the last cell index of the last FSS. If the total number of required FIC cells exceeds the number of remaining active carriers of the last FSS, mapping proceeds to the next symbol and continues in exactly the same manner as FSS(s). The next symbol for mapping in this case is the normal data symbol which has more active carriers than a FSS.

If EAS messages are transmitted in the current frame, EAC precedes FIC, and FIC cells are mapped from the next cell of the EAC in an increasing order of the cell index as shown in (b).

After FIC mapping is completed, one or more DPs are mapped, followed by auxiliary streams, if any, and dummy cells.

FIG. 20 illustrates a type of DP according to an embodiment of the present invention.

shows type 1 DP and (b) shows type 2 DP.

After the preceding channels, i.e., PLS, EAC and FIC, are mapped, cells of the DPs are mapped. A DP is categorized into one of two types according to mapping method:

Type 1 DP: DP is mapped by TDM

Type 2 DP: DP is mapped by FDM

The type of DP is indicated by DP_TYPE field in the static part of PLS2. FIG. 20 illustrates the mapping orders of Type 1 DPs and Type 2 DPs. Type 1 DPs are first mapped in the increasing order of cell index, and then after reaching the last cell index, the symbol index is increased by one. Within the next symbol, the DP continues to be mapped in the increasing order of cell index starting from p=0. With a number of DPs mapped together in one frame, each of the Type 1 DPs are grouped in time, similar to TDM multiplexing of DPs.

Type 2 DPs are first mapped in the increasing order of symbol index, and then after reaching the last OFDM symbol of the frame, the cell index increases by one and the symbol index rolls back to the first available symbol and then increases from that symbol index. After mapping a number of DPs together in one frame, each of the Type 2 DPs are grouped in frequency together, similar to FDM multiplexing of DPs.

Type 1 DPs and Type 2 DPs can coexist in a frame if needed with one restriction; Type 1 DPs always precede Type 2 DPs. The total number of OFDM cells carrying Type 1 and Type 2 DPs cannot exceed the total number of OFDM cells available for transmission of DPs:

$$D_{DP1}+D_{DP2} \leq D_{DP}$$ [Equation 2]

where DDP1 is the number of OFDM cells occupied by Type 1 DPs, DDP2 is the number of cells occupied by Type 2 DPs. Since PLS, EAC, FIC are all mapped in the same way as Type 1 DP, they all follow "Type 1 mapping rule". Hence, overall, Type 1 mapping always precedes Type 2 mapping.

FIG. 21 illustrates DP mapping according to an embodiment of the present invention.

shows an addressing of OFDM cells for mapping type 1 DPs and (b) shows an addressing of OFDM cells for mapping for type 2 DPs.

Addressing of OFDM cells for mapping Type 1 DPs (0, . . . , DDP1-1) is defined for the active data cells of Type 1 DPs. The addressing scheme defines the order in which the cells from the TIs for each of the Type DPs are allocated to the active data cells. It is also used to signal the locations of the DPs in the dynamic part of the PLS2.

Without EAC and FIC, address 0 refers to the cell immediately following the last cell carrying PLS in the last FSS. If EAC is transmitted and FIC is not in the corresponding frame, address 0 refers to the cell immediately following the last cell carrying EAC. If FIC is transmitted in the corresponding frame, address 0 refers to the cell immediately following the last cell carrying FIC. Address 0 for Type 1 DPs can be calculated considering two different cases as shown in (a). In the example in (a), PLS, EAC and FIC are assumed to be all transmitted. Extension to the cases where either or both of EAC and FIC are omitted is straightforward. If there are remaining cells in the FSS after mapping all the cells up to FIC as shown on the left side of (a).

Addressing of OFDM cells for mapping Type 2 DPs (0, . . . , DDP2-1) is defined for the active data cells of Type 2 DPs. The addressing scheme defines the order in which the cells from the TIs for each of the Type 2 DPs are allocated to the active data cells. It is also used to signal the locations of the DPs in the dynamic part of the PLS2.

Three slightly different cases are possible as shown in (b). For the first case shown on the left side of (b), cells in the last FSS are available for Type 2 DP mapping. For the second case shown in the middle, FIC occupies cells of a normal symbol, but the number of FIC cells on that symbol is not larger than CFSS. The third case, shown on the right side in (b), is the same as the second case except that the number of FIC cells mapped on that symbol exceeds CFSS.

The extension to the case where Type 1 DP(s) precede Type 2 DP(s) is straightforward since PLS, EAC and FIC follow the same "Type 1 mapping rule" as the Type 1 DP(s).

A data pipe unit (DPU) is a basic unit for allocating data cells to a DP in a frame.

A DPU is defined as a signaling unit for locating DPs in a frame. A Cell Mapper 7010 may map the cells produced by the TIs for each of the DPs. A Time interleaver 5050 outputs a series of TI-blocks and each TI-block comprises a variable number of XFECBLOCKs which is in turn composed of a set of cells. The number of cells in an XFECBLOCK, Ncells, is dependent on the FECBLOCK size, Nldpc, and the number of transmitted bits per constellation symbol. A DPU is defined as the greatest common divisor of all possible values of the number of cells in a XFECBLOCK, Ncells, supported in a given PHY profile. The length of a DPU in cells is defined as LDPU. Since each PHY profile supports different combinations of FECBLOCK size and a different number of bits per constellation symbol, LDPU is defined on a PHY profile basis.

FIG. 22 illustrates an FEC structure according to an embodiment of the present invention.

FIG. 22 illustrates an FEC structure according to an embodiment of the present invention before bit interleaving. As above mentioned, Data FEC encoder may perform the FEC encoding on the input BBF to generate FECBLOCK procedure using outer coding (BCH), and inner coding (LDPC). The illustrated FEC structure corresponds to the FECBLOCK. Also, the FECBLOCK and the FEC structure have same value corresponding to a length of LDPC codeword.

The BCH encoding is applied to each BBF (Kbch bits), and then LDPC encoding is applied to BCH-encoded BBF (Kldpc bits=Nbch bits) as illustrated in FIG. 22.

The value of Nldpc is either 64800 bits (long FECBLOCK) or 16200 bits (short FECBLOCK).

The below table 28 and table 29 show FEC encoding parameters for a long FECBLOCK and a short FECBLOCK, respectively.

TABLE 28

| LDPC Rate | Nldpc | Kldpc | Kbch | BCH error correction capability | Nbch-Kbch |
|---|---|---|---|---|---|
| 5/15 | 64800 | 21600 | 21408 | 12 | 192 |
| 6/15 | | 25920 | 25728 | | |
| 7/15 | | 30240 | 30048 | | |
| 8/15 | | 34560 | 34368 | | |
| 9/15 | | 38880 | 38688 | | |
| 10/15 | | 43200 | 43008 | | |
| 11/15 | | 47520 | 47328 | | |
| 12/15 | | 51840 | 51648 | | |
| 13/15 | | 56160 | 55968 | | |

TABLE 29

| LDPC Rate | Nldpc | Kldpc | Kbch | BCH error correction capability | Nbch-Kbch |
|---|---|---|---|---|---|
| 5/15 | 16200 | 5400 | 5232 | 12 | 168 |
| 6/15 | | 6480 | 6312 | | |
| 7/15 | | 7560 | 7392 | | |
| 8/15 | | 8640 | 8472 | | |
| 9/15 | | 9720 | 9552 | | |
| 10/15 | | 10800 | 10632 | | |
| 11/15 | | 11880 | 11712 | | |
| 12/15 | | 12960 | 12792 | | |
| 13/15 | | 14040 | 13872 | | |

The details of operations of the BCH encoding and LDPC encoding are as follows:

A 12-error correcting BCH code is used for outer encoding of the BBF. The BCH generator polynomial for short FECBLOCK and long FECBLOCK are obtained by multiplying together all polynomials.

LDPC code is used to encode the output of the outer BCH encoding. To generate a completed Bldpc (FECBLOCK), Pldpc (parity bits) is encoded systematically from each Ildpc (BCH-encoded BBF), and appended to Ildpc. The completed Bldpc (FECBLOCK) are expressed as follow Equation.

$$B_{ldpc}=[I_{ldpc}\ P_{ldpc}]=[i_0,i_1,\ldots,i_{K_{ldpc}-1},p_0,p_1,\ldots,p_{N_{ldpc}-K_{ldpc}-1}]$$ [Equation 3]

The parameters for long FECBLOCK and short FECBLOCK are given in the above table 28 and 29, respectively.

The detailed procedure to calculate Nldpc−Kldpc parity bits for long FECBLOCK, is as follows:
1) Initialize the parity bits, $$p_0=p_1=p_2=\ldots p_{N_{ldpc}-K_{ldpc}-1}=0 \quad \text{[Equation 4]}$$

2) Accumulate the first information bit—i0, at parity bit addresses specified in the first row of an addresses of parity check matrix. The details of addresses of parity check matrix will be described Later. For example, for rate 13/15:

$$p_{983}=p_{983}\oplus i_0 \; p_{2815}=p_{2815}\oplus i_0$$

$$p_{4837}=p_{4837}\oplus i_0 \; p_{4989}=p_{4989}\oplus i_0$$

$$p_{6138}=p_{6138}\oplus i_0 \; p_{6458}=p_{6458}\oplus i_0,$$

$$p_{6921}=p_{6921}\oplus i_0 \; p_{6974}=p_{6974}\oplus i_0$$

$$p_{7572}=p_{7572}\oplus i_0 \; p_{8260}=p_{8260}\oplus i_0$$

$$p_{8496}=p_{8496}\oplus i_0 \quad \text{[Equation 5]}$$

3) For the next 359 information bits, is, s=1, 2, . . . , 359 accumulate is at parity bit addresses using following Equation.

$$\{x+(s \bmod 360)\times Q_{ldpc}\} \bmod (N_{ldpc}-K_{ldpc}) \quad \text{[Equation 6]}$$

where x denotes the address of the parity bit accumulator corresponding to the first bit i0, and Qldpc is a code rate dependent constant specified in the addresses of parity check matrix. Continuing with the example, Qldpc=24 for rate 13/15, so for information bit i1, the following operations are performed:

$$p_{1007}=p_{1007}\oplus i_1 \; p_{2839}=p_{2839}\oplus i_1$$

$$p_{4861}=p_{4861}\oplus i_1 \; p_{5013}=p_{5013}\oplus i_1$$

$$p_{6162}=p_{6162}\oplus i_1 \; p_{6482}=p_{6482}\oplus i_1$$

$$p_{7596}=p_{7596}\oplus i_1 \; p_{8284}=p_{8284}\oplus i_1$$

$$p_{8520}=p_{8520}\oplus i_1 \quad \text{[Equation 7]}$$

4) For the 361st information bit i360, the addresses of the parity bit accumulators are given in the second row of the addresses of parity check matrix. In a similar manner the addresses of the parity bit accumulators for the following 359 information bits is, s=361, 362, . . . , 719 are obtained using the Equation 6, where x denotes the address of the parity bit accumulator corresponding to the information bit i360, i.e., the entries in the second row of the addresses of parity check matrix.

5) In a similar manner, for every group of 360 new information bits, a new row from addresses of parity check matrixes used to find the addresses of the parity bit accumulators.

After all of the information bits are exhausted, the final parity bits are obtained as follows:

6) Sequentially perform the following operations starting with i=1

$$p_i=p_i\oplus p_{i-1}, i=1,2,\ldots,N_{ldpc}-K_{ldpc}-1 \quad \text{[Equation 8]}$$

where final content of pi, i=0, 1, . . . Nldpc−Kldpc−1 is equal to the parity bit pi.

TABLE 30

| Code Rate | Qldpc |
|---|---|
| 5/15 | 120 |
| 6/15 | 108 |
| 7/15 | 96 |
| 8/15 | 84 |
| 9/15 | 72 |
| 10/15 | 60 |
| 11/15 | 48 |
| 12/15 | 36 |
| 13/15 | 24 |

This LDPC encoding procedure for a short FECBLOCK is in accordance with t LDPC encoding procedure for the long FECBLOCK, except replacing the table 30 with table 31, and replacing the addresses of parity check matrix for the long FECBLOCK with the addresses of parity check matrix for the short FECBLOCK.

TABLE 31

| Code Rate | Qldpc |
|---|---|
| 5/15 | 30 |
| 6/15 | 27 |
| 7/15 | 24 |
| 8/15 | 21 |
| 9/15 | 18 |
| 10/15 | 15 |
| 11/15 | 12 |
| 12/15 | 9 |
| 13/15 | 6 |

Figure 23:
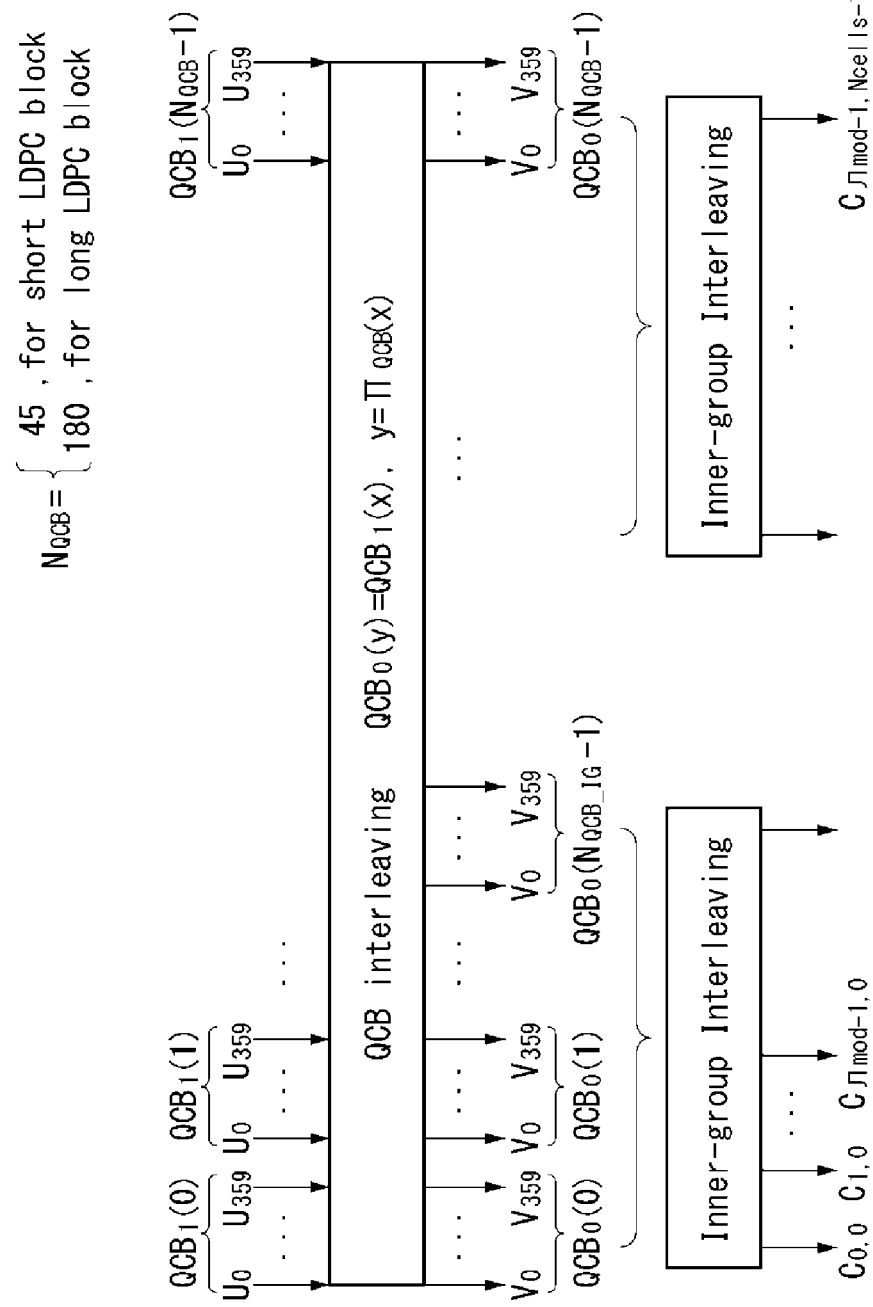
FIG. 23 illustrates a bit interleaving according to an embodiment of the present invention.

FIG. 23 illustrates a bit interleaving according to an embodiment of the present invention.

The outputs of the LDPC encoder are bit-interleaved, which consists of parity interleaving followed by Quasi-Cyclic Block (QCB) interleaving and inner-group interleaving.

shows Quasi-Cyclic Block (QCB) interleaving and (b) shows inner-group interleaving.

The FECBLOCK may be parity interleaved. At the output of the parity interleaving, the LDPC codeword consists of 180 adjacent QC blocks in a long FECBLOCK and 45 adjacent QC blocks in a short FECBLOCK. Each QC block in either a long or short FECBLOCK consists of 360 bits. The parity interleaved LDPC codeword is interleaved by QCB interleaving. The unit of QCB interleaving is a QC block. The QC blocks at the output of parity interleaving are permutated by QCB interleaving as illustrated in FIG. 23, where Ncells=64800/η mod or 16200/η mod according to the FECBLOCK length. The QCB interleaving pattern is unique to each combination of modulation type and LDPC code rate.

After QCB interleaving, inner-group interleaving is performed according to modulation type and order (η mod) which is defined in the below table 32. The number of QC blocks for one inner-group, NQCB_IG, is also defined.

TABLE 32

| Modulation type | ηmod | NQCB_IG |
|---|---|---|
| QAM-16 | 4 | 2 |
| NUC-16 | 4 | 4 |
| NUQ-64 | 6 | 3 |
| NUC-64 | 6 | 6 |
| NUQ-256 | 8 | 4 |

TABLE 32-continued

| Modulation type | ηmod | NQCB_IG |
|---|---|---|
| NUC-256 | 8 | 8 |
| NUQ-1024 | 10 | 5 |
| NUC-1024 | 10 | 10 |

The inner-group interleaving process is performed with NQCB_IG QC blocks of the QCB interleaving output. Inner-group interleaving has a process of writing and reading the bits of the inner-group using 360 columns and NQCB_IG rows. In the write operation, the bits from the QCB interleaving output are written row-wise. The read operation is performed column-wise to read out m bits from each row, where m is equal to 1 for NUC and 2 for NUQ.

Figure 24:
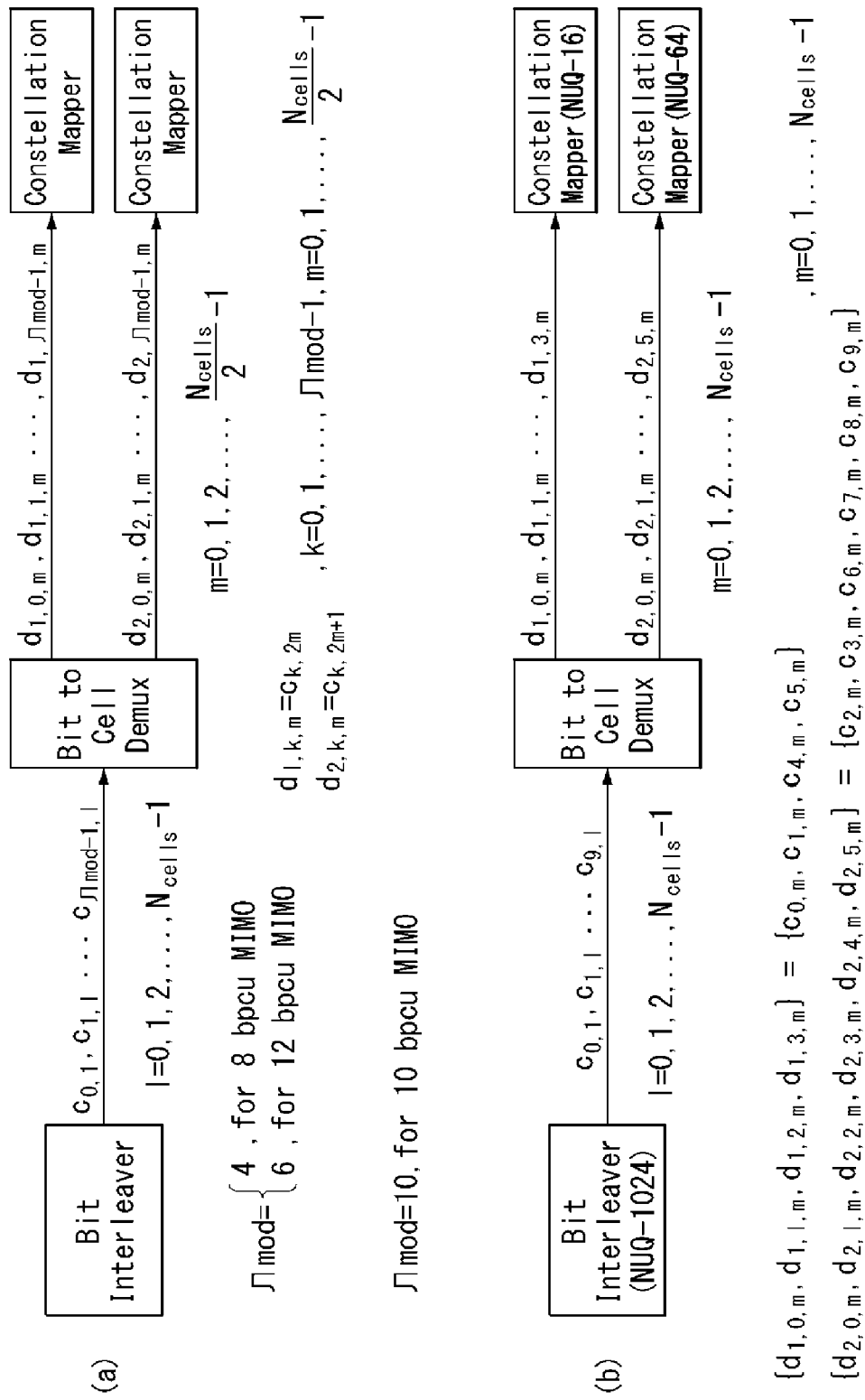
FIG. 24 illustrates a cell-word demultiplexing according to an embodiment of the present invention.

FIG. 24 illustrates a cell-word demultiplexing according to an embodiment of the present invention.

shows a cell-word demultiplexing for 8 and 12 bpcu MIMO and (b) shows a cell-word demultiplexing for 10 bpcu MIMO.

Each cell word (c0,1, c1,1, . . . , cη mod−1,1) of the bit interleaving output is demultiplexed into (d1,0,m, d1,1,m . . . , d1,η mod−1, m) and (d2,0,m, d2,1,m . . . , d2,η mod−1,m) as shown in (a), which describes the cell-word demultiplexing process for one XFECBLOCK.

For the 10 bpcu MIMO case using different types of NUQ for MIMO encoding, the Bit Interleaver for NUQ-1024 is re-used. Each cell word (c0,1, c1,1, . . . , c9,1) of the Bit Interleaver output is demultiplexed into (d1,0,m, d1,1,m . . . , d1,3,m) and (d2,0,m, d2,1,m . . . , d2,5,m), as shown in (b).

Figure 25:
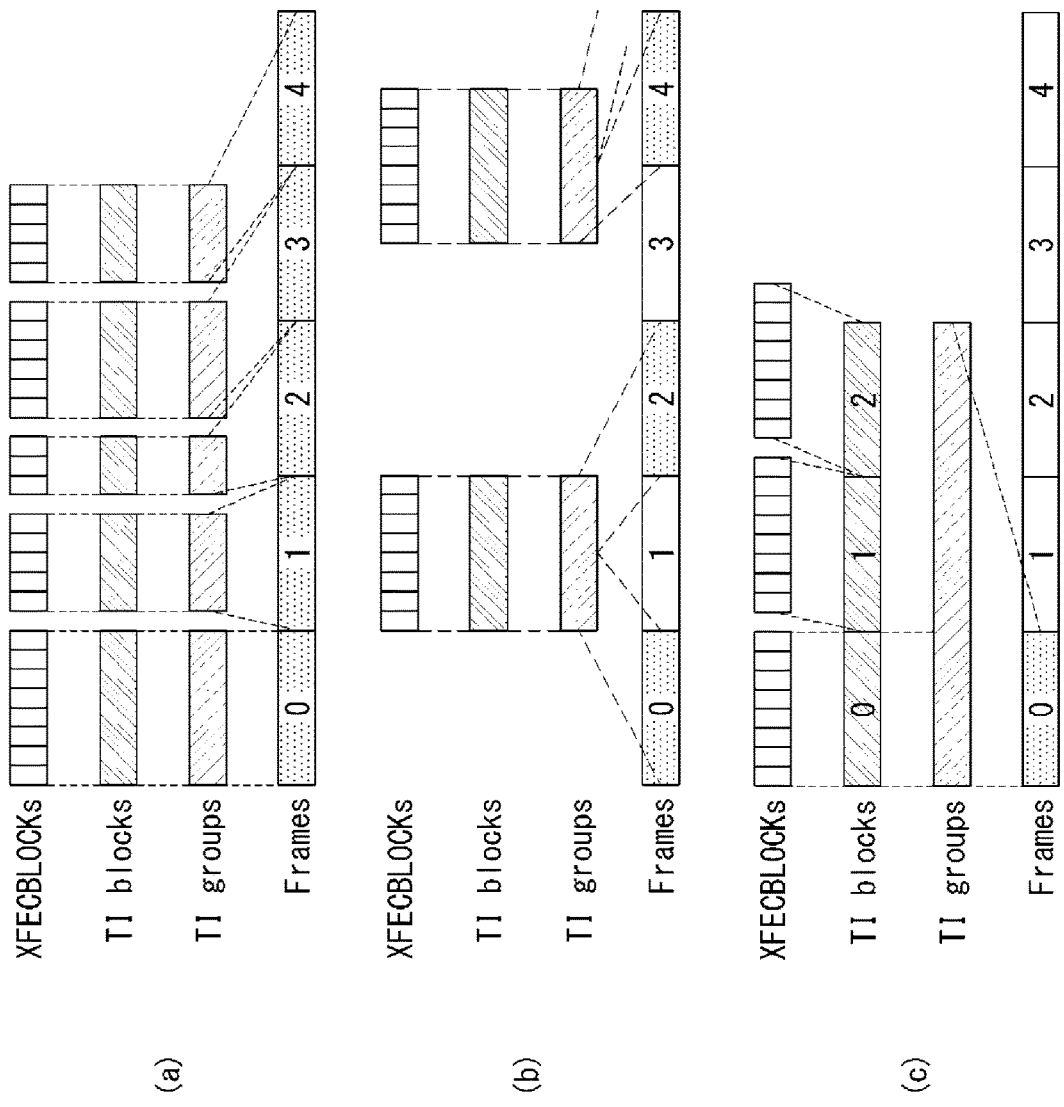
FIG. 25 illustrates a time interleaving according to an embodiment of the present invention.

FIG. 25 illustrates a time interleaving according to an embodiment of the present invention.

(a) to (c) show examples of TI mode.

The time interleaver operates at the DP level. The parameters of time interleaving (TI) may be set differently for each DP.

The following parameters, which appear in part of the PLS2-STAT data, configure the TI:

DP_TI_TYPE (allowed values: 0 or 1): Represents the TI mode; '0' indicates the mode with multiple TI blocks (more than one TI block) per TI group. In this case, one TI group is directly mapped to one frame (no inter-frame interleaving). '1' indicates the mode with only one TI block per TI group. In this case, the TI block may be spread over more than one frame (inter-frame interleaving).

DP_TI_LENGTH: If DP_TI_TYPE='0', this parameter is the number of TI blocks NTI per TI group. For DP_TI_TYPE='1', this parameter is the number of frames PI spread from one TI group.

DP_NUM_BLOCK_MAX (allowed values: 0 to 1023): Represents the maximum number of XFECBLOCKs per TI group.

DP_FRAME_INTERVAL (allowed values: 1, 2, 4, 8): Represents the number of the frames IJUMP between two successive frames carrying the same DP of a given PHY profile.

DP_TI_BYPASS (allowed values: 0 or 1): If time interleaving is not used for a DP, this parameter is set to '1'. It is set to '0' if time interleaving is used.

Additionally, the parameter DP_NUM_BLOCK from the PLS2-DYN data is used to represent the number of XFECBLOCKs carried by one TI group of the DP.

When time interleaving is not used for a DP, the following TI group, time interleaving operation, and TI mode are not considered. However, the Delay Compensation block for the dynamic configuration information from the scheduler will still be required. In each DP, the XFECBLOCKs received from the SSD/MIMO encoding are grouped into TI groups. That is, each TI group is a set of an integer number of XFECBLOCKs and will contain a dynamically variable number of XFECBLOCKs. The number of XFECBLOCKs in the TI group of index n is denoted by NxBLOCK_Group (n) and is signaled as DP_NUM_BLOCK in the PLS2-DYN data. Note that NxBLOCK_Group(n) may vary from the minimum value of 0 to the maximum value NxBLOCK_Group_MAX (corresponding to DP_NUM_B-LOCK_MAX) of which the largest value is 1023.

Each TI group is either mapped directly onto one frame or spread over PI frames. Each TI group is also divided into more than one TI blocks(NTI), where each TI block corresponds to one usage of time interleaver memory. The TI blocks within the TI group may contain slightly different numbers of XFECBLOCKs. If the TI group is divided into multiple TI blocks, it is directly mapped to only one frame. There are three options for time interleaving (except the extra option of skipping the time interleaving) as shown in the below table 33.

TABLE 33

| Mode | Description |
|---|---|
| Option-1 | Each TI group contains one TI block and is mapped directly to one frame as shown in (a). This option is signaled in the PLS2-STAT by DP_TI_TYPE-'0' and DP_TI_LENGTH = '1' ($N_{TI}$ = 1). |
| Option-2 | Each TI group contains one TI block and is mapped to more than one frame. (b) shows an example, where one TI group is mapped to two frames, i.e., DP_TI_LENGTH = '2' ($P_I$ = 2) and DP_FRAME_INTERVAL ($I_{Jump}$ = 2). This provides greater time diversity for low data-rates ervices. This option is signaled in the PLS2-STAT by DP_TI_TYPE = '1'. |
| Option-3 | Each TI group is divided into multiple TI blocks and is mapped directly to one frame as shown in (c). Each TI block may use full TI memory, so as to provide the maximum bit-rate for a DP. This option is signaled in the PLS2-STAT signaling by DP_TI_TYPE = '0' and DP_TI_LENGTH = NTI, while $P_I$ = 1. |

In each DP, the TI memory stores the input XFEC-BLOCKs (output XFECBLOCKs from the SSD/MIMO encoding block). Assume that input XFECBLOCKs are defined as $$(d_{n,s,0,0}, d_{n,s,0,1}, \ldots, d_{n,s,0,N_{cells}-1}, d_{n,s,1,0}, \ldots, d_{n,s,1,N_{cells}-1},$$
$$\ldots, d_{n,s,N_{xBLOCK\_TI}(n,s)-1,0}, \ldots, d_{n,s,N_{xBLOCK\_TI}(n,s)-1,N_{cells}-1}),$$

where $d_{n,s,r,q}$ is the qth cell of the rth XFECBLOCK in the sth TI block of the nth TI group and represents the outputs of SSD and MIMO encodings as follows $$d_{n,s,r,q} = \begin{cases} f_{n,s,r,q}, & \text{the output of } SSD \cdots \text{encoding} \\ g_{n,s,r,q}, & \text{the output of } MIMO \text{ encoding} \end{cases}.$$

In addition, assume that output XFECBLOCKs from the time interleaver 5050 are defined as $$(h_{n,s,0}, h_{n,s,1}, \ldots, h_{n,s,i}, \ldots, h_{n,s,N_{xBLOCK\_TI}(n,s) \times N_{cells}-1}),$$

where $h_{n,s,i}$ is the ith output cell (for $i=0, \ldots, N_{xBLOCK\_TI}(n,s) \times N_{cells}-1$) in the sth TI block of the nth TI group.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The TI is a twisted row-column block interleaver. For the sth TI block of the nth TI group, the number of rows $N_r$ of a TI memory is equal to the number of cells $N_{cells}$, i.e., $N_r = N_{cells}$ while the number of columns $N_c$ is equal to the number $N_{xBLOCK\_TI}(n,s)$.

FIG. 26 illustrates a basic operation of a twisted row-column block interleaver according to an exemplary embodiment of the present invention.

FIG. 26A illustrates a writing operation in a time interleaver and FIG. 26B illustrates a reading operation in the time interleaver. As illustrated in FIG. 26A, a first XFEC-BLOCK is written in a first column of a time interleaving memory in a column direction and a second XFECBLOCK is written in a next column, and such an operation is continued. In addition, in an interleaving array, a cell is read in a diagonal direction. As illustrated in FIG. 26B, while the diagonal reading is in progress from a first row (to a right side along the row starting from a leftmost column) to a last row, $N_r$ cells are read. In detail, when it is assumed that $z_{n,s,i}(i=0, \ldots, N_rN_c)$ is a time interleaving memory cell position to be sequentially read, the reading operation in the interleaving array is executed by calculating a row index $R_{n,s,i}$, a column index $C_{n,s,i}$, and associated twist parameter $T_{n,s,i}$ as shown in an equation given below.

[Equation 9]
$$\text{GENERATE}(R_{n,s,i}, C_{n,s,i}) = \{$$
$$R_{n,s,i} = mod(i, N_r),$$
$$T_{n,s,i} = mod(S_{shift} \times R_{n,s,i}, N_c),$$
$$C_{n,s,i} = mod\left(T_{n,s,i} + \left\lfloor \frac{i}{N_r} \right\rfloor, N_c\right)$$
$$\}$$

Where, $S_{shift}$ is a common shift value for a diagonal reading process regardless of $N_{xBLOCK\_TI}(n,s)$ and the shift value is decided by $N_{xBLOCK\_TI\_MAX}$ given in PLS2-STAT as shown in an equation given below.

[Equation 10]
$$\text{for } \begin{cases} N'_{xBLOCK\_TI\_MAX} = N_{xBLOCK\_TI\_MAX} + 1, & \text{if } N_{xBLOCK\_TI\_MAX} \bmod 2 = 0 \\ N'_{xBLOCK\_TI\_MAX} = N_{xBLOCK\_TI\_MAX}, & \text{if } N_{xBLOCK\_TI\_MAX} \bmod 2 = 1 \end{cases}$$

$$S_{shift} = \frac{N'_{xBLOCK\_TI\_MAX} - 1}{2}$$

Consequently, the cell position to be read is calculated by a coordinate $z_{n,s,i} = N_r C_{n,s,i} + R_{n,s,i}$.

FIG. 27 illustrates an operation of a twisted row-column block interleaver according to another exemplary embodiment of the present invention.

In more detail, FIG. 27 illustrates an interleaving array in the time interleaving memory for respective time interleaving groups including a virtual XFEC3LOCK when, $N_{xBLOCK\_TI}(0,0)=3$, $N_{xBLOCK\_TI}(1,0)=6$ and $N_{xBLOCK\_TI}(2,0)=5$.

A variable $N_{xBLOCK\_TI}(n,s) = N_r$ will be equal to or smaller than $N'_{xBLOCKTI\_MAX}$. Accordingly, in order for a receiver to achieve single memory interleaving regardless of $N_{xBLOCK\_TI}(n,s)$, the size of the interleaving array for the twisted row-column block interleaver is set to a size of $N_r \times N_c = N_{cells} \times N'_{xBLOCKTI\_MAX}$ by inserting the virtual XFECBLOCK into the time interleaving memory and a reading process is achieved as shown in an equation given below.

[Equation 11]
$$p = 0;$$
$$\text{for } i = 0; i < N_{cells} N'_{xBLOCK\_TI\_MAX}; i = i + 1$$
$$\{\text{GENERATE}(R_{n,s,i}, C_{n,s,i});$$
$$V_i = N_r C_{n,s,j} + R_{n,s,j}$$
$$\text{if } V_i < N_{cells} N_{xBLOCK\_TI}(n, s)$$
$$\{$$
$$Z_{n,s,p} = V_i; p = p + 1;$$
$$\}$$
$$\}$$

The number of the time interleaving groups is set to 3. An option of the time interleaver is signaled in the PLS2-STAT by DP_TI_TYPE='0', DP_FRAME_INTERVAL='1', and DP_TI_LENGTH='1', that is, NTI=1, IJUMP=1, and PI=1. The number of respective XFECBLOCKs per time interleaving group, of which Ncells=30 is signaled in PLS2-DYN data by NxBLOCK_TI (0, 0)=3, NxBLOCK_TI (1, 0)=6, and NxBLOCK_TI(2,0)=5 of the respective XFEC-BLOCKs. The maximum number of XFECBLOCKs is signaled in the PLS2-STAT data by NxBLOCK_Group_MAX and this is continued to $\lfloor N_{xBLOCK\_Group\_MAX} / N_{TI} \rfloor = N_{xBLOCK\_TI\_MAX} = 6$.

Figure 28:
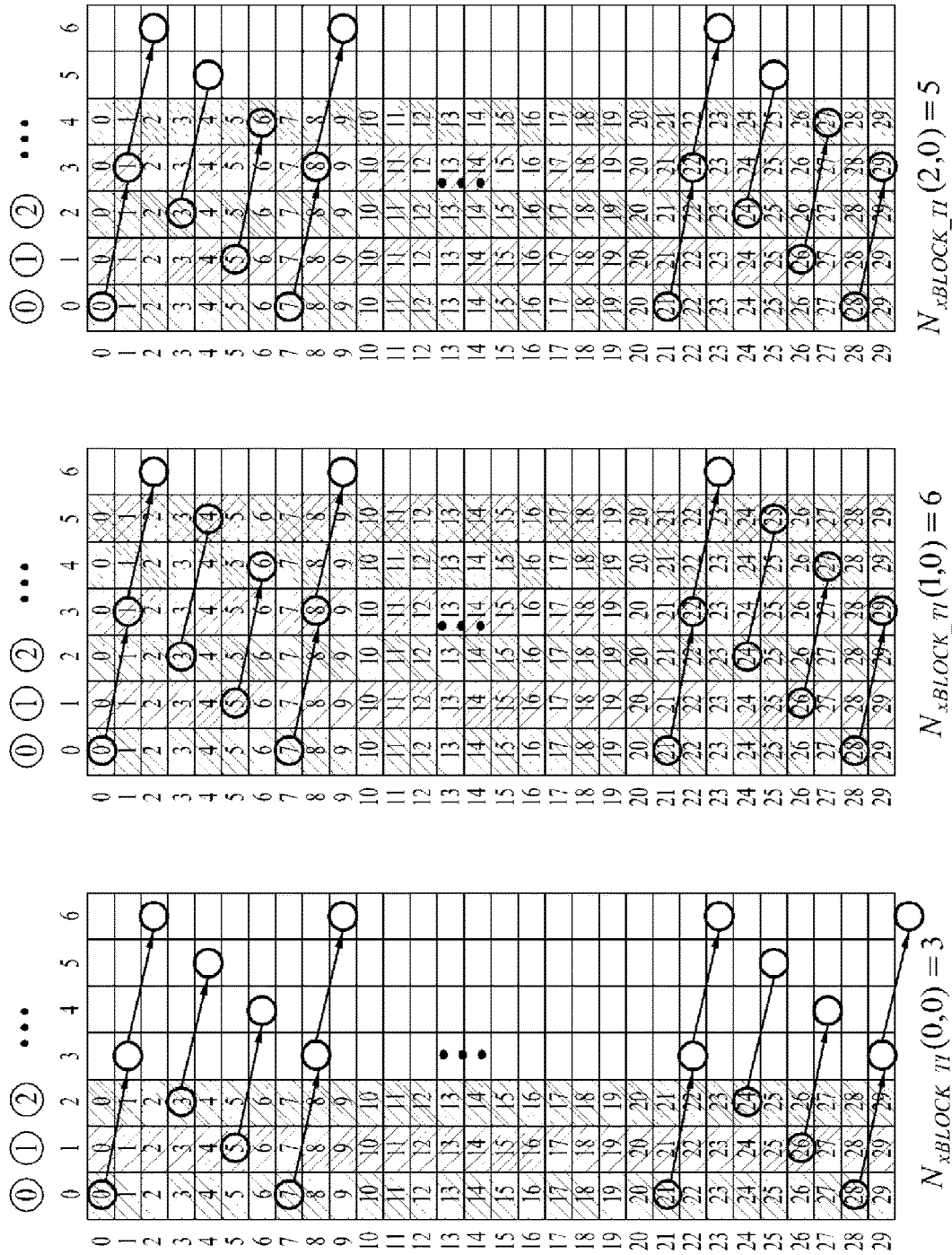
FIG. 28 illustrates a diagonal reading pattern of the twisted row-column block interleaver according to the exemplary embodiment of the present invention.

FIG. 28 illustrates a diagonal reading pattern of the twisted row-column block interleaver according to the exemplary embodiment of the present invention.

In more detail, FIG. 28 illustrates a diagonal reading pattern from respective interleaving arrays having parameters $N'_{xBLOCKTI\_MAX}=7$ and Sshift=(7−1)/2=3. In this case, during a reading process expressed by a pseudo code given above, when $V_i \geq N_{cells} N_{xBLOCK\_TI}(n,s)$, a value of Vi is omitted and a next calculation value of Vi is used.

Figure 29:
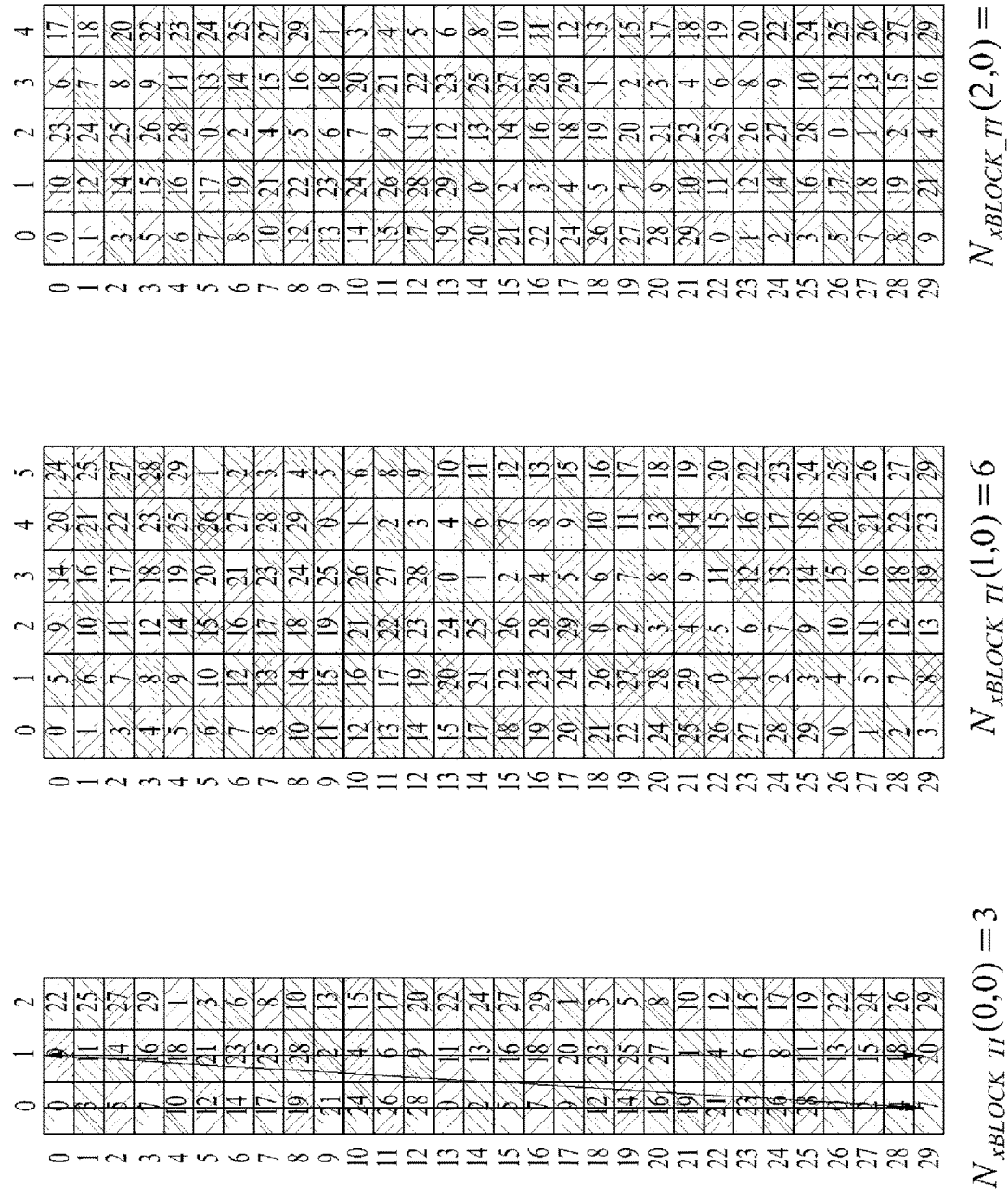
FIG. 29 illustrates XFECBLOCK interleaved from each interleaving array according to an exemplary embodiment of the present invention.

FIG. 29 illustrates XFECBLOCK interleaved from each interleaving array according to an exemplary embodiment of the present invention.

FIG. 29 illustrates XFECBLOCK interleaved from each interleaving array having parameters $N'_{xBLOCKTI\_MAX}=7$ and Sshift=3 according to an exemplary embodiment of the present invention.

In this specification, the DP may also be called a Physical Layer Pipe (PLP), and the PLS information may also be designated as Layer 1 (L1) information or L1 signaling information. The PLS1 information may also be designated Layer 1 (L1) basic information, and the PLS2 information may also be designated as L1 detail information. In this specification, if specific information/data is signaled, it may mean that the information/data is transmitted and received through the L1 signaling information.

Figure 30:
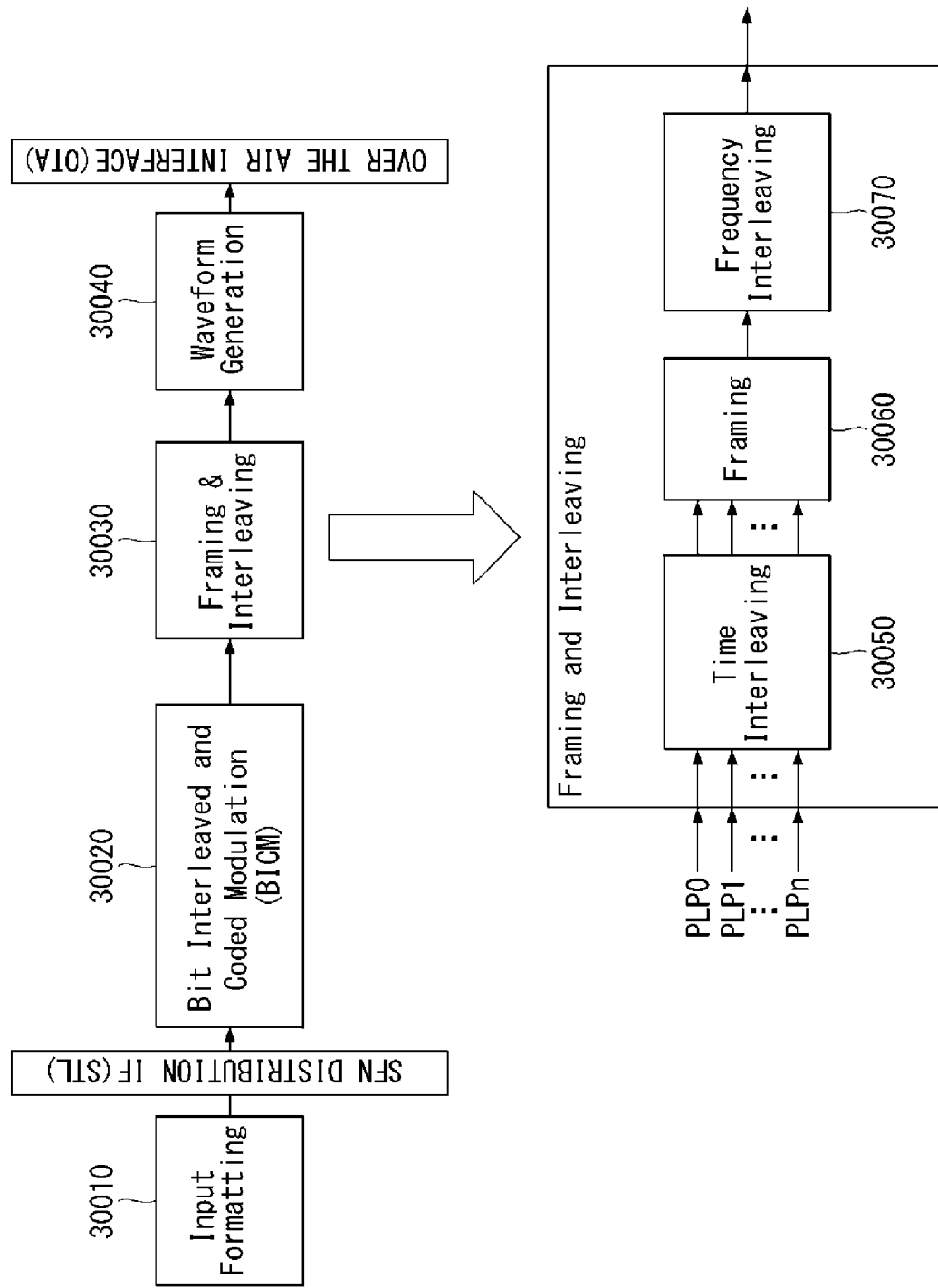
FIG. 30 shows the configuration of a broadcast signal transmitter according to another embodiment of the present invention.

FIG. 30 shows the configuration of a broadcast signal transmitter according to another embodiment of the present invention.

The broadcast signal transmitter of FIG. 30 may include an input formatting block 30010, a Bit Interleaved and Coded Modulation (BICM) block 30020, a framing & interleaving block 30030, and a waveform generation block 30040. The framing & interleaving block 30030 of FIG. 30 may correspond to the frame building block of FIG. 1, and the waveform generation block 30040 thereof may correspond to the OFDM generation block of FIG. 1.

FIG. 30 corresponds to a case where the frame building block 1020 includes the time interleaving block 30050 unlike in the aforementioned embodiments. Accordingly, the frame building block 1020 may be called the framing & interleaving block 30050. In other words, the framing & interleaving block 30030 may further include a time interleaving block 30050, a framing block 30060, and a frequency interleaving block 30070. The framing & interleaving block 30030 may time-interleave data using such sub-blocks, may generate a signal frame by mapping the data, and may frequency-interleave the signal frame.

The remaining description other than a case where the time interleaving block 30050 has moved from the BICM block 30020 to the framing & interleaving block 30030 is the same as that described above. The waveform generation block 30040 is the same as the OFDM generation block 1030 of FIG. 1 and is different in name only.

On the broadcast signal receiver side, as described above, the time interleaving block has moved from the demapping and decoding block 9020 of FIG. 9 to the frame parsing block 9010, and the frame parsing block 9010 may also be called a frame parsing/deinterleaving block. The frame parsing block 9010 may performs frequency deinterleaving, frame parsing, and time interleaving on a received signal.

In FIG. 30, only the inclusion relationships between the sub-blocks of the system are changed and the sub-blocks are renamed, and detailed operations of the sub-blocks are the same as those described above. In this specification, as in the previous embodiments, the elements of the transmission and reception system may also be designated blocks, modules, or units.

In FIG. 30, the framing module 31060 generates a signal frame. A method of configuring a signal frame according to an embodiment of the present invention is described in more detail below.

FIG. 31 shows the structure of a signal frame according to an embodiment of the present invention.

The signal frame may include a bootstrap, a preamble, and a data part.

A bootstrap signal may be robustly designed in such a way as to operate in a poor channel environment. The bootstrap signal may carry essential system information and essential information capable of accessing a corresponding broadcast system.

The bootstrap signal may be used in the locking and offset estimation of an RF carrier frequency and the locking and offset estimation of a sampling frequency. The bootstrap signal may signal system bandwidth information (e.g., 6, 7, 8 MHz). Furthermore, the bootstrap signal may include core system signaling information (e.g., major/minor version information). Furthermore, the bootstrap information may signal the time until the start of a next data frame. Furthermore, the bootstrap information may send the identifiers of L1 signaling information transmitted in the preamble. Furthermore, the bootstrap signal may support an Emergency Alert System (EAS) wakeup function. The EAS wakeup information of the bootstrap signal may indicate whether an emergency situation has occurred. That is, the EAS information may indicate whether emergency alert information from an EAS or another source is present in at least one frame.

The bootstrap includes preamble structure information. The preamble structure information may indicate L1 basic mode information, information about the FFT size of the preamble, information about the GI length of the preamble, and information about the pilot pattern Dx of the preamble.

FIG. 32 shows the structure of a signal frame according to an embodiment of the present invention.

FIG. 32 shows the signal frame of FIG. 31 by symbol unit. Each of the preamble and data of the signal frame may include at least one symbol.

The preamble conveys L1 signaling information. Furthermore, the preamble may include a single CFDM symbol or a plurality of OFDM symbols depending on the size of the L1 signaling information, that is, the number of bits. The preamble may have the same structure as the data symbol or may have a different structure (e.g., an FFT size and a Guard Interval (GI)) from the structure of the data symbol. In this case, the structure of the preamble symbol or the data symbol may be signaled in the bootstrap. That is, the bootstrap may also indicate an FFT size, GI length, and pilot pattern of the preamble.

Advantages if information about the preamble/data part is transmitted in the bootstrap are as follows. The operation of the broadcast signal receiver can be simplified. Furthermore, a service acquisition time including a channel scan can be reduced because the time taken to obtain L1 signaling information is reduced. Furthermore, reception performance can be improved because an FFT/GI false detection possibility is reduced in a poor channel situation.

A single signal frame may include at least one subframe. Furthermore, one of 8K, 16K, and 32K may be used as the FFT size of each subframe, and the FFT size of each subframe may be the same or different. The subframe has a fixed/constant FFT size, GI length, Scattered Pilot (SP) pattern, and Number Of useful Carriers (NoC) for the corresponding subframe. Furthermore, FFT size information, GI length information, pilot pattern information, and NoC information about a corresponding subframe may be included in a preamble and transmitted/received.

Figure 33:
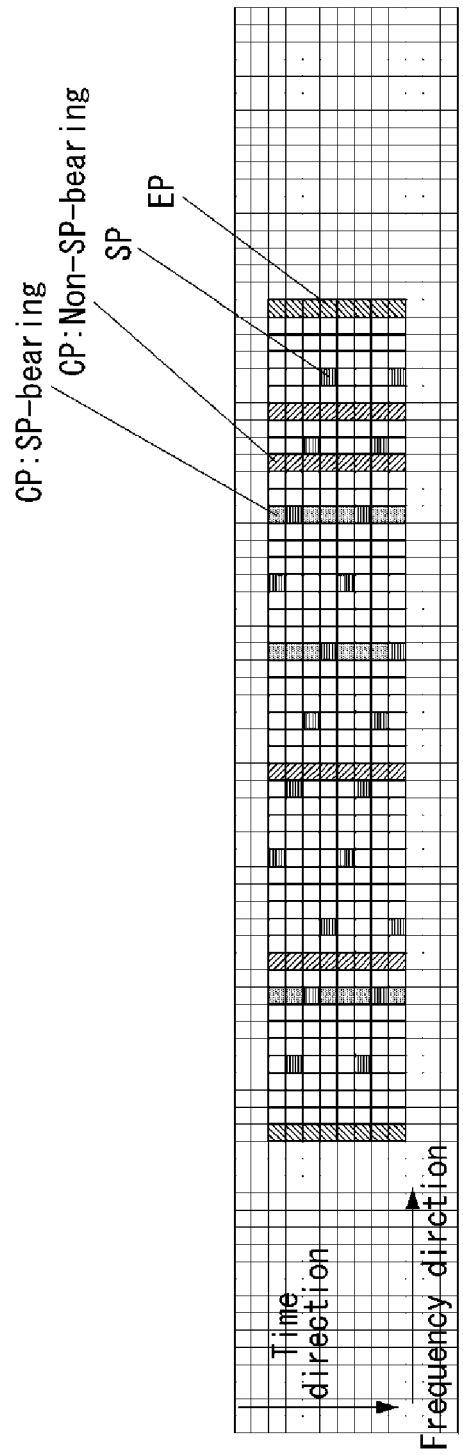
FIG. 33 shows the pilot structure of a signal frame according to an embodiment of the present invention.

FIG. 33 shows the pilot structure of a signal frame according to an embodiment of the present invention.

As in FIG. 33, the actual bandwidth of a signal frame may be changed depending on the Number of Carriers (NoC).

The signal frame includes Edge Pilots (EPs), Continual Pilots (CPs), and Scattered Pilots (SPs).

The EP or edge carrier indicates carriers whose carrier index k corresponds to 0 or NoC−1.

The CP is inserted into every the symbols of the signal frame. The frequency direction index of the CP is determined to be a specific pattern depending on an FFT size. The CP includes a common CP and an additional CP. The common CP corresponds to a non-SP-bearing-CP, and the additional CP corresponds to an SP-bearing-CP. The additional CP is added in order to regularly maintain a constant number of data carriers per data symbol. That is, the additional CP is added in order to ensure the constant Number of Active carriers (NoA) per symbol.

A Scattered Pilot (SP) is disposed depending on an SP pattern indicated by Dx and Dy. Dx indicates the distance or separation of a pilot-bearing carrier in a frequency direction. Dy indicates the number of symbols forming a single SP sequence in a time direction. For example, in FIG. 33, an SP pattern is Dx=4 and Dy=4. An SP pattern used in a subframe may be transmitted using the L1 signaling information of a preamble.

A method of boosting power of an SP is described below.

The broadcast signal transmitter may insert a pilot into a signal frame using a pilot insertion module. The pilot insertion module may correspond to the pilot and tone insertion module 8000 of FIG. 8. The pilot signal may also be used for the synchronization, channel estimation, transmission mode identification, and phase noise estimation of a received signal. Accordingly, in order to improve signal reception and decoding performance, the power level of a pilot signal may be boosted.

A transmission and reception system can improve the entire system performance by improving channel estimation quality using a boosted pilot signal. If power of a pilot signal is boosted, however, the allocated power/energy of the remaining data part may be reduced because total power or energy which may be used in a signal frame is limited. Accordingly, excessive power allocation for a pilot may cause to deteriorate performance due to a reduction in the power of the data part. Accordingly, a boosting power level having optimum performance for each SP pattern may be determined.

$$SNR_{EQ} = \frac{\sigma_S^2}{\sigma_N^2 + \sigma_N^2 \times f_{int}} = SNR \times \frac{1}{1 + f_{int}} \quad \text{[Equation 12]}$$

Equation 12 is an equation for modeling an equalized data SNR.

In Equation 12, $(\sigma\_s)^2$ denotes data power, $(\sigma\_N)^2$ denotes noise power, $(\sigma\_CE)^2$ denotes channel estimation false power, and f_int denotes a noise reduction factor (f<1) according to interpolation.

SNR_EQ denotes a ratio of noise versus signal power upon channel estimation, and SNR_EQ may be represented using the SNR of a received signal.

$$SNR_{EQ,b} = \frac{\sigma_S^2 \times k}{\sigma_N^2 + \sigma_N^2 \times f_{int}/b} = SNR \times \frac{1}{1 + f_{int}/b} \quad \text{[Equation 13]}$$

$$SNR_{EQ,b}/SNR = \frac{s}{(s-1)+b} \times \frac{1}{1 + f_{int}/b} \quad \text{[Equation 14]}$$

Equation 13 is an equation for modeling an equalized data SNR if SP boosting is used.

In Equation 13, b denotes an SP boosting factor $((\sigma\_p)^2=b*(\sigma\_s)^2)$, k denotes a power normalization factor (k=s/((s−1)+b)), and s denotes an SP coefficient (S=Dx*Dy). $(\sigma\_p)^2$ denotes power of an SP.

Equation 13 may be changed to Equation 14 if it is represented by a ratio of an SNR if boosting is used and the SNR of a received signal.

An equalized data SNR may be optimized with respect to each SP pattern. In the modeling equations, a noise reduction factor f_int is an unknown parameter. A noise reduction may be achieved by the time and frequency interleaver. That is, f_int=f_int,time*f_int,freq. For example, if Dy=4, f_int,time may be 0.6875. If Dy=2, f_int,time may be 0.75. In this case, f_int,freq may be different depending on a receiver and/or a reception environment. For example, f_int,freq may be 1, or f_int,freq may be 0.5. Accordingly, f_int,freq capable of optimizing processing performance of a received signal may be determined, and a pilot boosting level may be determined based on the determined "f_int,freq."

f_int may be selected depending on various use cases, a channel condition, and/or the implementation of a receiver. Accordingly, a plurality of boosting levels can be proposed, and flexibility in selecting SF boosting power according to a system can be provided by allocating a signaling bit indicating information about a boosting level. In an embodiment, the boosting level may be transmitted in 2 bits or 3 bits. A signaling parameter indicating such a boosting level may also be designated an SP boosting parameter or SP boosting information.

In an embodiment, regarding the SP boosting parameter, each of five levels may be indicated using 3 bits as follows. The five levels may also be designated as boosting degrees of 0~4. Parameter values of "000"~"100" may correspond to the respective boosting degrees of 0~4.

"000": SP boosting not used.
"001": f_int,freq=0.25
"010": f_int,freq=0.5
"011": f_int,freq=0.75
"100": f_int,freq=1.0
"101"~"111": reserved FIGS. 34 and 35 show SP boosting information according to an embodiment of the present invention.

FIG. 34 is a table in which the SP boosting levels are indicated in dB, and FIG. 35 is a table in which the SP boosting levels are indicated in the amplitude of normalized data carrier power. That is, in FIG. 34, a power ratio prior to boosting is 0. In FIG. 35, a power level prior to boosting is 1.

For example, if an SP pattern is SP3_4, that is, if Dx=3 and Dy=4, if a boosting level is 2("010") in FIG. 34, an SP pilot is boosted in 2.9 dB, and thus has amplitude of 1.40. In SP boosting information, boosted amplitude of an SP for each SP pattern may be indicated in dB or by amplitude using a parameter of 3 bits.

The SP boosting information indicates an SP boosting level according to an SP pattern using five levels (0, 1, 2, 3, and 4). One level (e.g., 0) of the five levels includes a case where boosting is not performed. That is, in a level of 0, amplitude of an SP becomes 0 dB or amplitude of 1. In other words, the SP boosting information indicates amplitude of an SP.

The broadcast signal transmitter and the broadcast signal receiver may store SP boosting tables, such as FIGS. 34 and 35, and may signal only an SP boosting parameter, that is, SP boosting information, using 3 bits.

A pilot is also inserted into the preamble of a signal frame. In an embodiment, the broadcast signal transmitter may also boost a preamble pilot. If time interpolation is not present, f_int,time may be set to 1.0. Furthermore, f_int,freq may be set to have a maximum Huard Utilization Ratio (GUR) depending on the FFT size, GI length, and pilot pattern of a preamble.

In the case of a preamble pilot, a pilot pattern of Dy=1 may be used. A preamble carries L1 signaling information and a receiver is able to process a received signal when L1 signaling information and the L1 signaling information is fast decoded. Accordingly, for the purpose of rapid and accurate channel estimation and sync tracking, a preamble symbol can increase pilot density compared to a data symbol. To this end, with respect to a preamble symbol, a pilot pattern having Dy=1 may be used. Accordingly, if the number of preamble symbols is plural, a pilot may occur at the same position of the respective preamble symbols. The Dx value of a preamble pilot may be signaled through preamble structure information of a bootstrap.

FIGS. 36 and 37 show preamble pilot boosting information according to an embodiment of the present invention.

FIG. 36 shows boosting levels according to an FFT size, GI length, and SP Dx by GUR. The GUR may be determined using a ratio of Dx and a GI as a factor.

FIG. 37 shows the pilot boosting levels of a preamble symbol in dB unit and by amplitude unit. As in FIG. 36, FIG. 37 shows a method of boosting a preamble pilot with respect to each of 17 types according to an FFT size, GI length, and SP Dx.

As described above, the structure of a preamble symbol is signaled through the preamble structure information of a bootstrap. Accordingly, the pilot boosting information of a preamble may be determined using the preamble structure information of the bootstrap. The broadcast signal transmitter and the broadcast signal receiver may share the data of FIGS. 36 and 37. The broadcast signal receiver may obtain information about the FFT size, GI length, and SP DX of a received preamble using the preamble structure information of a bootstrap. Furthermore, the broadcast signal receiver may determine a power boosting level applied to the preamble pilot of a received signal through FIGS. 36 and 37 and may process the received signal based on the determined power boosting level.

In another embodiment, SP power boosting may also be performed on a frame boundary symbol. At least one of the first symbol and last symbol of a frame or subframe may become a frame boundary symbol or an subframe boundary symbol (SBS). Pilots having greater pilot density are inserted into an SBS compared to a data symbol. The subframe boundary pilot may be inserted by Dx unit (Dy=1). Since a large number of pilots are inserted, energy of a data symbol part may be lowered if pilot boosting is performed. Accordingly, power boosting in which a reduction in the energy of the data symbol part is taken into consideration may be performed.

Two methods may be used as power boosting for a frame boundary symbol.

First, SP power may be maintained as in a normal data symbol, and instead null carriers may be inserted. If null carriers are deployed, power of carriers other than the null carriers is increased because power is not distributed to the null carriers. Accordingly, there is an advantage in that SP power is also increased. In this case, the aforementioned SP boosting power table has only to be used. That is, if this method is used, signaling overhead can be reduced because the SP boosting power table is used without a change, and the deterioration of performance can be minimized because proper energy is distributed to a data symbol.

Second, SP power boosting for a frame boundary symbol may be separately configured.

FIG. 38 shows the SP power boosting levels of a frame boundary symbol.

In the case of a frame boundary symbol, Dy=1 may be used, and thus a power boosting level may be determined depending on a Dx value.

A method of disposing null carriers and performing power boosting on a frame boundary symbol is described in detail below.

First, the elements/units of a system configuration for illustrating a method of disposing null carriers in an SBS are described below.

Number of Carriers (NoC): the number of carriers including a pilot

Number of Active carriers (NoA): the number of active data carriers of a normal data symbol N_SP: the number of Scattered Pilots (SPs)

N_SP-CP: the number of SP-bearing-CPs

N_NSP-CP: the number of non-SP-bearing-CPs

A_SP: the amplitude/size of an SP cell

A_CP: the amplitude/size of a CP cell

NoA_DATA,SBS: the number of data carriers of a Subframe Boundary Symbol (SBS)

NoA_SBS: the number of active data carriers of an SBS

N_SP,SBS: the number of SBS pilots

N_null: the number of null carriers

An SBS includes SBS pilots, that is, the Dx value and Dy=1 of an SP pattern which are used in the normal data symbol of a corresponding subframe. Accordingly, if SP boosting power for a normal data symbol, such as that described above, is used, power of an SBS is greater than power of the normal data symbol except (L1_SP_boosting='000') in which boosting is not performed. Accordingly, in order to make identical/constant power of OFDM symbols that are transmitted and received, power of the OFDM symbol may be made identical with that of a normal data symbol by inserting a null carrier or a non-modulated carrier whose corresponding cell power is 0. A method of making power of an SBS identical with power of a normal data symbol is described below.

NoA_SBS is the number of active data carriers of an SBS and may be obtained by subtracting the number of null carriers from the number of data cells of an SBS (i.e., NoA_SBS=N_DATA,SBS−N_null).

$$P_{NS} = NoA + (N_{SP} + N_{SP-CP}) * A_{SP}^2 + N_{NSP-CP} * A_{CP}^2 \quad \text{[Equation 15]}$$

In Equation 15, power of data carriers is assumed to be 1. Total power of a normal data symbol may be obtained as in Equation 15. Power of a normal data symbol "P_NS" may be represented by the sum of power of active data carriers "NoA", power of SPs "(N_SP+N_SP-CP)*(A_SP)^2", and power of CPs "(N_NSP-CP)*(A_CP)^2".

$$P_{SBS} = NoA_{SBS} + N_{SP,SBS} * A_{SP}^2 + N_{NSP-CP} * A_{CP}^2 \quad \text{[Equation 16]}$$

In Equation 16, power of data carriers is assumed to be 1. Furthermore, total power of an SBS may be obtained as in Equation 16. Total power of an SBS "P_SBS" may be represented by the sum of power of the active data carriers of an SBS "NoA_SBS", power of SBS pilots "(S_SP,SBS)*(A_SP)^"", and power of the CPs of the SBS "(N_NSP-CP)*(A_CP)^"".

Furthermore, as a result, the number of data carriers of the SBS in which total power of the normal data symbol of Equation 15 is equal to the total power of the SBS of Equation 16 has only to be calculated. This is the same as Equation 17 below.

$$NoA_{SBS} = NoA - (N_{SP,SBS} - N_{SP} - N_{SP-CP}) * A_{SP}^2 = \quad \text{[Equation 17]}$$
$$NoA - (N_{SP,SBS} - NoC + NoA + N_{NSP-CP}) * A_{SP}^2$$

NoA_SBS indicates the number of active data carriers which may be used to send the actual data of an SBS. Accordingly, NoA_SBS is the number of active data carriers of an SBS and thus may be obtained by subtracting the number of null carriers from the number of data cells of an SBS (i.e., NoA_SBS=N_DATA,SBS−N_null). Inversely, the number of null carriers may be obtained by subtracting the number of active data carriers of an SBS from the number of data carriers of the SBS.

An actual occupied bandwidth of a transmission signal frame may be controlled depending on the NoC as in FIG. 33. That is, an actual occupied bandwidth of a signal frame may be controlled by flexibly controlling the NoC, and a parameter regarding the NoC may be signaled. The NoC may be defined as in Equation 18.

$$NoC = NoC_{max} - C_{red\_coeff} * C_{unit} \quad \text{[Equation 18]}$$

In Equation 18, NoC_max denotes a maximum number of carriers per symbol. C_red_coeff is a positive integer, and denotes a coefficient which is multiplied by a control unit value "C_unit" and which determines the reduced number of carriers. C_red_coeff may also be designated as an NoC reduction coefficient. C_red_coeff has a value of 0~4, which may be signaled as parameters. The parameters may be signaled as the NoC reduction coefficient of each preamble "L1B_preamble_reduced_carriers", the NoC reduction coefficient of a first subcarrier "L1B_First_Sub_reduced_carriers", and the NoC reduction coefficient of subcarriers subsequent to a second subcarrier "L1D_reduced_carriers." The control unit value "C_unit" has a maximum Dx value. In other words, the control unit value is determined to be a maximum Dx value corresponding to the least common multiple of a Dx value having a basis of 3 and a Dx value having a basis of 4. The control unit value may be determined to be 96 with respect to 8K FFT, 192 with respect to 16K FFT, and 384 with respect to 32K FFT.

Table 34 below shows NoCs determined by Equation 18 with respect to FFT sizes and C_red_coeff.

TABLE 34

| C_red_coeff | NoC | | |
|---|---|---|---|
| | 8K FFT | 16K FFT | 32K FFT |
| 0 | 6913 | 13825 | 27649 |
| 1 | 6817 | 13633 | 27265 |
| 2 | 6721 | 13441 | 26881 |
| 3 | 6625 | 13249 | 26497 |
| 4 | 6529 | 13057 | 26113 |

In Table 34, the NoC if C_red_coeff=0 corresponds to the aforementioned NoC_max. 0~4, that is, the values of C_red_coeff, may be signaled using 3 bits. Hereinafter, the values of 0~4 may be indicated by 000, 001, 010, 011, and 100, respectively.

FIG. 39 shows the Number of Active carriers (NoA) for a normal data symbol according to an embodiment of the present invention.

In FIG. 39, NoCs according to NoC reduction coefficients "C_red_coeff" have been shown in Table 34. As described above, in the case of a data symbol, the number of active data carriers may be obtained by subtracting the number of SPs and CPs from the NoC. Since CPs may be inserted into predetermined positions as predetermined numbers, the NoA may be determined depending on the NoC reduction coefficient "C_red_coeff" and an SP pattern as in FIG. 39.

FIG. 40 shows the number of pilots of an SBS "N_SP, SBS" according to an embodiment of the present invention.

The NoC of a Subframe Boundary Symbol (SBS) may be determined as described above. Subframe boundary pilots may be inserted into an SBS. The subframe boundary pilot may also be designated as an SBS pilot. The subframe boundary pilots may be inserted into positions which satisfy (k mod Dx=0) with respect to a carrier index k. In this case, a position k=0 or k=NoC−1 is excluded from the position of the subframe boundary pilot because edge pilots are placed in the position. That is, an SBS pilot may use the Dx value of the SP pattern of the data symbol of a corresponding subframe, and may use a Dy value of 1.

In the embodiment of FIG. 40, the number of SBS pilots is indicative of a number including edge pilots having pilot indices of k=0 and k=NoC−1. In some embodiments, the number of subframe boundary pilots may include the number of edge pilots.

FIG. 41 shows the number of data carriers of an SBS according to an embodiment of the present invention.

The number of data carriers of an SBS may be obtained by subtracting the number of pilots from a total number of carriers of the SBS (i.e., N_data,sbs=NoC−N_SP,SBS−N_NSP-CP).

FIG. 42 shows the number of CPs per symbol according to an embodiment of the present invention.

In FIG. 42, the number of CPs is also applied to an SBS because it is applied to a frame in common. In an embodiment of the present invention, since SP-bearing-CPs are transmitted with SPs and power, the number of CPs is indicative of the number of non-SP-bearing-CPs.

In Equation 17, the number of active data carriers of an SBS "NoA_SBS" may be obtained using the number of active data carriers per symbol "NoA", the number of SPs of an SBS "N_SP,SBS", the number of carriers per symbol "NoC", the number of CPs per symbol "N_NSP-CP", and amplitude of SPs "A-SP". The number of active data carriers per symbol "NoA", the number of SPs of an SBS "N_SP, SBS", the number of carriers per symbol "NoC", the number of CPs per symbol "N_NSP-CP", and amplitude of SPs "A-SP" denote the number of active data carriers per symbol "NoA" in the table of FIG. 39, the number of SPs of an SBS "N_SP,SBS" in the table of FIG. 40, the number of carriers per symbol "NoC" in Table 34 and FIGS. 39-41, the number of CPs per symbol "N_NSP-CP" in FIG. 42, and amplitude of SPs "A-SP" in the table of FIG. 35, respectively. Accordingly, the number of active data carriers of an SBS may be obtained based on the NoC reduction coefficient "C_red_coeff".

FIGS. 43 to 47 show the number of active data carriers of an SBS "NoA_SBS" depending on the NoC reduction coefficient "C_red_coeff" according to an embodiment of the present invention.

FIG. 43 shows the number of active data carriers of an SBS if the NoC reduction coefficient is 0 (i.e., C_red_coeff=000).

FIG. 44 shows the number of active data carriers of an SBS if the NoC reduction coefficient is 1 (i.e., C_red_coeff=001).

FIG. 45 shows the number of active data carriers of an SBS if the NoC reduction coefficient is 2 (i.e., C_red_coeff=010).

FIG. 46 shows the number of active data carriers of an SBS if the NoC reduction coefficient is 3 (i.e., C_red_coeff=011).

FIG. 47 shows the number of active data carriers of an SBS if the NoC reduction coefficient is 4 (i.e., C_red_coeff=100).

The number of null carriers of an SES may be obtained by subtracting the number of active data carriers of FIGS. 43 to 47 from the number of data carriers of the SBS. An embodiment in which the number of null carriers is determined and a method of placing the number of null carriers determined as described above are described below. As described above, the broadcast signal transmitter configures a signal frame through the frame builder and frequency-interleaves the signal frame. Accordingly, in relation to frequency interleaving, a method of placing null carriers may be different.

Figure 48:
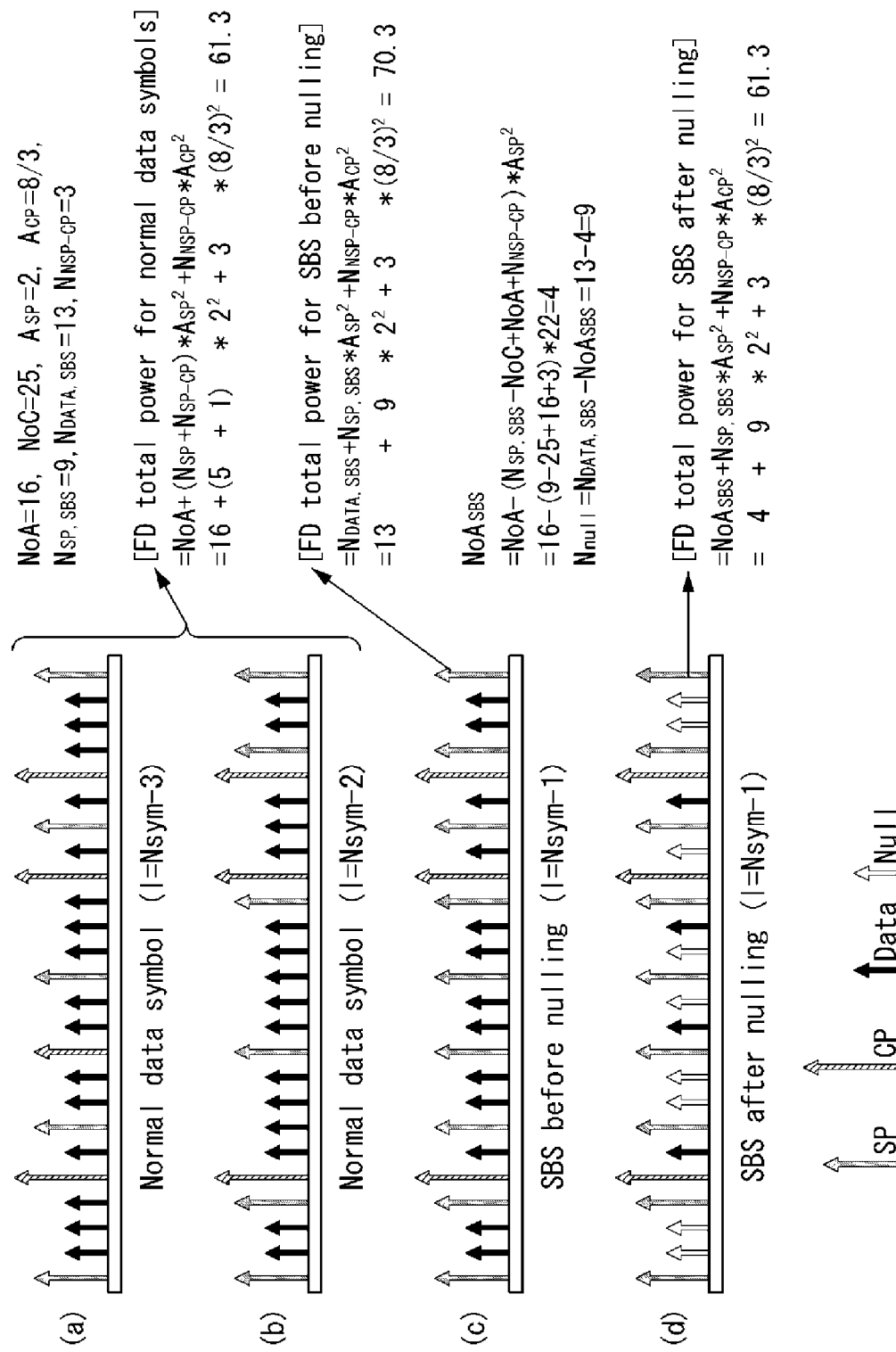
FIG. 48 shows a method of calculating the number of null carriers and power normalization according to the method according to an embodiment of the present invention.

FIG. 48 shows a method of calculating the number of null carriers and power normalization according to the method according to an embodiment of the present invention.

In FIG. 48, it is assumed that NoA=16, NoC=25, A_sp=2, A_CP=8/3, N_SP,SBS=9, N_DATA_SBS=13, and N_NSP-CP=3.

FIGS. 48(a) and 48(b) show subframe data symbols having SP patterns of Dx=6 and Dy=2. In FIGS. 48(a) and 48(b), total power of normal data symbols in a frequency domain (FD) is 61.3 (FIG. 48(1)). The power of the normal data symbols may be calculated by Equation 15.

FIG. 48(c) shows an SBS before null carriers are inserted. Total power of the SBS in the frequency domain (FD) before null carriers are inserted is 70.3. The power of the SBS may be calculated by Equation 16.

FIG. 48(d) shows an SBS after null carriers are inserted. Total power of the SBS after null carriers are inserted in the frequency domain (FD) is 61.3.

The number of inserted null carriers is obtained by subtracting the number of active data carriers of the SBS from the number of data carriers of the SBS (i.e., N_null=N_DATA,SBS−NoA_SBS=13−4=9). Power of the SBS is reduced from 70.3 to 61.3 by inserting the number of null carriers obtained as described above, thus being normalized identically with the power of normal data symbols (i.e., 61.3).

FIG. 49 shows a method of mapping the null carriers of an SBS according to an embodiment of the present invention.

FIG. 49 shows an embodiment in which frequency interleaving is performed after frame mapping. In this specification, frequency interleaving may be optionally performed. The reason for this is that if Frequency Division Multiplexing (FDM) is applied to a signal frame, when frequency interleaving is performed, the disposition of data according to FDM in the frequency domain may be spread out due to the interleaving. If frequency interleaving is performed, data carriers and null carriers may be sequentially mapped by taking the frequency interleaving into consideration. In this specification, carriers included in a symbol may also be designated as cells. A cell is indicative of a set of encoded I/Q components in a constellation.

As in FIG. 49, after data cells may be placed in carrier indices 1-7, null cells may be placed. Furthermore, after interleaving, the data cells and the null cells are randomly spread out. Thereafter, pilots are inserted into predetermined positions in a pilot insertion block.

FIG. 50 shows a method of mapping the null carriers of an SBS according to another embodiment of the present invention.

FIG. 50 shows a method of mapping null carriers if frequency interleaving is not performed.

As in FIG. 50(a), data cells and null cells may be sequentially mapped. In this case, however, the data carriers are concentrated in one side of a spectrum. In the edge area of a spectrum, an adjacent channel and a transmission/reception filter may deteriorate reception performance. Accordingly, data carriers may be placed at the center of a spectrum as much as possible in order to improve reception performance.

FIG. 50(b) shows a method of placing data cells at the center of a frequency spectrum and placing null cells in both edge areas. The method of placing data cells at the center of a frequency spectrum may include a method of using the predetermined location of the center based on null cell numbers and a method of signaling the start position of null cells. Such methods are additionally described later.

FIG. 51 shows a method of mapping the null carriers of an SBS according to another embodiment of the present invention.

FIG. 51 is a method of placing data cells at the center of a frequency spectrum and shows a method of using the predetermined location of the center based on null cell numbers. The method of FIG. 51 may also be called a simple direct mapping method.

In the embodiment of FIG. 51, it is assumed that the number of data cells of an SBS is 13 (N_DATA,SBS=13), the number of active data cells of the SBS is 7 (NoA_SBS=7), and the number of null cells is 6 (N_null=6).

The broadcast signal transmitter may place half of the null cells in the lowest frequency data carriers and may place the remaining half of the null cells in the highest frequency data carriers. The number of null cells placed in the lowest frequency may be obtained through a floor function "⌊N_null/2⌋", and the number of null cells placed in the highest frequency may be obtained through a ceiling function "⌈N_null/2⌉."

In FIG. 51(a), 3 of the 6 null cells are mapped to the lowest frequency data carriers, and the remaining 3 null cells are mapped to the highest frequency data carriers. Furthermore, pilots may be inserted as shown in FIG. 51(b).

FIG. 52 shows a method of mapping the null carriers of an SBS according to another embodiment of the present invention.

FIG. 52 is a method of placing data cells at the center of a frequency spectrum and shows a method of signaling the start position of active data cells. The method of FIG. 52 may also be called a boundary mapping method.

The broadcast signal transmitter may determine the start position of data cells depending on a frame configuration and may signal the start position of determined active data cells. The null cells may be placed in the remaining indices other than the indices of the active data cells.

The broadcast signal transmitter may include information about the start of active data cells in an SBS "L1_SBS_NoA_Start" in the L1 signaling area of a preamble and send the information. The broadcast signal transmitter may select and dispose the positions of the data cells of an SBS according to circumstances. The broadcast signal receiver may be aware of the positions of active data carriers of the SBS by parsing the information "L1_SBS_NoA_Start" in the preamble. In an embodiment, the information "L1_SBS_NoA_Start" may use 15 bits because it has to support 32K FFT. In an embodiment, in order to reduce signaling overhead, a position may be controlled by four carriers and may be signaled in 13 bits. Null carriers may be mapped before or after data carriers are mapped. The value of the information "L1_SBS_NoA_Start" may be indicative of the number of null cells inserted before active data cells are inserted.

As in the embodiment of FIG. 52(a), since the value of the information "L1_SBS_NoA_Start" is 6, the active data cells are placed after 6 null cells. FIG. 52(b) shows SBS carriers into which pilots have been inserted.

The broadcast signal transmitter may optionally use the simple direct mapping method of FIG. 51 and the boundary mapping method of FIG. 52. In this case, the broadcast signal transmitter may need to signal a method of mapping null cells. In an embodiment, a method of mapping null carriers may be indicated using null carrier mapping information "L1_SBS_Null_Mapping." The null carrier mapping information may be indicative of the simple direct mapping method or the boundary mapping method using 1 bit or 2 bits. The null carrier mapping information may be included in the L1 signaling information of a preamble.

FIG. 53 shows a method of mapping null carriers according to another embodiment of the present invention.

FIG. 53 shows a method of evenly distributing null carriers in a bandwidth. The method of FIG. 53 may also be called a distributed mapping method.

Null carriers may be distributed using a round function. Round operation may be represented as follows.

$$\text{round}(k*(N\_DATA\_SBS-1)/(N\_null-1)),$$
$$k=0{\sim}N\_null-1$$

A floor function may be used instead of the round function. Furthermore, carrier indices not occupied by null cells may be placed in data cells. In the method of FIG. 53, a case where frequency interleaving is not performed is assumed, and a data distribution effect in the frequency can be improved although frequency interleaving is not performed.

All the methods of FIGS. 50 to 53 may be optionally used. The method of FIG. 50 may also be called a general mapping method. That is, the general mapping method of FIG. 50, the simple direct mapping method of FIG. 51, the boundary mapping method of FIG. 52, and the distributed mapping method of FIG. 53 may be optionally used by the broadcast signal transmitter, and a selected method may be signaled.

In the simple direct mapping method, data is placed at the corner of a band, and there is no signaling overhead. The simple direct mapping method may be implemented using a method that is the least complexity and simple.

In the boundary mapping method, data is placed at the center of a band, and there is no signaling overhead. Furthermore, data cells may be least influenced by interference from an adjacent channel and channel estimation imperfection.

The general mapping method has signaling overhead, but can implement both the simple direct mapping method and the boundary mapping method through signaling information. Furthermore, a flexible system configuration is possible.

In the distributed mapping method, data is distributed, and there is no signaling overhead. A frequency diversity gain is increased, and null carriers may be used in interference sensing. However, system complexity is increased.

Since each of the four methods has the advantages and the disadvantages, all of the four methods or a subset of the four methods may be supported by adding null mapping information to L1 signaling information as follows.

SBS null carrier mapping information "L1_SBS_Null_Mapping" (2 bits): a method of mapping null carriers of each SBS symbol.

"00": Simple direct mapping (approach 1),
"01": Boundary mapping (approach 2),
"10": General mapping (approach 3),
"11": Distributed mapping (approach 4)

If only some of the four methods are to be supported, the remaining cases may be designated as reserved fields. Alternatively, if the number of signaling methods is 2 or less, it may be reduced to 1 bit. In addition to the four methods, in preparation for null carrier mapping mode, L1_SBS_Null_Mapping may be extended to 3 bits and used as a reserved field.

If a Frequency Interleaver (FI) is used, the simplest method of selected methods may be used if the FI is off because the output of the FI is not greatly influenced by a distribution of the null cells of input. In this case, in a method of mapping null carrier when the FI is on, a method automatically designated when the FI is on may be designated to be used with reference to information that belongs to L1 signaling information and that is indicative of FI on/off.

For example, if L1_frequency_interleaver="1" (FI enable), the simple direct mapping or boundary mapping method may be automatically designated to be used. In this case, the broadcast signal receiver may determine a method of mapping the null carriers of an SBS with reference to L1_frequency_interleaver, may check the positions of corresponding data cells, and may perform decoding.

Dummy cells may be included in a data cell of an SBS. In this case, the number of active data cells of the SBS may be the sum of the number of actual data cells and the number of dummy cells. In this case, the aforementioned method of mapping null cells may be identically applied except that the aforementioned data cells include dummy cells.

FIG. 54 shows a method of transmitting a broadcast signal according to an embodiment of the present invention.

As described above in relation to the broadcast signal transmitter and the operation thereof, the broadcast signal transmitter may input process the input data using the input formatting module and output at least one Data Pipe (DP), that is, Physical Layer Pipe (PLP) data (S54010). Furthermore, the broadcast signal transmitter may error-correction process or FEC-encode data included in at least one PLP using the BICM module (S54020). The broadcast signal transmitter may generate a signal frame, including the data of the at least one PLP, using the framing module (S54030). The broadcast signal transmitter may insert pilots into the signal frame using the pilot insertion module (S54040) and OFDM-modulate the signal frame using the IFFT module (S54050).

The signal frame includes a preamble and at least one subframe. Furthermore, the inserted pilots include Continual Pilots (CPs) and Scattered Pilots (SPs). In an embodiment, preamble pilots may be inserted into the preamble, and a subframe boundary preamble may also be inserted into an SBS.

Amplitude of SPs is determined based on an SP boosting parameter and the SP pattern of the SPs. The SP boosting parameter includes the five levels of each SP pattern. The five levels include a particular level indicating 0 dB at which power boosting is not performed. The broadcast signal transmitter may select one of the five levels, may boost the SPs based on amplitude of a corresponding level, and may send the boosted SPs.

The preamble includes SP boosting information. The SP boosting information indicates amplitude or a boosting level of the SPs. The SP boosting information may signal the SP boosting parameter in 3 bits. That is, the SP boosting information is signaled as the value of one of "000"~"100", and thus the broadcast signal receiver may check the amplitude of the SPs by combining the SP pattern information, the SP boosting tables according to SP patterns, such as those of FIGS. 34 and 35, and the reception SP parameter. The SP pattern information is included in the preamble and signaled.

Amplitude of subframe boundary pilots is determined based on the aforementioned SP boosting information or SP boosting parameter. The broadcast signal receiver may be aware of the positions of subframe boundary pilots based on the SP pilot pattern of a subframe and may be aware of amplitude of subframe boundary pilots based on received SP boosting information.

Subframe boundary pilots are placed at a pilot interval in the frequency direction of the SP pattern of a subframe, that is, at the Dx interval of a subframe. Furthermore, for power normalization, the data carriers of an SBS may include a specific number of active data carriers and a specific number of null carriers.

The number of active data carriers of an SBS is determined based on an SP boosting parameter. For example, if amplitude of a subframe boundary pilot is greatly boosted, the number of active data carriers may be reduced and the number of null carriers may be increased in order to meet power with a data symbol. Alternatively, If amplitude of a subframe boundary pilot is small boosted, the number of active data carriers may be increased, and the number of null carriers may be reduced or omitted. For example, if power boosting is not performed because the value of an SP boosting parameter is 0, a null carrier may not be required.

The number of null carriers is also determined based on amplitude of SPs. Amplitude of SPs is determined based on an SP boosting parameter, and the determined amplitude is also applied to a subframe boundary pilot. Accordingly, as described above, if amplitude of SPs is increased, the number of null carriers may be increased because amplitude of subframe boundary pilots is also increased. Furthermore, if amplitude of SPs is reduced, the number of null carriers may also be reduced because amplitude of subframe boundary pilots is also reduced.

As described above, the number of null carriers may be obtained by subtracting the number of active data carriers from the number of data carriers of a subframe boundary symbol. A method of obtaining the number of data carriers of an SBS, the number of active data carriers of an SBS, and the number of null carriers of an SBS is the same as that described above.

The number and positions of inserted null carriers may be determined as described with reference to FIGS. 48 to 53. In an embodiment, active data carriers may be placed in the center of all data cells, and half of null carriers may be placed in each band edges. ½ of null cells may occupy the lowest-frequency data carriers, and the remaining ½ of the null cells may occupy the highest-frequency data carriers. Furthermore, data carriers between two sets of null carriers may become active data carriers.

Figure 55:
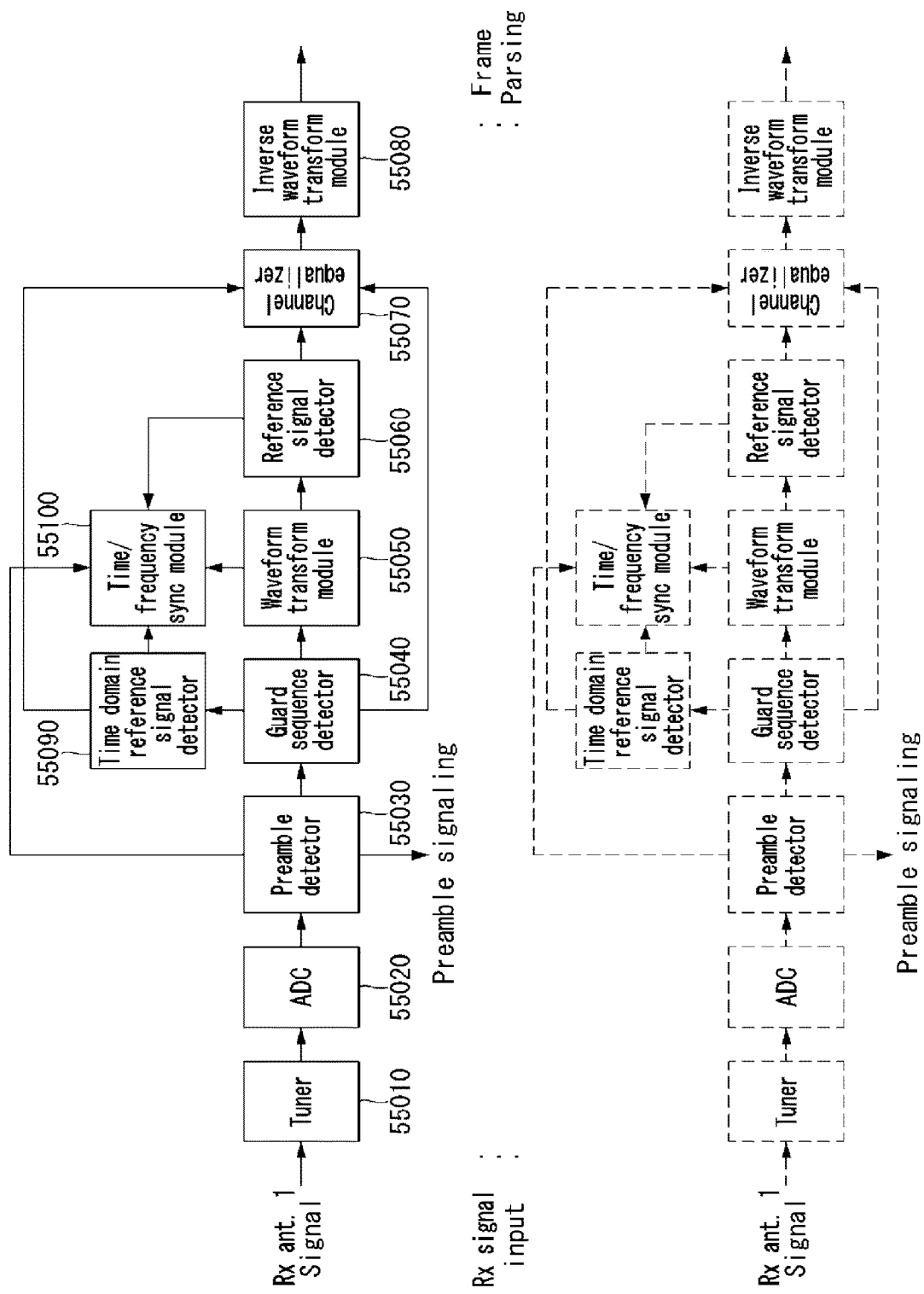
FIG. 55 shows the synchronization and demodulation module of the broadcast signal receiver according to an embodiment of the present invention.

FIG. 55 shows the synchronization and demodulation module of the broadcast signal receiver according to an embodiment of the present invention.

The synchronization and demodulation module includes a tuner 55010 for tuning a broadcast signal, an ADC module 55020 for converting a received analog signal into a digital signal, a preamble detector 55030 for detecting a preamble included in the received signal, a guard sequence detector 55040 for detecting a guard sequence included in the received signal, a waveform transform module 55050 for performing OFDM demodulation, that is, FFT, on the received signal, a reference signal detector 55060 for detecting a pilot signal included in the received signal, a channel equalizer 55070 for performing channel equalization using the extracted guard sequence, an inverse waveform transform module 55080, a time domain reference signal detector 55090 for detecting the pilot signal in a time domain, and a time/frequency sync module 55100 for performing time/frequency synchronization on the received signal using the preamble and the pilot signal.

The waveform transform module 55050 may also be designated as an FFT module for performing OFDM demodulation. The inverse waveform transform module 55080 is a module for performing transform opposite FFT and may be omitted according to embodiments or may be replaced with another module for performing the same or similar function.

FIG. 55 corresponds to a case where the broadcast signal receiver processes a signal, received by a plurality of antennas, through a plurality of paths. In FIG. 55, the same modules are illustrated in parallel, and a redundant description of the same module is omitted.

In an embodiment of the present invention, the broadcast signal receiver may detect and use a pilot signal using the reference signal detector 55060 and the time domain reference signal detector 55090. The reference signal detector 55060 may detect the pilot signal in a frequency domain. The broadcast signal receiver may perform synchronization and channel estimation using the characteristics of the detected pilot signal. The time domain reference signal detector 55090 may detect the pilot signal in the time domain of a received signal. The broadcast signal receiver may perform synchronization and channel estimation using the characteristics of the detected pilot signal. In this specification, at least one of the reference signal detector 55060 for detecting the pilot signal in the frequency domain and the time domain reference signal detector 55090 for detecting the pilot signal in the time domain may be called a pilot signal detector or a pilot detector. Furthermore, in this specification, a reference signal means a pilot signal.

FIG. 56 shows a method of receiving a broadcast signal according to an embodiment of the present invention.

As described above in relation to the broadcast signal receiver and the operation thereof, the broadcast signal receiver may OFDM-demodulate a received broadcast signal using the Fast Fourier Transform (FFT) module (S56010). The broadcast signal receiver may detect pilots, included in the broadcast signal, using the pilot detector (S56020). The broadcast signal receiver may perform synchronization, channel estimation, and compensation on the broadcast signal using the detected pilots. The broadcast signal receiver may parse the signal frame of the broadcast signal using the frame parsing module (S56030). The broadcast signal receiver may extract and decode preamble data included in the signal frame and may extract a required subframe or PLP data using L1 signaling information obtained from the preamble data. The broadcast signal receiver may convert the PLP data extracted from the broadcast signal into a bit domain using the demapping and decoding module and may FEC-decode the PLP data (S56040). Furthermore, the broadcast signal receiver may output the PLP data in the form of a data stream using the output processing module (S56050).

The signal frame includes a preamble and at least one subframe. Furthermore, the inserted pilots include Continual Pilots (CPs) and Scattered Pilots (SPs). In an embodiment, preamble pilots may be inserted into the preamble, and a subframe boundary preamble may also be inserted into an SBS.

Amplitude of SPs is determined based on an SP boosting parameter and the SP pattern of the SPs. The SP boosting parameter includes the five levels of each SP pattern. The five levels include a particular level indicating 0 dB at which power boosting is not performed. The broadcast signal transmitter may select one of the five levels, may boost the SPs based on amplitude of a corresponding level, and may send the boosted SPs.

The preamble includes SP boosting information. The SP boosting information indicates the amplitude or boosting level of the SPs. The SP boosting information may signal the SP boosting parameter in 3 bits. That is, the SP boosting information is signaled as the value of one of "000"~"100", and thus the broadcast signal receiver may check the amplitude of the SPs by combining the SP pattern information, the SP boosting tables according to SP patterns, such as those of FIGS. 34 and 35, and the reception SP parameter. The SP pattern information is included in the preamble and signaled.

Amplitude of subframe boundary pilots is determined based on the aforementioned SP boosting information or SP boosting parameter. The broadcast signal receiver may be aware of the positions of subframe boundary pilots based on the SP pilot pattern of a subframe and may be aware of amplitude of subframe boundary pilots based on received SP boosting information.

Subframe boundary pilots are placed at a pilot interval in the frequency direction of the SP pattern of a subframe, that is, at the Dx interval of a subframe. Furthermore, for power normalization, the data carriers of an SBS may include a specific number of active data carriers and a specific number of null carriers.

The number of active data carriers of an SBS is determined based on an SP boosting parameter. For example, if amplitude of a subframe boundary pilot is greatly boosted, the number of active data carriers may be reduced and the number of null carriers may be increased in order to meet power with a data symbol. Alternatively, If amplitude of a subframe boundary pilot is small boosted, the number of active data carriers may be increased, and the number of null carriers may be reduced or omitted. For example, if power boosting is not performed because the value of an SP boosting parameter is 0, a null carrier may not be required.

The number of null carriers is also determined based on amplitude of SPs. Amplitude of SPs is determined based on an SP boosting parameter, and the determined amplitude is also applied to a subframe boundary pilot. Accordingly, as described above, if amplitude of SPs is increased, the number of null carriers may be increased because amplitude of subframe boundary pilots is also increased. Furthermore, if amplitude of SPs is reduced, the number of null carriers may also be reduced because amplitude of subframe boundary pilots is also reduced.

As described above, the number of null carriers may be obtained by subtracting the number of active data carriers from the number of data carriers of a subframe boundary symbol. A method of obtaining the number of data carriers of an SBS, the number of active data carriers of an SBS, and the number of null carriers of an SBS has been described above. All of or some of the tables of FIGS. 38 to 47 may be stored in the broadcast signal transmitter and the broadcast signal receiver and used.

The number and positions of inserted null carriers may be determined as described with reference to FIGS. 48 to 53. In an embodiment, active data carriers may be placed in the center of all data cells, and half of null carriers may be placed in each band edges. ½ of null cells may occupy the lowest-frequency data carriers, and the remaining ½ of the null cells may occupy the highest-frequency data carriers. Furthermore, data carriers between two sets of null carriers may become active data carriers.

In accordance with an embodiment of the present invention, sync tracking on the reception side and signal processing performance, such as channel estimation, can be improved by boosting power of an SP. Furthermore, system flexibility can be improved because one of the five levels is used as a level for boosting power of an SP without fixing the level. The broadcast system allows an efficient power distribution because a boosting level is determined by taking into consideration the channel environment, service importance, the amount of data, and available power of a corresponding system. Furthermore, flexible and efficient signal processing is made possible because a boosting level is checked based on SP boosting information and an SP is processed based on the boosting level on the reception side. Only when such a boosting level is signaled, the broadcast signal receiver can process a signal according to a boosting level of the broadcast signal transmitter.

Furthermore, the broadcast signal transmitter can minimize the energy shortage of data carriers by performing boosting on a subframe boundary pilot like the SP of a subframe and additionally disposing null carriers. The broadcast signal transmitter/broadcast signal receiver may reduce signaling overhead because SP boosting table/information can be used.

In the case of an SBS, if the SP boosting tables and SP boosting information for a subframe are used, signaling overhead is reduced because pilot density is increased, but power of a signal frame per symbol may vary. If power of each symbol is different, the filter and amplifier complexity of a system may be increased and/or channel estimation/sync tracking performance may be deteriorated. Accordingly, in an embodiment of the present invention, power of each symbol within a subframe can be regularly maintained by inserting null carriers into an SBS. Accordingly, system complexity can be reduced and signal processing performance can be improved because evenly distributed power is used in each symbol and pilots having the same amplitude are used on the reception side.

In particular, inter-symbol/inter-frequency interference can be minimized and signal decoding performance can be further improved by placing null carriers in both edge areas of a band and placing active data carriers in the center of the bandwidth. Furthermore, signaling overhead can be reduced because the positions of null carriers and active data carriers do not need to be additionally signaled. In particular, channel estimation/sync tracking speed using a subframe boundary pilot can be improved, and system latency can be reduced.

Those skilled in the art will understand that the present invention may be changed and modified in various ways without departing from the spirit or range of the present invention. Accordingly, the present invention is intended to include all the changes and modifications provided by the appended claims and equivalents thereof.

In this specification, both the apparatus and the method have been described, and the descriptions of both the apparatus and method may be mutually supplemented and applied.

The present invention is used in a series of broadcast signal providing fields.

It is evident to those skilled in the art will understand that the present invention may be changed and modified in various ways without departing from the spirit or range of the present invention. Accordingly, the present invention is intended to include all the changes and modifications provided by the appended claims and equivalents thereof.

What is claimed is:
1. A device, comprising:
 a demodulator configured to demodulate a broadcast signal including a signal frame, the signal frame including a preamble and at least one subframe, a subframe comprising data symbols and at least one Subframe Boundary Symbol (SBS), the data symbols comprising Scattered Pilots (SPs) and an SBS comprising subframe boundary pilots; and a decoder configured to decode Physical Layer Pipe (PLP) data in the at least one subframe, wherein:

the SBS comprises data cells including active data cells and null cells, the active data cells occupy first data carriers of the SBS, a first set of the null cells occupies second data carriers of the SBS and a second set of the null cells occupies third data carriers of the SBS, the first data carriers are positioned between the second data carriers and the third data carriers in frequency domain, a number of the active data cells of the SBS for a Fast Fourier Transform (FFT) size and a coefficient value is based on amplitude of the SPs that are determined from an SP boosting parameter and an SP pattern, the SP boosting parameter has a value from 0 to 4, the number of the active data cells of the SBS for the FFT size of 8K, 16K or 32K and for the coefficient value of 1 is represented as a following table, Number of active data carriers in SBS (NoAses) when $C_{red\_coeff} = 001$

| 6484 | L1_SP_Boost | SP3_2 | SP3_4 | SP4_2 | SP4_4 | SP6_2 |
|---|---|---|---|---|---|---|
| 5839 | 000 | 4496 | 4496 | 5064 | 5064 | 5632 |
| 5486 | 001 | 4496 | 3849 | 4938 | 4272 | 5380 |
| 5208 | 010 | 4065 | 2881 | 4535 | 3419 | 5042 |
| 4988 | 011 | 3748 | 2117 | 4218 | 2828 | 4775 |
| 12968 | 100 | 3418 | 1513 | 3966 | 2214 | 4564 |
| 11668 | 000 | 8992 | 8992 | 10128 | 10128 | 11264 |
| 10957 | 001 | 8992 | 7697 | 9876 | 8541 | 10759 |
| 10397 | 010 | 8129 | 5758 | 9070 | 6833 | 10082 |
| 9953 | 011 | 7495 | 4229 | 8434 | 5650 | 9549 |
| 25936 | 100 | 6835 | 3019 | 7930 | 4420 | 9126 |
| 23327 | 000 | 17984 | 17984 | N/A | N/A | 22528 |
| 21900 | 001 | 17984 | 15393 | N/A | N/A | 21517 |
| 20775 | 010 | 16256 | 11513 | N/A | N/A | 20163 |
| 19885 | 011 | 14988 | 8454 | N/A | N/A | 19095 |
| | 100 | 13669 | 6033 | N/A | N/A | 18250 |

| | L1_SP_Boost | SP6_4 | SP8_2 | SP8_4 |
|---|---|---|---|---|
| 8K | 000 | 5632 | 5916 | 5916 |
| | 001 | 4788 | 5636 | 5096 |
| | 010 | 4089 | 5322 | 4494 |
| | 011 | 3538 | 5116 | 4021 |
| | 100 | 3102 | 4901 | 3645 |
| 16K | 000 | 11264 | 11832 | 11832 |
| | 001 | 9572 | 11271 | 10187 |
| | 010 | 8171 | 10642 | 8982 |
| | 011 | 7068 | 10229 | 8032 |
| | 100 | 6194 | 9800 | 7280 |
| 32K | 000 | 22528 | 23664 | 23664 |
| | 001 | 19140 | 22541 | 20369 |
| | 010 | 16337 | 21282 | 17956 |
| | 011 | 14127 | 20456 | 16054 |
| | 100 | 12378 | 19597 | 14548 |

| | L1_SP_Boost | SP12_2 | SP12_4 | SP16_2 | SP16_4 | SP24_2 |
|---|---|---|---|---|---|---|
| 8K | 000 | 6200 | 6200 | 6342 | 6342 | 6484 |
| | 001 | 5892 | 5431 | 6046 | 5608 | 6209 |
| | 010 | 5648 | 4940 | 5836 | 5173 | 6038 |
| | 011 | 5456 | 4552 | 5671 | 4831 | 5902 |
| | 100 | 5304 | 4245 | 5540 | 4559 | 5795 |
| 16K | 000 | 12400 | 12400 | 12684 | 12684 | 12968 |
| | 001 | 11783 | 10857 | 12090 | 11215 | 12416 |
| | 010 | 11294 | 9870 | 11669 | 10346 | 12072 |
| | 011 | 10909 | 9091 | 11338 | 9661 | 11800 |
| | 100 | 10604 | 8475 | 11075 | 9118 | 11585 |

Number of active data carriers in SBS (NoAses) when $C_{red\_coeff} = 001$

| 32K | 000 | 24800 | 24800 | 25368 | 25368 | 25936 |
|---|---|---|---|---|---|---|
| | 001 | 23564 | 21707 | 24178 | 22422 | 24830 |
| | 010 | 22586 | 19730 | 23336 | 20680 | 24140 |
| | 011 | 21815 | 18170 | 22672 | 19307 | 23596 |
| | 100 | 21204 | 16936 | 22146 | 18220 | 23165 |

| | L1_SP_Boost | SP24_4 | SP32_2 | SP32_4 |
|---|---|---|---|---|
| 8K | 000 | 6484 | 6555 | 6555 |
| | 001 | 5839 | 6294 | 5971 |
| | 010 | 5486 | 6142 | 5664 |
| | 011 | 5208 | 6037 | 5422 |
| | 100 | 4988 | 5928 | 5231 |
| 16K | 000 | 12968 | 13110 | 13110 |
| | 001 | 11668 | 12587 | 11941 |
| | 010 | 10957 | 12284 | 11327 |
| | 011 | 10397 | 12074 | 10844 |
| | 100 | 9953 | 11856 | 10461 |
| 32K | 000 | 25936 | 26220 | 26220 |
| | 001 | 23327 | 25172 | 23882 |
| | 010 | 21900 | 24564 | 22654 |
| | 011 | 20775 | 24143 | 21687 |
| | 100 | 19885 | 23705 | 20921 | the $C_{red\_coeff}$ represents the coefficient value and L1_SP_Boost is the SP boosting parameter.

2. The device of claim 1, wherein the preamble includes FFT size information and information related to the SP pattern.

3. The device of claim 1, wherein a number of null cells is obtained by subtracting the number of active data cells of the SBS from a number of data cells of the SBS.

4. The device of claim 3, wherein the number of active data cells of the SBS is obtained based on following equation:

$$NoA - (N_{SP,SBS} - NoC + NoA + N_{NSP-CP}) \times (A_{SP})^2,$$

the NoA represents the number of active data cells in the data symbol, the $N_{SP,SBS}$ represents a number of SBS pilots, the NoC represents a number of carriers, the $N_{NSP-CP}$ represents a number of non-Scattered Pilots bearing continual pilots(CPs) and the $A_{SP}$ represents the amplitude of the SPs.

5. The device of claim 1, wherein the device further includes a signaling decoder configured to decode signaling data in the preamble.

6. A method, comprising:

demodulating a broadcast signal including a signal frame, the signal frame including a preamble and at least one subframe, a subframe comprising data symbols and at least one Subframe Boundary Symbol (SBS), the data symbols comprising Scattered Pilots (SPs) and an SBS comprising subframe boundary pilots; and decoding Physical Layer Pipe (PLP) data in the at least one subframe of the signal frame, wherein:

an SBS comprises data cells including active data cells and null cells, the active data cells occupy first data carriers of the SBS, a first set of the null cells occupies second data carriers of the SBS and a second set of the null cells occupies third data carriers of the SBS, the first data carriers are positioned between the second data carriers and the third data carriers in frequency domain, a number of the active data cells of the SBS for a Fast Fourier Transform (FFT) size and a coefficient value is based on amplitude of the SPs that are determined from an SP boosting parameter and an SP pattern, the SP boosting parameter has a value from 0 to 4, the number of the active data cells of the SBS for the FFT size of 8K, 16K or 32K and for the coefficient value of 1 is represented as a following table,

| | Number of active data carriers in SBS (NoAses) when $C_{red\_coeff}$ = 001 | | | | | | | |
|---|---|---|---|---|---|---|---|---|
| | L1_SP_Boost | SP3_2 | SP3_4 | SP4_2 | SP4_4 | SP6_2 | SP6_4 | SP8_2 | SP8_4 |
| 8K | 000 | 4496 | 4496 | 5064 | 5064 | 5632 | 5632 | 5916 | 5916 |
| | 001 | 4496 | 3849 | 4938 | 4272 | 5380 | 4788 | 5636 | 5096 |
| | 010 | 4065 | 2881 | 4535 | 3419 | 5042 | 4089 | 5322 | 4494 |
| | 011 | 3748 | 2117 | 4218 | 2828 | 4775 | 3538 | 5116 | 4021 |
| | 100 | 3418 | 1513 | 3966 | 2214 | 4564 | 3102 | 4901 | 3645 |
| 16K | 000 | 8992 | 8992 | 10128 | 10128 | 11264 | 11264 | 11832 | 11832 |
| | 001 | 8992 | 7697 | 9876 | 8541 | 10759 | 9572 | 11271 | 10187 |
| | 010 | 8129 | 5758 | 9070 | 6833 | 10082 | 8171 | 10642 | 8982 |
| | 011 | 7495 | 4229 | 8434 | 5650 | 9549 | 7068 | 10229 | 8032 |
| | 100 | 6835 | 3019 | 7930 | 4420 | 9126 | 6194 | 9800 | 7280 |
| 32K | 000 | 17984 | 17984 | N/A | N/A | 22528 | 22528 | 23664 | 23664 |
| | 001 | 17984 | 15393 | N/A | N/A | 21517 | 19140 | 22541 | 20369 |
| | 010 | 16256 | 11513 | N/A | N/A | 20163 | 16337 | 21282 | 17956 |
| | 011 | 14986 | 8454 | N/A | N/A | 19095 | 14127 | 20456 | 16054 |
| | 100 | 13669 | 6033 | N/A | N/A | 18250 | 12378 | 19597 | 14548 |
| | L1_SP_Boost | SP12_2 | SP12_4 | SP16_2 | SP16_4 | SP24_2 | SP24_4 | SP32_2 | SP32_4 |
| 8K | 000 | 6200 | 6200 | 6342 | 6342 | 6484 | 6484 | 6555 | 6555 |
| | 001 | 5892 | 5431 | 6046 | 5608 | 6209 | 6839 | 6294 | 5971 |
| | 010 | 5648 | 4940 | 5836 | 5173 | 6038 | 6486 | 6142 | 5664 |
| | 011 | 5456 | 4552 | 5671 | 4831 | 5902 | 5208 | 6037 | 5422 |
| | 100 | 5304 | 4245 | 5540 | 4559 | 5795 | 4988 | 5928 | 5231 |
| 16K | 000 | 12400 | 12400 | 12684 | 12684 | 12968 | 12968 | 13110 | 13110 |
| | 001 | 11783 | 10857 | 12090 | 11215 | 12416 | 11668 | 12587 | 11941 |
| | 010 | 11294 | 9870 | 11669 | 10346 | 12072 | 10957 | 12284 | 11327 |
| | 011 | 10909 | 9091 | 11338 | 9661 | 11800 | 10397 | 12074 | 10844 |
| | 100 | 10604 | 8475 | 11075 | 9118 | 11585 | 9953 | 11856 | 10461 |
| 32K | 000 | 24800 | 24800 | 25368 | 25368 | 25936 | 25936 | 26220 | 26220 |
| | 001 | 23564 | 21707 | 24178 | 22422 | 24830 | 23327 | 25172 | 23882 |
| | 010 | 22586 | 19730 | 23336 | 20680 | 24140 | 21900 | 24564 | 22654 |
| | 011 | 21815 | 18170 | 22672 | 19307 | 23596 | 20775 | 24143 | 21687 |
| | 100 | 21204 | 16936 | 22146 | 18220 | 23165 | 19885 | 23705 | 20921 |

, the $C_{red\_coeff}$ represents the coefficient value and L1_SP_Boost is the SP boosting parameter.

7. The method of claim 6, wherein the preamble includes FFT size information and information related to the SP pattern.

8. The method of claim 6, wherein a number of null cells is obtained by subtracting the number of active data cells of the SBS from a number of data cells of the SBS.

9. The method of claim 8, wherein the number of active data cells of the SBS is obtained based on following equation:

$$NoA-(N_{SP,SBS}-NoC+NoA+N_{NSP-CP})\times(A_{SP})^2,$$

the NoA represents the number of active data cells in the data symbol, the $N_{SP,SBS}$ represents a number of SBS pilots, the NoC represents a number of carriers, the $N_{NSP-CP}$ represents a number of non-Scattered Pilots bearing continual pilots(CPs) and the $A_{SP}$ represents the amplitude of the SPs.

10. The method of claim 6, the method further includes: decoding signaling data in the preamble.

11. A device, comprising:
an encoder configured to encode Physical Layer Pipe (PLP) data;

a frame builder configured to build a signal frame that includes a preamble and at least one subframe, the preamble carrying signaling data and the at least one subframe carrying the encoded PLP data, a subframe comprising data symbols and at least one Subframe Boundary Symbol (SBS), wherein:

an SBS comprises data cells including active data cells and null cells, the active data cells occupy first data carriers of the SBS, a first set of the null cells occupies second data carriers of the SBS and a second set of the null cells occupies third data carriers of the SBS, the first data carriers are positioned between the second data carriers and the third data carriers in frequency domain, a modulator configured to modulate data in the signal frame, the modulated data including Scattered Pilots (SPs) inserted in the data symbols and subframe boundary pilots inserted in the SBS, wherein:

a number of the active data cells of the SBS for a Fast Fourier Transform (FFT) size and a coefficient value used to obtain a number of carriers is based on amplitude of the SPs that are determined from an SP boosting parameter and an SP pattern, the SP boosting parameter has a value from 0 to 4, the number of the active data cells of the SBS for the FFT size of 8K, 16K or 32K and for the coefficient value of 1 is represented as a following table,

| Number of active data carriers in SBS (NoAses) when $C_{red\_coeff}$ = 001 | | | | | | | | | |
|---|---|---|---|---|---|---|---|---|---|
| | L1_SP_Boost | SP3_2 | SP3_4 | SP4_2 | SP4_4 | SP6_2 | SP6_4 | SP8_2 | SP8_4 |
| 8K | 000 | 4496 | 4496 | 5064 | 5064 | 5632 | 5632 | 5916 | 5916 |
| | 001 | 4496 | 3849 | 4938 | 4272 | 5380 | 4788 | 5636 | 5096 |
| | 010 | 4065 | 2881 | 4535 | 3419 | 5042 | 4089 | 5322 | 4494 |
| | 011 | 3748 | 2117 | 4218 | 2828 | 4775 | 3538 | 5116 | 4021 |
| | 100 | 3418 | 1513 | 3966 | 2214 | 4564 | 3102 | 4901 | 3645 |
| 16K | 000 | 8992 | 8992 | 10128 | 10128 | 11264 | 11264 | 11832 | 11832 |
| | 001 | 8992 | 7697 | 9876 | 8541 | 10759 | 9572 | 11271 | 10187 |
| | 010 | 8129 | 5758 | 9070 | 6833 | 10082 | 8171 | 10642 | 8982 |
| | 011 | 7495 | 4229 | 8434 | 5650 | 9549 | 7068 | 10229 | 8032 |
| | 100 | 6835 | 3019 | 7930 | 4420 | 9126 | 6194 | 9800 | 7280 |
| 32K | 000 | 17984 | 17984 | N/A | N/A | 22528 | 22528 | 23664 | 23664 |
| | 001 | 17984 | 15393 | N/A | N/A | 21517 | 19140 | 22541 | 20369 |
| | 010 | 16256 | 11513 | N/A | N/A | 20163 | 16337 | 21282 | 17956 |
| | 011 | 14988 | 8454 | N/A | N/A | 19095 | 14127 | 20456 | 16054 |
| | 100 | 13669 | 6033 | N/A | N/A | 18250 | 12378 | 19597 | 14548 |

| | L1_SP_Boost | SP12_2 | SP12_4 | SP16_2 | SP16_4 | SP24_2 | SP24_4 | SP32_2 | SP32_4 |
|---|---|---|---|---|---|---|---|---|---|
| 8K | 000 | 6200 | 6200 | 6342 | 6342 | 6484 | 6484 | 6555 | 6555 |
| | 001 | 5892 | 5431 | 6046 | 5608 | 6209 | 6839 | 6294 | 5971 |
| | 010 | 5648 | 4940 | 5836 | 5173 | 6038 | 6486 | 6142 | 5664 |
| | 011 | 5456 | 4552 | 5671 | 4831 | 5902 | 5208 | 6037 | 5422 |
| | 100 | 5304 | 4245 | 5540 | 4559 | 5795 | 4988 | 5928 | 5231 |
| 16K | 000 | 12400 | 12400 | 12684 | 12684 | 12968 | 12968 | 13110 | 13110 |
| | 001 | 11783 | 10857 | 12090 | 11215 | 12416 | 11668 | 12587 | 11941 |
| | 010 | 11294 | 9870 | 1169 | 10346 | 12072 | 10957 | 12284 | 11327 |
| | 011 | 10909 | 9091 | 11338 | 9661 | 11800 | 10397 | 12074 | 10844 |
| | 100 | 10604 | 8475 | 11075 | 9118 | 11585 | 9953 | 11856 | 10461 |
| 32K | 000 | 24800 | 24800 | 25368 | 25368 | 25936 | 25936 | 26220 | 26220 |
| | 001 | 23564 | 21707 | 24178 | 22422 | 24830 | 23327 | 25172 | 23882 |
| | 010 | 22586 | 19730 | 23336 | 20680 | 24140 | 21900 | 24564 | 22654 |
| | 011 | 21815 | 18170 | 22672 | 19307 | 23596 | 20775 | 24143 | 21687 |
| | 100 | 21204 | 16936 | 22146 | 18220 | 23165 | 19885 | 23705 | 20921 |

, the $C_{red\_coeff}$ represents the coefficient value and L1_SP_Boost is the SP boosting parameter; and a transmitter configured to transmit a broadcast signal including the modulated data.

12. The device of claim 11, wherein the preamble includes FFT size information and information related to the SP pattern.

13. The device of claim 11, wherein a number of null cells is obtained by subtracting the number of active data cells of the SBS from a number of data cells of the SBS.

14. The device of claim 13, wherein the number of active data cells of the SBS is obtained based on following equation:

$$NoA=(N_{SP,SBS}-NoC+NoA+N_{NSP-CP})\times(A_{SP})^2,$$

the NoA represents the number of active data cells in the data symbol, the $N_{SP,SBS}$ represents a number of SBS pilots, the NoC represents a number of carriers, the $N_{NSP-CP}$ represents a number of non-Scattered Pilots bearing continual pilots(CPs) and the $A_{SP}$ represents the amplitude of the SPs.

15. The device of claim 11, the device including:
a signaling encoder configured to encode the signaling data.

16. A method, comprising:
encoding Physical Layer Pipe (PLP) data;
building a signal frame that includes a preamble and at least one subframe, the preamble carrying signaling data and the at least one subframe carrying the encoded PLP data, a subframe comprising data symbols and at least one Subframe Boundary Symbol (SBS), wherein:

an SBS comprises data cells including active data cells and null cells, the active data cells occupy first data carriers of the SBS, a first set of the null cells occupies second data carriers of the SBS and a second set of the null cells occupies third data carriers of the SBS, the first data carriers are positioned between the second data carriers and the third data carriers in frequency domain;

modulating data in the signal frame, the modulated data including SPs inserted in the data symbols and subframe boundary pilots inserted in the SBS, wherein:

a number of the active data cells of the SBS for a Fast Fourier Transform (FFT) size and a coefficient value used to obtain a number of carriers is based on amplitude of the SPs that are determined from an SP boosting parameter and an SP pattern, the SP boosting parameter has a value from 0 to 4, the number of the active data cells of the SBS for the FFT size of 8K, 16K or 32K and for the coefficient value of 1 is represented as a following table,

| Number of active data carriers in SBS (NoAses) when $C_{red\_coeff}$ = 001 | | | | | | | | | |
|---|---|---|---|---|---|---|---|---|---|
| | L1_SP_Boost | SP3_2 | SP3_4 | SP4_2 | SP4_4 | SP6_2 | SP6_4 | SP8_2 | SP8_4 |
| 8K | 000 | 4496 | 4496 | 5064 | 5064 | 5632 | 5632 | 5916 | 5916 |
| | 001 | 4496 | 3849 | 4938 | 4272 | 5380 | 4788 | 5636 | 5096 |
| | 010 | 4065 | 2881 | 4535 | 3419 | 5042 | 4089 | 5322 | 4494 |
| | 011 | 3748 | 2117 | 4218 | 2828 | 4775 | 3538 | 5116 | 4021 |
| | 100 | 3418 | 1513 | 3966 | 2214 | 4564 | 3102 | 4901 | 3645 |
| 16K | 000 | 8992 | 8992 | 10128 | 10128 | 11264 | 11264 | 11832 | 11832 |
| | 001 | 8992 | 7697 | 9876 | 8541 | 10759 | 9572 | 11271 | 10187 |
| | 010 | 8129 | 5758 | 9070 | 6833 | 10082 | 8171 | 10642 | 8982 |
| | 011 | 7495 | 4229 | 8434 | 5650 | 9549 | 7068 | 10229 | 3032 |
| | 100 | 6835 | 3019 | 7930 | 4420 | 9126 | 6194 | 9800 | 7280 |
| 32K | 000 | 17984 | 17984 | N/A | N/A | 22528 | 22528 | 23664 | 23664 |
| | 001 | 17984 | 15393 | N/A | N/A | 21517 | 19140 | 22541 | 20369 |
| | 010 | 16256 | 11513 | N/A | N/A | 20163 | 16337 | 21282 | 17956 |
| | 011 | 14988 | 8454 | N/A | N/A | 19095 | 14127 | 20456 | 16054 |
| | 100 | 13669 | 6033 | N/A | N/A | 18250 | 12378 | 19597 | 14548 |
| | L1_SP_Boost | SP12_2 | SP12_4 | SP16_2 | SP16_4 | SP24_2 | SP24_4 | SP32_2 | SP32_4 |
| 8K | 000 | 6200 | 6200 | 6342 | 6342 | 6484 | 6484 | 6555 | 6555 |
| | 001 | 5892 | 5431 | 6046 | 5608 | 6209 | 5839 | 6294 | 5971 |
| | 010 | 5648 | 4940 | 5836 | 5173 | 6038 | 5486 | 6142 | 5664 |
| | 011 | 5456 | 4552 | 5671 | 4831 | 5902 | 5208 | 6037 | 5422 |
| | 100 | 5304 | 4245 | 5540 | 4559 | 5795 | 4988 | 5928 | 5231 |
| 16K | 000 | 12400 | 12400 | 12684 | 12684 | 12968 | 12968 | 13110 | 13110 |
| | 001 | 11783 | 10857 | 12090 | 11215 | 12416 | 11668 | 12587 | 11941 |
| | 010 | 11294 | 9870 | 1169 | 10346 | 12072 | 10957 | 12284 | 11327 |
| | 011 | 10909 | 9091 | 11338 | 9661 | 11800 | 10397 | 12074 | 10844 |
| | 100 | 10604 | 8475 | 11075 | 9118 | 11585 | 9953 | 11856 | 10461 |
| 32K | 000 | 24800 | 24800 | 25368 | 25368 | 25936 | 25936 | 26220 | 26220 |
| | 001 | 23564 | 21707 | 24178 | 22422 | 24830 | 23327 | 25172 | 23882 |
| | 010 | 22586 | 19730 | 23336 | 20680 | 24140 | 21900 | 24564 | 22654 |
| | 011 | 21815 | 18170 | 22672 | 19307 | 23596 | 20775 | 24143 | 21687 |
| | 100 | 21204 | 16936 | 22146 | 18220 | 23165 | 19885 | 23705 | 20921 |

, the $C_{red\_coeff}$ represents the coefficient value and L1_SP_Boost is the SP boosting parameter; and transmitting a broadcast signal including the modulated data.

17. The method of claim 16, wherein the preamble includes FFT size information and information related to the SP pattern.

18. The method of claim 16, wherein a number of null cells is obtained by subtracting the number of active data cells of the SBS from a number of data cells of the SBS.

19. The method of claim 18, wherein the number of active data cells of the SBS is obtained based on following equation:

$$NoA-(N_{SP,SBS}-NoC+NoA+N_{NSP-CP})\times(A_{SP})^2,$$

the NoA represents the number of active data cells in the data symbol, the $N_{SP,SBS}$ represents a number of SBS pilots, the NoC represents a number of carriers, the $N_{NSP-CP}$ represents a number of non-Scattered Pilots bearing continual pilots(CPs) and the $A_{SP}$ represents the amplitude of the SPs.

20. The method of claim 16, the method including:

encoding the signaling data.

* * * * *